United States Patent
Rathburn et al.

(10) Patent No.: US 7,422,439 B2
(45) Date of Patent: Sep. 9, 2008

(54) FINE PITCH ELECTRICAL INTERCONNECT ASSEMBLY

(75) Inventors: James J. Rathburn, Greenfield, MN (US); Martin Cavegn, North St. Paul, MN (US)

(73) Assignee: Gryphics, Inc., Plymouth, MN (US)

( * ) Notice: Subject to any disclaimer, the term of this patent is extended or adjusted under 35 U.S.C. 154(b) by 0 days.

(21) Appl. No.: 11/935,084

(22) Filed: Nov. 5, 2007

(65) Prior Publication Data

US 2008/0057753 A1    Mar. 6, 2008

Related U.S. Application Data

(60) Division of application No. 11/253,510, filed on Oct. 19, 2005, now Pat. No. 7,297,003, which is a continuation-in-part of application No. 11/030,213, filed on Jan. 4, 2005, now Pat. No. 7,326,064, which is a continuation-in-part of application No. PCT/US2004/022886, filed on Jul. 15, 2004.

(60) Provisional application No. 60/487,630, filed on Jul. 16, 2003.

(51) Int. Cl.
*H01R 12/00* (2006.01)
(52) U.S. Cl. .......................... 439/66; 439/736
(58) Field of Classification Search ............. 439/66, 439/67, 91, 591, 736
See application file for complete search history.

(56) References Cited

U.S. PATENT DOCUMENTS

| | | |
|---|---|---|
| 2,231,347 A | 2/1941 | Reutter |
| 2,980,881 A | 4/1961 | McKee |
| 3,320,658 A | 5/1967 | Bolda et al. |
| 3,500,295 A | 3/1970 | Faber et al. |
| 3,719,981 A | 3/1973 | Stelz |
| 3,838,382 A | 9/1974 | Sugar |
| 3,864,004 A | 2/1975 | Friend |
| 3,865,462 A | 2/1975 | Cobaugh et al. |
| 3,889,364 A | 6/1975 | Krueger |
| 3,989,331 A | 11/1976 | Hanlon |

(Continued)

FOREIGN PATENT DOCUMENTS

EP    0362841    4/1990

(Continued)

OTHER PUBLICATIONS

International Preliminary Report on Patentability and Written Opinion of International application No. PCT/US2005/047246, filed Dec. 29, 2005, 11 pp.

(Continued)

*Primary Examiner*—Khiem Nguyen
(74) *Attorney, Agent, or Firm*—Faegre & Benson LLP

(57) ABSTRACT

An electrical interconnect assembly for electrically interconnecting terminals on a first circuit member with terminals on a second circuit member. The electrical interconnect assembly includes a housing having a plurality of through openings extending between a first surface and a second surface. A plurality of contact members are positioned in a plurality of the through openings. The contact members include a base portion and one or more beams. A layer is molded to the housing and the contact members to retain the contact members in the openings. A solder member is preferably coupled with an engagement feature on the base portion of the contact member.

27 Claims, 40 Drawing Sheets

U.S. PATENT DOCUMENTS

| | | |
|---|---|---|
| 4,054,354 A | 10/1977 | Unger |
| 4,056,302 A | 11/1977 | Braun et al. |
| 4,097,266 A | 6/1978 | Takahaski et al. |
| 4,140,361 A | 2/1979 | Sochor |
| 4,274,700 A | 6/1981 | Keglewitsch et al. |
| 4,380,518 A | 4/1983 | Wydro |
| 4,391,482 A | 7/1983 | Czeschka |
| 4,395,086 A | 7/1983 | Marsh |
| 4,396,140 A | 8/1983 | Jaffe et al. |
| 4,462,534 A | 7/1984 | Bitaillou et al. |
| 4,482,937 A | 11/1984 | Berg |
| 4,602,830 A | 7/1986 | Lockard |
| 4,641,426 A | 2/1987 | Hartman et al. |
| 4,655,517 A | 4/1987 | Bryce |
| 4,664,309 A | 5/1987 | Allen et al. |
| 4,678,250 A | 7/1987 | Romine et al. |
| 4,705,205 A | 11/1987 | Allen et al. |
| 4,722,470 A | 2/1988 | Johary |
| 4,767,344 A | 8/1988 | Noschese |
| 4,802,862 A | 2/1989 | Seidler |
| 4,830,264 A | 5/1989 | Bitaillou et al. |
| 4,871,110 A | 10/1989 | Fukasawa et al. |
| 4,884,335 A | 12/1989 | McCoy et al. |
| 4,904,212 A | 2/1990 | Durbin et al. |
| 4,915,286 A | 4/1990 | Mentzer et al. |
| 5,024,372 A | 6/1991 | Altman et al. |
| 5,044,992 A | 9/1991 | Dzwonczyk et al. |
| 5,060,844 A | 10/1991 | Behun et al. |
| 5,093,986 A | 3/1992 | Mandal et al. |
| 5,098,311 A | 3/1992 | Roath et al. |
| 5,111,991 A | 5/1992 | Clawson et al. |
| 5,118,027 A | 6/1992 | Braun et al. |
| 5,120,237 A | 6/1992 | Fussell |
| 5,131,871 A | 7/1992 | Banakis et al. |
| 5,145,104 A | 9/1992 | Apap et al. |
| 5,167,512 A | 12/1992 | Walkup |
| 5,199,885 A | 4/1993 | Korsunsky et al. |
| 5,203,075 A | 4/1993 | Angulas et al. |
| 5,207,372 A | 5/1993 | Funari et al. |
| 5,222,649 A | 6/1993 | Funari et al. |
| 5,229,016 A | 7/1993 | Hayes et al. |
| 5,255,839 A | 10/1993 | Alves et al. |
| 5,261,155 A | 11/1993 | Angulas et al. |
| 5,269,453 A | 12/1993 | Melton et al. |
| 5,275,330 A | 1/1994 | Isaacs et al. |
| 5,284,287 A | 2/1994 | Wilson et al. |
| 5,324,569 A | 6/1994 | Nagesh et al. |
| 5,342,211 A | 8/1994 | Broeksteeg |
| 5,346,118 A | 9/1994 | Degani et al. |
| 5,350,292 A | 9/1994 | Sanders et al. |
| 5,354,218 A | 10/1994 | Fry et al. |
| 5,355,283 A | 10/1994 | Marrs et al. |
| 5,358,417 A | 10/1994 | Schmedding |
| 5,377,902 A | 1/1995 | Hayes |
| 5,387,139 A | 2/1995 | McKee et al. |
| 5,395,250 A | 3/1995 | Englert, Jr. et al. |
| 5,409,157 A | 4/1995 | Nagesh et al. |
| 5,410,260 A | 4/1995 | Kazama |
| 5,410,807 A | 5/1995 | Brose et al. |
| 5,431,332 A | 7/1995 | Kirby et al. |
| 5,435,482 A | 7/1995 | Variot et al. |
| 5,442,852 A | 8/1995 | Danner |
| 5,445,313 A | 8/1995 | Boyd et al. |
| 5,453,017 A | 9/1995 | Belopolsky |
| 5,462,456 A | 10/1995 | Howell |
| 5,467,913 A | 11/1995 | Namekawa et al. |
| 5,477,933 A | 12/1995 | Nguyen |
| 5,489,750 A | 2/1996 | Sakemi et al. |
| 5,491,303 A | 2/1996 | Weiss |
| 5,492,266 A | 2/1996 | Hoebener et al. |
| 5,495,668 A | 3/1996 | Furusawa et al. |
| 5,498,167 A | 3/1996 | Seto et al. |
| 5,499,487 A | 3/1996 | McGill |
| 5,504,277 A | 4/1996 | Danner |
| 5,516,030 A | 5/1996 | Denton |
| 5,516,032 A | 5/1996 | Sakemi et al. |
| 5,518,410 A | 5/1996 | Masami |
| 5,519,580 A | 5/1996 | Natarajan et al. |
| 5,534,127 A | 7/1996 | Sakai |
| 5,539,153 A | 7/1996 | Schiebert et al. |
| 5,542,174 A | 8/1996 | Chiu |
| 5,545,051 A | 8/1996 | Summers et al. |
| 5,580,283 A | 12/1996 | O'Sullivan et al. |
| 5,591,049 A | 1/1997 | Dohnishi |
| 5,591,941 A | 1/1997 | Acocella et al. |
| 5,593,322 A | 1/1997 | Swamy et al. |
| 5,613,882 A | 3/1997 | Hnatuck et al. |
| 5,618,207 A | 4/1997 | Maejima |
| 5,643,009 A | 7/1997 | Dinkel et al. |
| 5,702,255 A | 12/1997 | Murphy et al. |
| 5,718,607 A | 2/1998 | Murphy et al. |
| 5,730,606 A | 3/1998 | Sinclair |
| 5,746,608 A | 5/1998 | Sinclair |
| 5,772,451 A | 6/1998 | Dozier, II et al. |
| 5,829,988 A | 11/1998 | McMillan et al. |
| 5,830,012 A | 11/1998 | Ortega et al. |
| 5,873,742 A | 2/1999 | McHugh |
| 5,913,687 A | 6/1999 | Rathburn |
| 5,947,749 A | 9/1999 | Rathburn |
| 5,969,952 A | 10/1999 | Hayashi et al. |
| 6,042,389 A | 3/2000 | Lemke et al. |
| 6,042,423 A | 3/2000 | Murr et al. |
| 6,095,842 A | 8/2000 | Lin |
| 6,116,923 A | 9/2000 | Szu |
| 6,146,199 A | 11/2000 | Ortega et al. |
| 6,178,629 B1 | 1/2001 | Rathburn |
| 6,247,938 B1 | 6/2001 | Rathburn |
| 6,315,576 B1 | 11/2001 | Neidich |
| 6,325,644 B1 | 12/2001 | Lemke et al. |
| 6,345,987 B1 | 2/2002 | Mori et al. |
| 6,394,819 B1 | 5/2002 | Mosser, III et al. |
| 6,409,521 B1 | 6/2002 | Rathburn |
| 6,533,590 B1 | 3/2003 | Lee et al. |
| 6,623,284 B1 | 9/2003 | Korsunsky |
| 7,021,942 B2 | 4/2006 | Grant et al. |
| 7,040,902 B2 | 5/2006 | Li |
| 2003/0013330 A1 | 1/2003 | Takeuchi |
| 2003/0114029 A1 | 6/2003 | Lee et al. |
| 2004/0253852 A1 | 12/2004 | Regnier et al. |

FOREIGN PATENT DOCUMENTS

| | | |
|---|---|---|
| EP | 0817319 | 1/1998 |
| EP | 0836243 | 4/1998 |
| EP | 0847112 | 6/1998 |
| WO | 9815989 | 4/1998 |
| WO | 2004068640 | 8/2004 |
| WO | 2004068641 | 8/2004 |
| WO | 2004068642 | 8/2004 |

OTHER PUBLICATIONS

International Search Report and Written Opinion of International application No. PCT/US2005/047246, filed Dec. 29, 2005, 19 pp.

Non-Final Office Action for U.S. Appl. No. 11/253,510 dated Jan. 9, 2007.

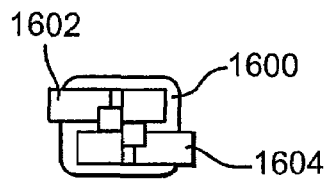
Fig. 37C
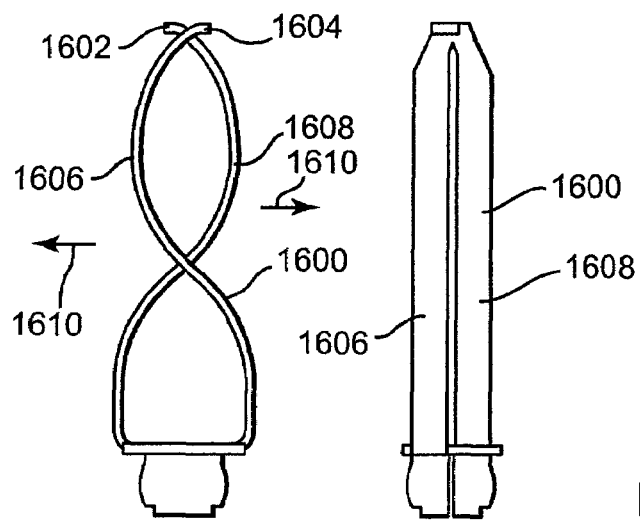
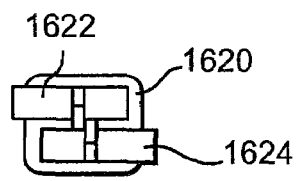
Fig. 37A  Fig. 37B    Fig. 38C
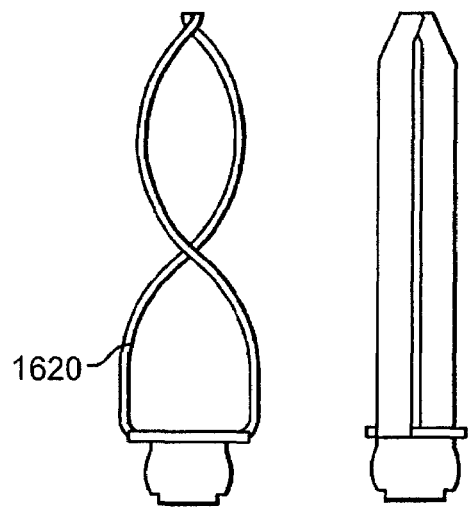
Fig. 38A  Fig. 38B

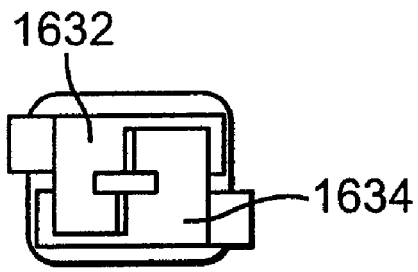
Fig. 39C
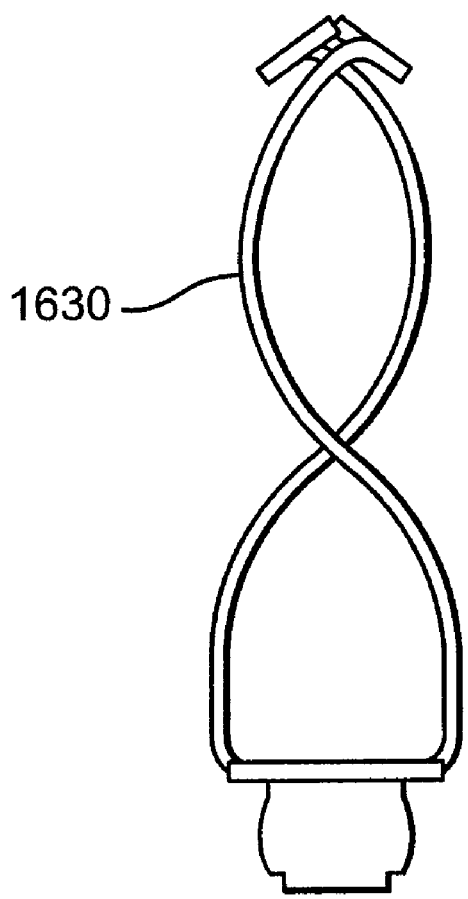 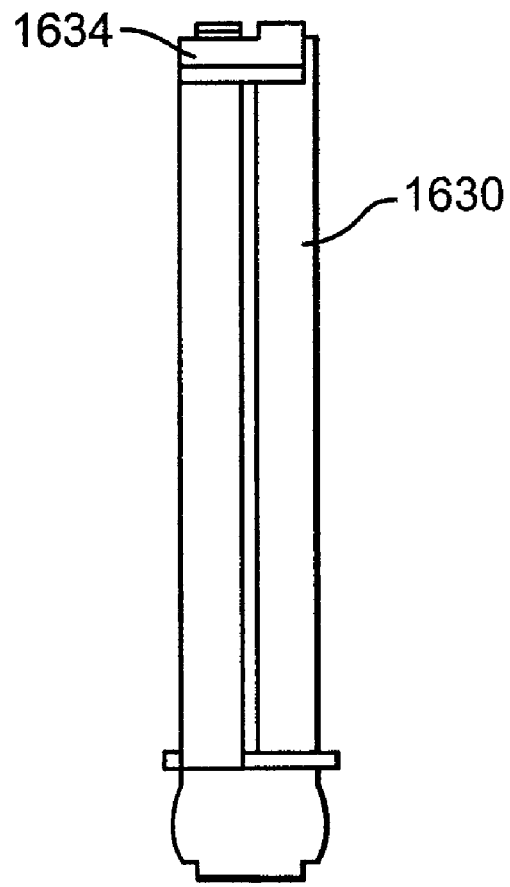
Fig. 39A     Fig. 39B

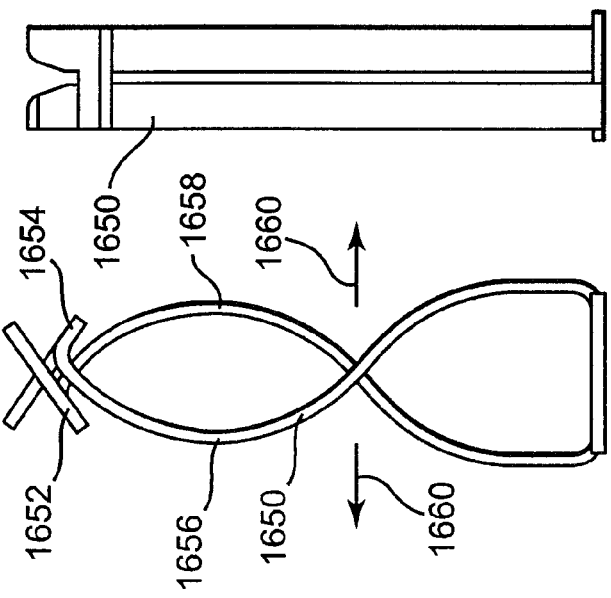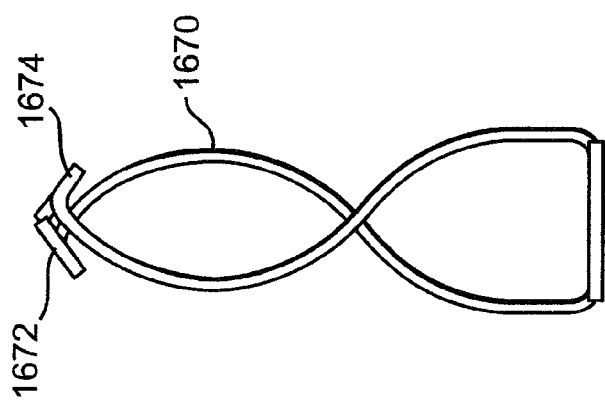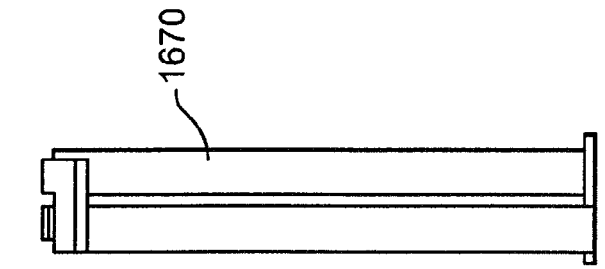
Fig. 40C  Fig. 40A  Fig. 40B  Fig. 41A  Fig. 41C  Fig. 41B

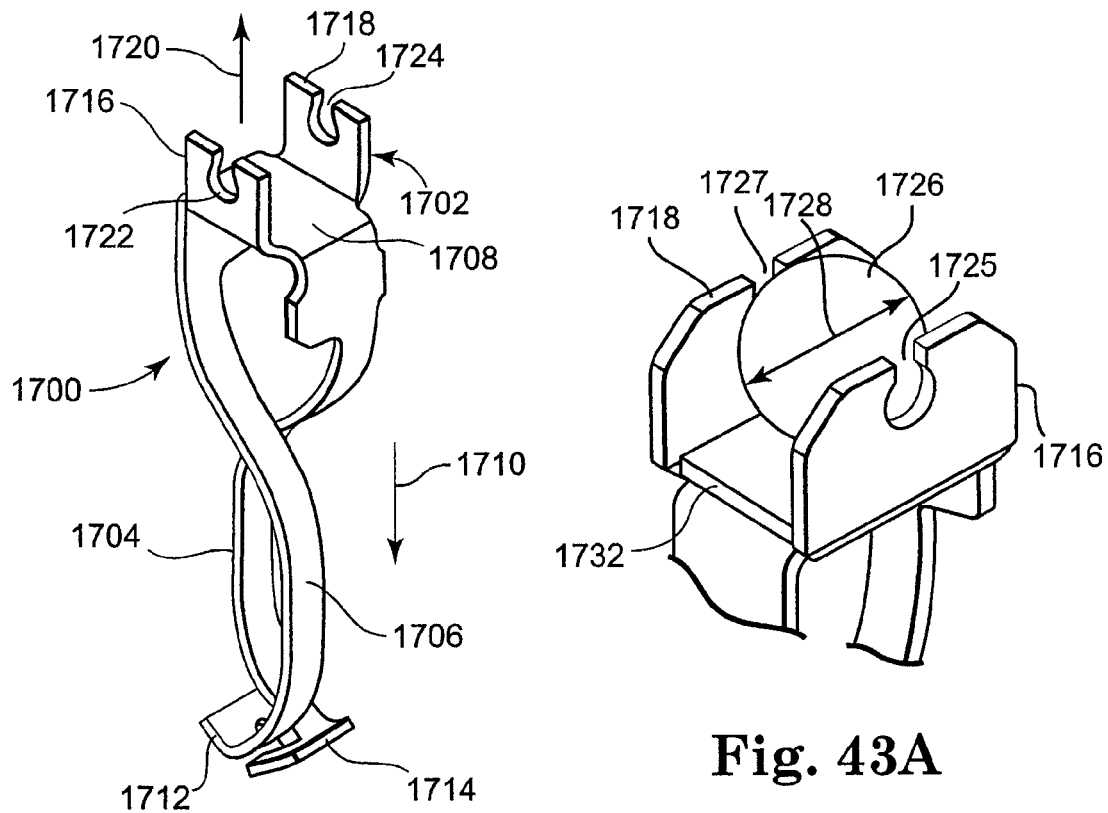
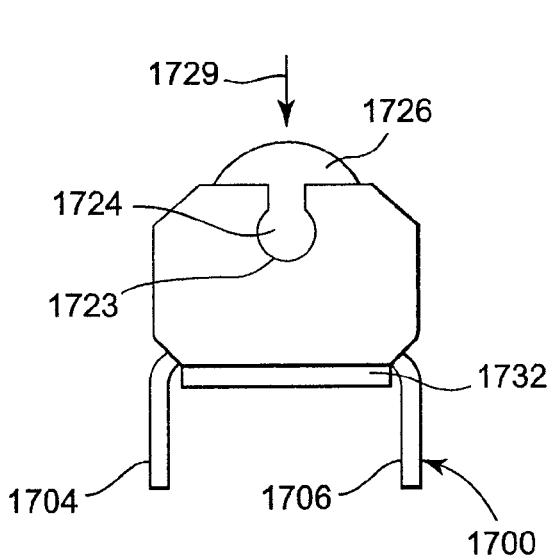
Fig. 42
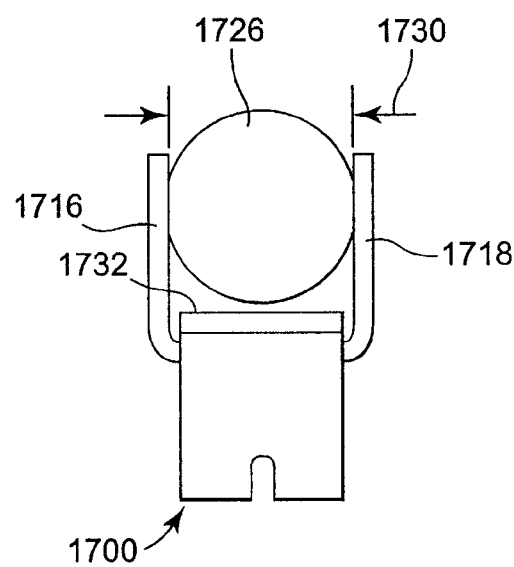

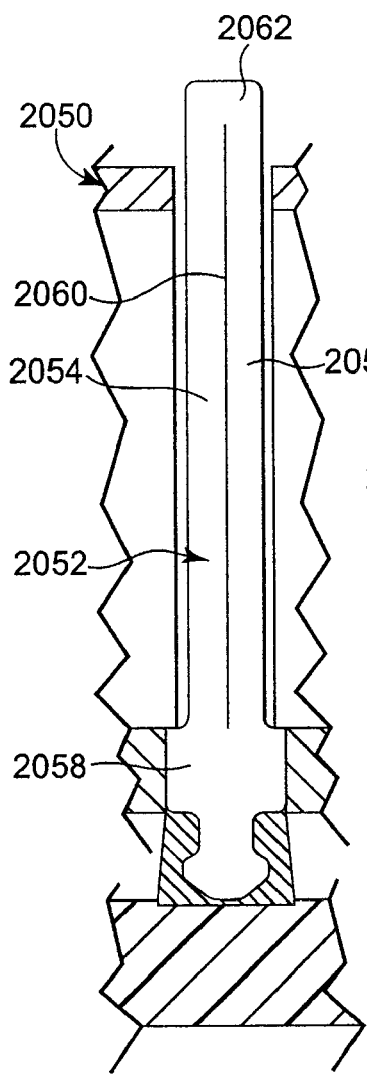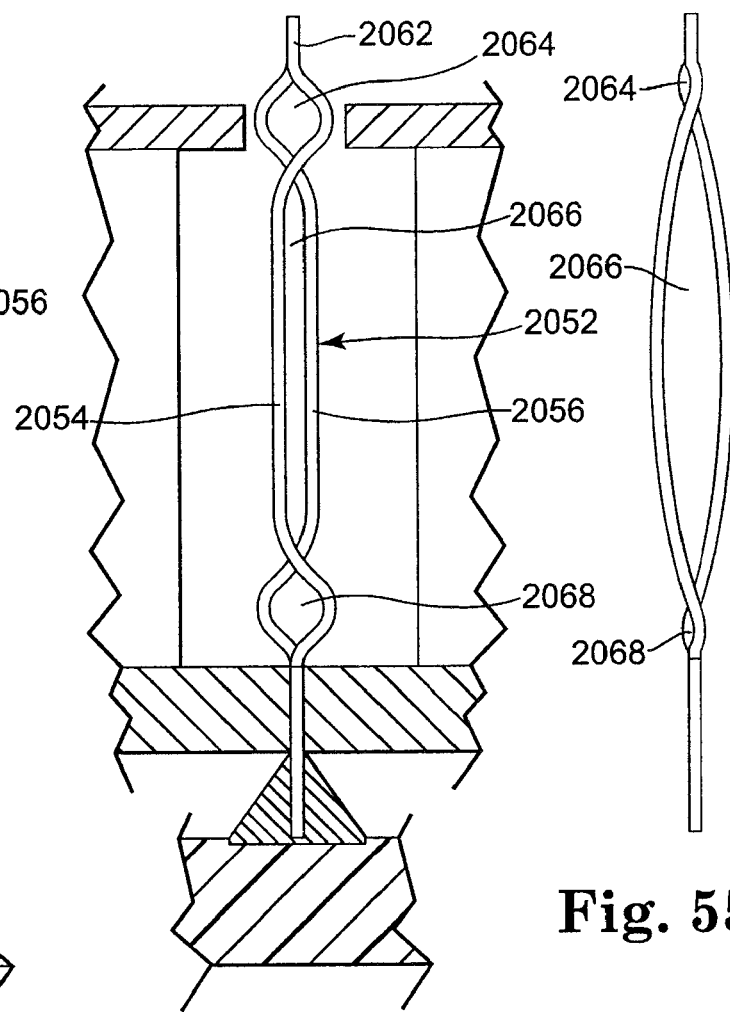
Fig. 55A  Fig. 55B  Fig. 55C

FINE PITCH ELECTRICAL INTERCONNECT ASSEMBLY

The present application is a divisional of U.S. Ser. No. 11/253,510 entitled Fine Pitch Electrical Interconnect Assembly, filed Oct. 19, 2005 (U.S. Pat. No. 7,297,003), which is a continuation-in-part of U.S. Ser. No. 11/030,213 entitled Fine Pitch Electrical Interconnect Assembly, filed Jan. 4, 2005 now U.S. Pat. No. 7,326,064, which is a continuation-in-part of PCT/US2004/022886 entitled Electrical Interconnect Assembly with Interlocking Contact System, filed Jul. 15, 2004, which claims the benefit of U.S. Provisional Patent application Ser. No. 60/487,630, entitled Snap-in Retention Contact System, filed Jul. 16, 2003, all of which are hereby incorporated by reference.

FIELD OF THE INVENTION

The present invention is directed to an electrical interconnect assembly for electrically connecting a first circuit members to one or more second circuit members, and in particular, an electrical connector adapted to surface mount on a printed circuit board having elongated contact members with two or more beams adapted to electrically couple with integrated circuits and a pitch of about 1.1 millimeters or less.

BACKGROUND OF THE INVENTION

The current trend in connector design for those connectors utilized in the computer field is to provide both high density and high reliability connectors between various circuit devices. High reliability for such connections is essential due to potential system failure caused by improper connections of devices. Further, to assure effective repair, upgrade, testing and/or replacement of various components, such as connectors, cards, chips, boards, and modules, it is highly desirable that such connections be separable and reconnectable in the final product.

Pin-type connectors soldered into plated through holes or vias are among the most commonly used in the industry today. Pins on the connector body are inserted through plated holes or vias on a printed circuit board and soldered in place using a conventional mechanism. Another connector or a packaged semiconductor device is then inserted and retained by the connector body by mechanical interference or friction. The tin lead alloy solder and associated chemicals used throughout the process of soldering these connectors to the printed circuit board have come under increased scrutiny due to their environmental impact. The plastic housings of these connectors undergo a significant amount of thermal activity during the soldering process, which stresses the component and threatens reliability.

The soldered contacts on the connector body are typically the mechanical support for the device being interfaced by the connector and are subject to fatigue, stress deformation, solder bridging, and co-planarity errors, potentially causing premature failure or loss of continuity. In particular, as the mating connector or semiconductor device is inserted and removed from the connector attached to the printed circuit board, the elastic limit on the contacts soldered to the circuit board may be exceeded causing a loss of continuity. These connectors are typically not reliable for more than a few insertions and removals of devices. These devices also have a relatively long electrical length that can degrade system performance, especially for high frequency or low power components. The pitch or separation between adjacent device leads that can be produced using these connectors is also limited due to the risk of shorting.

Another electrical interconnection method is known as wire bonding, which involves the mechanical or thermal compression of a soft metal wire, such as gold, from one circuit to another. Such bonding, however, does not lend itself readily to high-density connections because of possible wire breakage and accompanying mechanical difficulties in wire handling.

An alternate electrical interconnection technique involves placement of solder balls or the like between respective circuit elements. The solder is reflowed to form the electrical interconnection. While this technique has proven successful in providing high-density interconnections for various structures, this technique does not allow facile separation and subsequent reconnection of the circuit members.

An elastomer having a plurality of conductive paths has also been used as an interconnection device. The conductive elements embedded in the elastomeric sheet provide an electrical connection between two opposing terminals brought into contact with the elastomeric sheet. The elastomeric material that supports the conductive elements compresses during usage to allow some movement of the conductive elements. Such elastomeric connectors require a relatively high force per contact to achieve adequate electrical connection, exacerbating non-planarity between mating surfaces. Location of the conductive elements is generally not controllable. Elastomeric connectors may also exhibit a relatively high electrical resistance through the interconnection between the associated circuit elements. The interconnection with the circuit elements can be sensitive to dust, debris, oxidation, temperature fluctuations, vibration, and other environmental elements that may adversely affect the connection.

BRIEF SUMMARY OF THE INVENTION

The present invention is directed to an electrical interconnect assembly for electrically interconnecting terminals on a first circuit member with terminals on a second circuit member. The electrical interconnect assembly includes a housing with a plurality of through openings that extend between a first surface and a second surface of the housing. A plurality of contact members are positioned in a plurality of the through openings. The contact members include a base portion and one or more beams. A layer is molded to the housing and the contact members to retain the contact members in the openings. A solder member is preferably coupled with an engagement feature on the base portion of the contact member.

In one embodiment, the first and second beams comprise a serpentine shape. The distal ends of the first and second beams optionally include overlapping tips. The beams optionally have a symmetrical configuration.

The layer optionally serves as a sealing layer that substantially prevents solder from wicking between the contact members and the housing. The engagement feature can include at least one undercut on the base portion. At least one tab is attached to the base portion. The tab includes at least one engagement feature mechanically coupled to a solder member.

In one embodiment, the one or more beams comprise a first beam having a proximal end attached to the base portion and a distal end extending away from the base portion in a first direction, and a second beam having a proximal end attached to the base portion and a distal end extending away from the base portion generally in the first direction. The first and second beams are configured to form at least one loop.

The contact members preferably form one of a press-fit, an interlocking or a snap-fit relationship with the housing. In one embodiment, the housing includes a plurality of layers forming a plurality of substantially non-moldable through openings that extend between a first surface and a second surface. At least one contact member form an interlocking relationship with one of the substantially non-moldable through opening. The through openings are preferably arranged in a two-dimensional array. In one embodiment, at least one layer in the housing comprises a circuit layer.

A sealing layer preferably substantially seals the through openings between the contact members and the housing along at least one of the first surface and the second surface. The sealing layer preferably comprises a curable polymeric material. In one embodiment, a polymeric layer is overmolded to secure the contact members to the housing.

The base portion and the first and second beams preferably comprise different portions of a formed continuous sheet material. Similarly, the base portion and the tab preferably comprise different portions of a formed continuous sheet material.

In one embodiment, the first and second beams comprise a serpentine shape forming two loops. The first beam is preferably attached to the base portion at a discrete location from the second beam. In one embodiment, the first and second beams overlap at a location between the respective proximal ends and distal ends to form a first loop. The distal ends of the first and second beams comprise a second loop. In one embodiment, the distal ends of the first and second beams form a loop when engaged with one of the first or second circuit members.

The distal ends of the first and second beams optionally have overlapping tips. In one embodiment, the pair of overlapping tips prevents the distal ends from separating.

In one embodiment, the at least one tab comprises a pair of opposing tabs. The solder member can optionally be compressively retained between a pair of opposing tabs. In another embodiment, the solder member is compressively engaged between the tab and the base portion. The engagement features can be a hole, a recess, a protrusion, a barb mechanically, or a variety of other structures that mechanically coupled to the solder member. The tabs and/or the engagement features can plastically and/or elastically deform into engagement with the solder member. The solder member can be spherical, cubic, hexagonal, or a variety of other shapes.

The present invention is also directed to an electrical interconnect assembly for electrically interconnecting terminals on a first circuit member with terminals on a second circuit member in which the contact members have one or more beams each with a proximal end attached to the base portion and a distal end extending away from the base portion in a first direction. One or more tabs are attached to the base portion. The second circuit member includes a plurality of contact pads configured to engage with a plurality of the tabs on the contact members. A solder member is located on a plurality of the contact pads. When the solder member is melted, it forms a bond with the tabs on the contact members. The solder member is preferably solder paste printed or deposited onto the second circuit member.

The present invention is directed to an electrical interconnect assembly for electrically interconnecting terminals on a first circuit member with terminals on a second circuit member. The electrical interconnect assembly includes a housing with a plurality of through openings that extend between a first surface and a second surface of the housing. A plurality of contact members are positioned in a plurality of the through openings. The contact members include a base portion. A polymeric layer is overmolded to couple the base portion of the contact members to the housing. A solder member is coupled to a side of the base portion opposite the beams.

BRIEF DESCRIPTION OF THE SEVERAL VIEWS OF THE DRAWINGS

FIGS. 37A-37C illustrate a contact member suitable for use with an LGA device in accordance with the present invention.

FIGS. 38A-38C illustrate an alternate contact member suitable for use with an LGA device in accordance with the present invention.

FIGS. 39A-39C illustrate an alternate contact member suitable for use with an LGA device in accordance with the present invention.

FIGS. 40A-40C illustrate a contact member suitable for use with a BGA device in accordance with the present invention.

FIGS. 41A-41C illustrate an alternate contact member suitable for use with a BGA device in accordance with the present invention.

FIG. 42 illustrates an alternate dual loop connector member with a solder member attachment mechanism in accordance with the present invention.

FIGS. 43A-43C illustrate the solder member attachment mechanism of FIG. 42 engaged with a solder member in accordance with the present invention.

FIGS. 55A and 55B illustrate an alternate connector member with a pair of beams formed from a continuous piece of material in accordance with the present invention.

FIG. 55C is a side view of the contact member of FIGS. 55A and 55B.

DETAILED DESCRIPTION OF THE INVENTION

Figure 1:
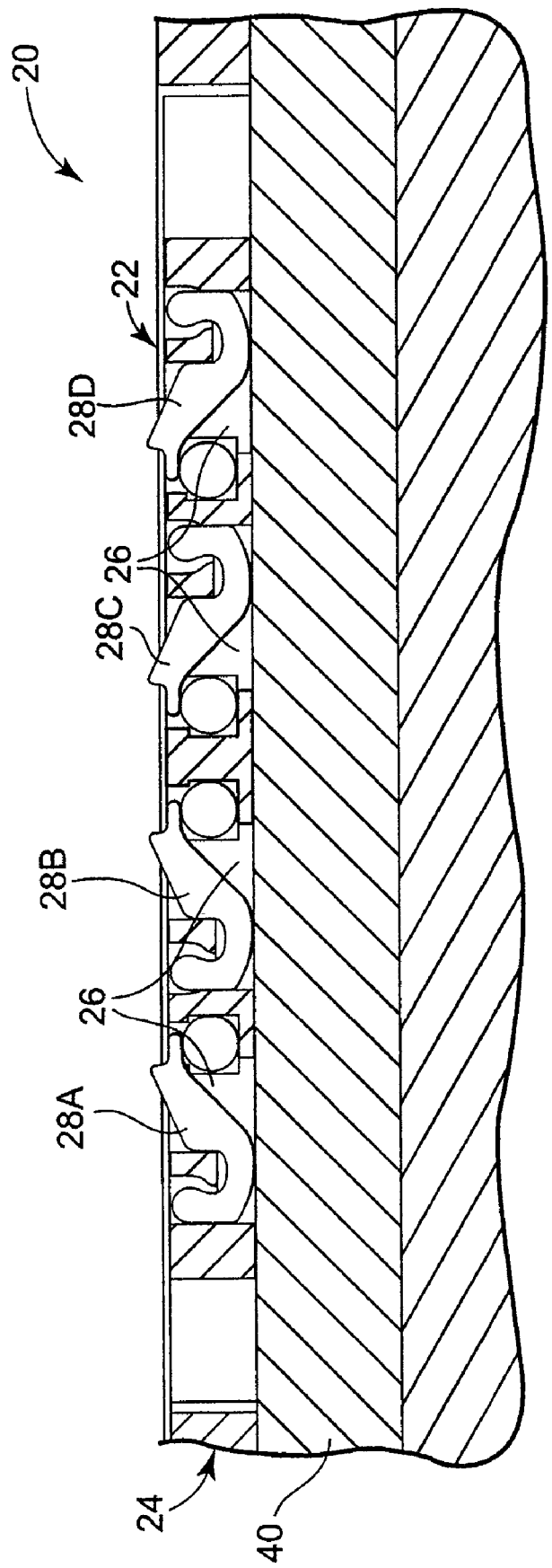
FIG. 1 is a schematic side sectional view of an electrical interconnect assembly with a contact system in accordance with the present invention.

The present invention is directed to a technique for creating an insulator housing in low, medium, or high volume by laminating layers of precisely patterned materials. The patterned layers can be constructed from the same or multiple material types. The layers are optionally selectively laminated to relieve stress caused by thermal expansion differentials.

The present construction method permits internal features that would normally be impossible to mold or machine. For large pin count devices, the laminating process produces an inherently flat part without requiring molds. Stiffening layers made of materials such as BeCu, Cu, ceramic, or polymer filled ceramic can be added to provide additional strength and to provide thermal stability during solder reflow.

The multi-layered housing can also include circuitry layers. Power, grounding and/or decoupling capacitance can be added between layers or between pins, and unique features such as embedded IC devices or RF antennae can optionally be incorporated. In some cases, layers can be used to assist with device insertion or removal, such as with ZIF or stripper plate actuation mechanisms. Consequently, the present interconnect assembly can be enhanced in ways not possible using conventional molding or machining techniques.

The present interconnect assembly permits the creation of high aspect ratio through holes and slots with internal cavities having non-moldable features, to allow for contact flexure clearance, on fine contact to contact spacing (pitch). The present interconnect assembly accommodates pin counts of 1000-2500 I/O range at 1.0 mm pitch, and more preferably a pitch of about 0.8 millimeter, and most preferably a pitch of about 0.5 millimeter. Such fine pitch interconnect assemblies are especially useful for communications, wireless, and memory devices.

The present interconnect assembly provides the ability to press-fit the contacts into lower layers to position, point and retain the contact and seal the interface to prevent solder or flux wicking during reflow. A post insertion solder mask (as done on printed circuit boards and IC packages) can also be added to improve solder deposit formation and wick prevention.

The present lamination process permits stiffening layers, spacer, circuitry, and/or protective layers to be added to the interconnect assembly. The lamination system also permits the creation of high aspect ratio contacts, in which almost 80-90% of the physical height of the contacts can be vertically compressed, even in quad contact beam systems. The present low cost, high signal performance interconnect assemblies, which have low profiles and can be soldered to the system PC board, are particularly useful for desktop and mobile PC applications.

Use of the present interconnect assembly permits manufactures to install expensive IC devices during system build, providing the opportunity to later customize the system without stocking substitute circuit boards. The use of the present interconnect assembly allows new IC devices to replace initial release IC devices in the field (or at OEM) without the need for disassembling the system or reworking the circuit board. Trends towards lead-free electronics also increases the attractiveness of the present interconnect assembly. The IC supplier can leave the solder balls off their package or device to reduce the lead content.

FIG. 1 illustrates an interconnect assembly 20 in accordance with the present invention. The interconnect assembly 20 includes a contact system 22 and a housing 24 having electrical insulating properties. The housing 24 includes a plurality of through openings 26. Contact members 28A, 28B, 28C and 28D (referred to collectively as "28") are located in at least some of the through openings 26 and are coupled to the housing 24. In the illustrated embodiment, the interconnect assembly 20 is electrically coupled to circuit member 40. As used herein, the term "circuit members" refers to, for example, a packaged integrated circuit device, an unpackaged integrated circuit device, a printed circuit board, a flexible circuit, a bare-die device, an organic or inorganic substrate, a rigid circuit, or any other device capable of carrying electrical current.

The housing 24 may be constructed of a dielectric material, such as plastic. Suitable plastics include phenolics, polyesters, and Ryton® available from Phillips Petroleum Company. Alternatively, the housing 24 may be constructed from metal, such as aluminum, with a non-conductive surface, such as an anodized surface. For some applications, the metal housing may provide additional shielding of the contact members. In an alternate embodiment, the housing is grounded to the electrical system, thus providing a controlled impedance environment. Some of the contact members can be grounded by permitting them to contact an uncoated surface of the metal housing. As used herein, an "electrically insulative connector housing" or a "module housing" refers to a housing that is either non-conductive or substantially coated with a non-conductive material to prevent unwanted conductivity between the contact members and the housing, as discussed above.

The housings of the present invention can optionally be constructed from a plurality of discrete layers. The layers can be etched or ablated and stacked without the need for expensive mold tooling. The layers can create housing features that have a much larger aspect ratio than typically possible with molding or machining. The layers also permit the creation of internal features, undercuts, or cavities that are difficult or typically not possible to make using conventional molding or machining techniques, referred to herein as a "non-moldable feature." The present housings also permit stiffening layers, such as metal, ceramic, or alternate filled resins, to be added to maintain flatness where a molded or machined part might warp.

The housings of the present invention can optionally include circuitry, power, and/or ground planes to selectively connect or insulate contact members within a given field. The layers can be selectively bonded or non-bonded to provide contiguous material or releasable layers. As used herein, "bond" or "bonding" refers to, for example, adhesive bonding, solvent bonding, ultrasonic welding, thermal bonding, or any other techniques suitable for attaching adjacent layers of the housing. Multiple layers of differing contact members can be implemented to interact with each other, while being permanently engaged or separable. The layers can be structured in such a way as to rigidly retain the contact members or to allow the contacts to float or move along the X, Y, and/or Z axes of the contact members. The layers can be constructed in such a way that the base of the contact members are either in a sealed condition as a result of the insertion process to prevent solder or flux wicking during reflow, or the interface can be sealed post assembly.

Figure 2:
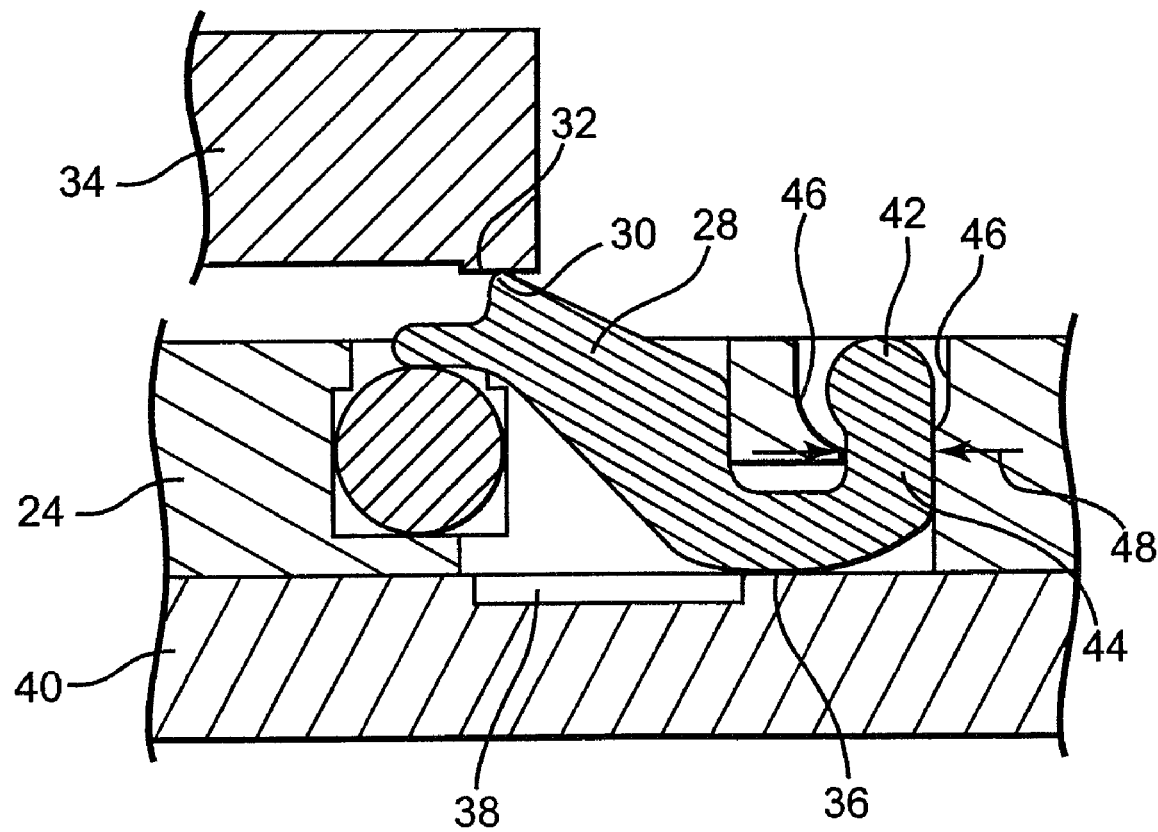
FIG. 2 is a more detailed schematic side sectional view of a portion of the contact system of FIG. 1.

FIG. 2 illustrates more detail of one of the contact members 28 interlocked to the housing 24. The contact member 28 has a first interface portion 30 and a second interface portion 36. The first interface portion 30 is positioned to electrically couple with terminal 32 on first circuit member 34 and the second interface portion 36 is positioned to electrically couple with terminal 38 on the second circuit member 40, when the first and second circuit members 34, 40 are biased toward the housing 24. Any method of securing can be used, including bolting, clamping and gluing.

The contact member 28 includes an interlocking feature 42 and a transition portion 44 connected to the interlocking feature 42. In the illustrated embodiment, the interlocking feature 42 is greater in size than the transition portion 44 in at least one direction. The through opening 26 in the housing 24 includes at least one interlocking feature 46 of sufficient size to accommodate the interlocking feature 42 on the contact member 28. In the illustrated embodiment, the interlocking feature 42 is a ball-shaped structure and the interlocking feature 46 is a socket. As used herein, "interlocking" and "interlocked" refer to a mechanical coupling where one part is trapped or captured by another part in such a way as to permit at least a portion of one of the parts to move relative to the other part through at least one degree of freedom, such as for example by hooking, snap-fit, non-binding interference fit, dovetailing. An "interlocking feature" refers to a structure for interlocking.

The housing 24 includes an opening 48 large enough to accommodate the transition portion 44 but smaller than the interlocking feature 42 in at least one direction so that the contact member 28 does not fall out of the housing 24. The interlocking feature 42 thus can be secured to the interlocking feature 46 with the transition positioned 44 extending through the opening 48.

Figure 3:
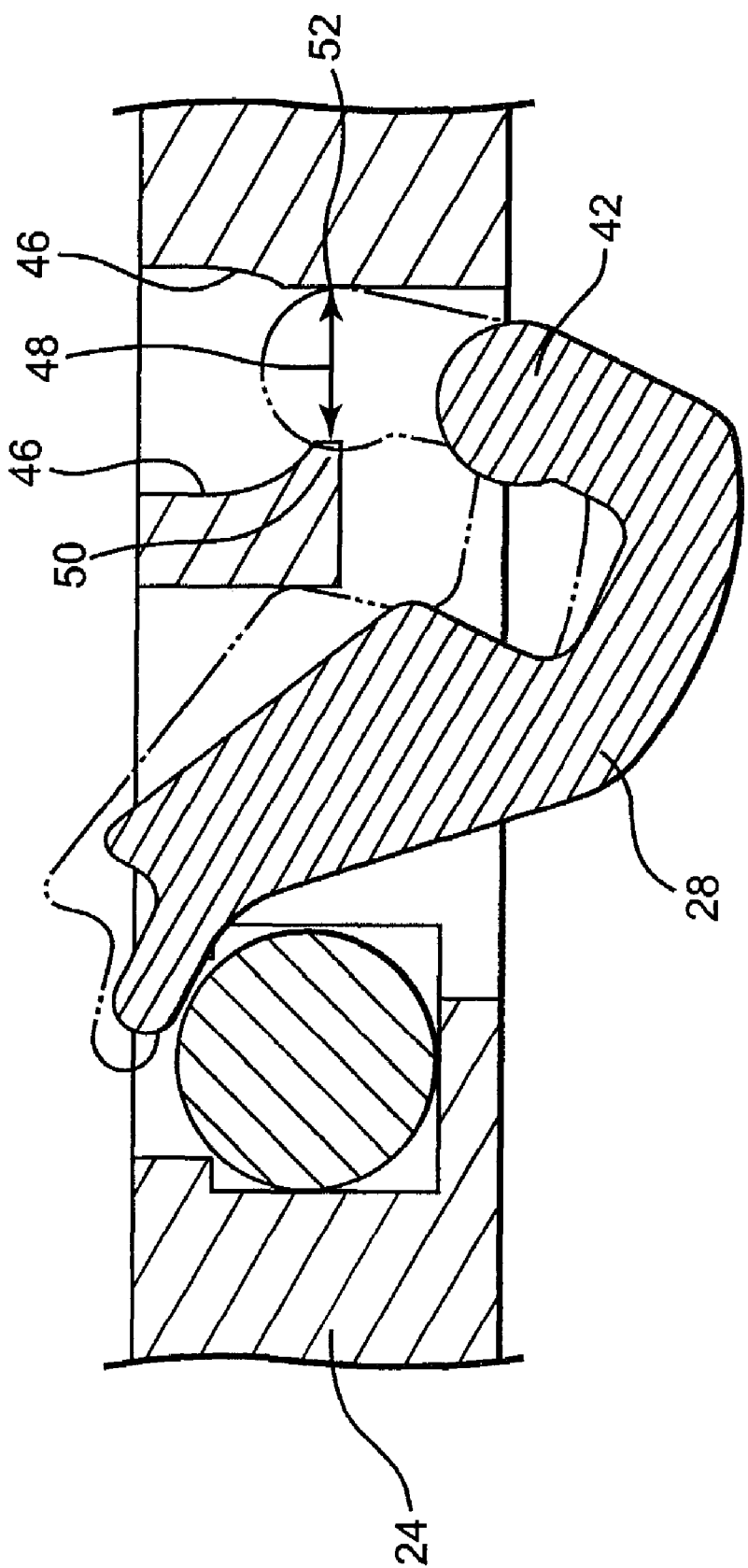
FIG. 3 is a schematic side sectional view of the interlocking operation to couple the contact member of FIG. 2 to the housing.

FIG. 3 is a composite drawing showing both before and after the contact member 28 is installed in the housing 24. The portions 50, 52 on either side of the opening 48 and/or the interlocking feature 42 are sufficiently flexible to permit the interlocking feature 42 to snap-fit into the corresponding interlocking feature 46. As used herein, "snap fit" refers to interlocking by substantially elastic deformation of a contact member and/or a housing.

Figure 4:
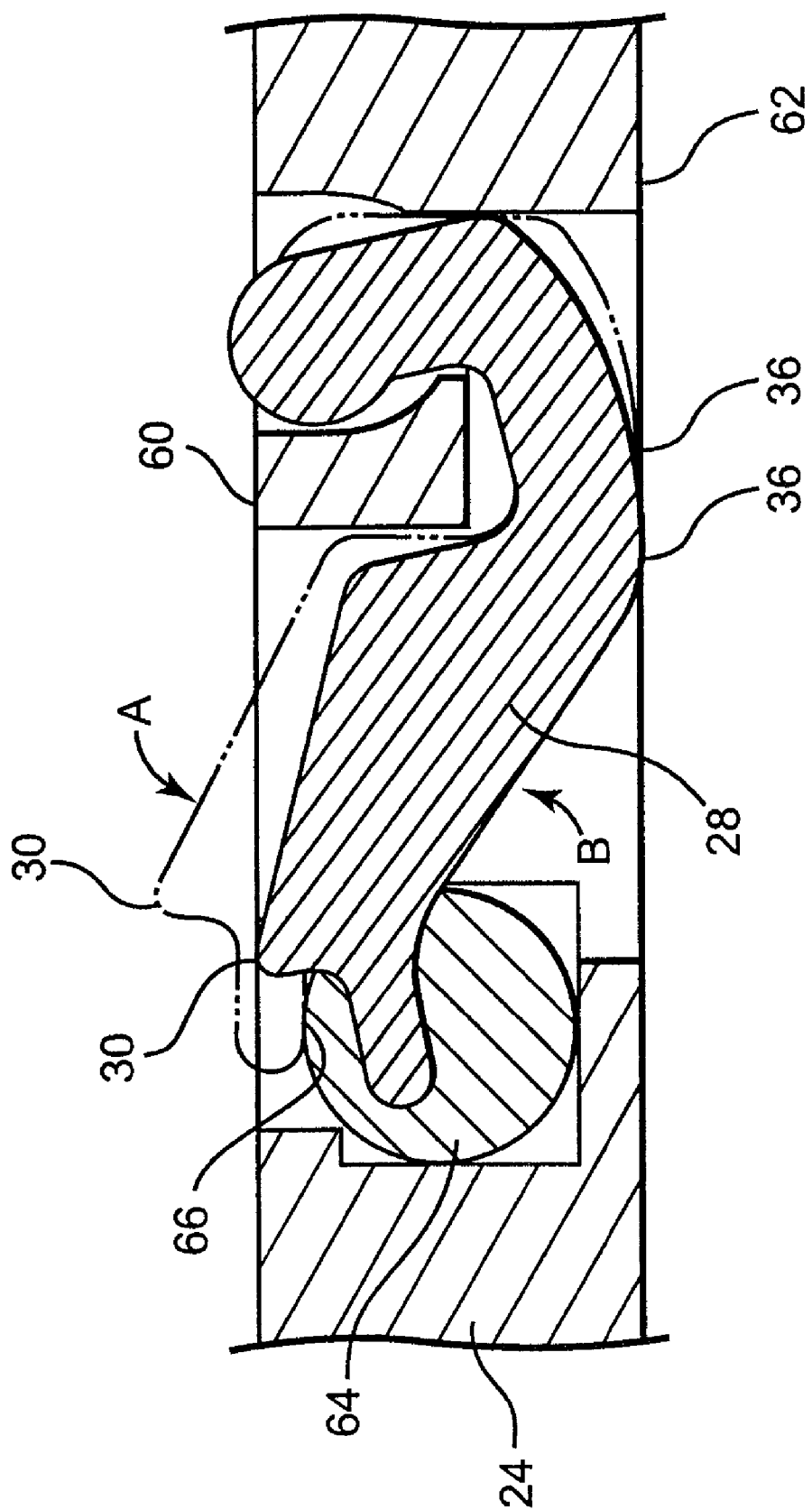
FIG. 4 is a schematic side sectional view of the operation of the contact member of FIG. 2 in both the engaged and disengaged positions.

FIG. 4 illustrates the operation of the contact member 28 in the housing 24. The housing 24 includes a top surface 60 and a bottom surface 62. The top surface 60 is adapted to be biased toward the first circuit member 34 and the bottom surface 62 is adapted to be biased toward the second circuit member 40 (see e.g., FIG. 2). The first interface portion 30 of the contact member 28 is biased by elastomeric member 64 to protrude above the top surface 60 (position A) when the first circuit member 34 is not secured to the housing 24. The first interface portion 30 is displaced toward the top surface 62 (position B) when the first circuit member 34 is biased toward the housing 24. The location of the second interface portion 36 is biased against the second circuit member 40 when both the first and second circuit members 34, 40 are biased toward the housing 24.

In the embodiment shown in FIG. 4, the biasing of the first interface portion 30 is provided, at least in part, by a elastomeric member 64 located under the first interface portion 30. The elastomeric member 64 can be in any form suitable to provide the necessary biasing force, including spherical, cylindrical and rectangular. It can be secured in a variety of ways, including being glued to the housing 24 and/or the contact member 28, press-fitted into a cavity defined on either the housing of the contact member, or simply trapped in a space defined between the housing and the contact member. As the first circuit member 34 is biased toward the housing 24, the elastomeric member 64 is compressed, and the moment arm created by the forces at the tip portion 66 by the elastomeric member 64 and at the first interface portion 30 results in a force biasing the second interface portion 36 toward the second circuit member 40 secured to the bottom surface 62 of the housing 24.

It should be noted that the designations of "top" and "bottom" in this context is purely for the convenience of distinguishing different parts of the contact system and the environment in which it is used. These and other directional designations are not intended to restrict the scope of the invention to require the housing to be oriented in any particular direction.

The present contact system 22 can also include features that provide stress relief to the contact member. For example, in one embodiment, best shown in FIG. 4, the second interface portion 36 has an arcuate bottom surface to allow the contact member 28 to roll when the first contact portion is pushed down by the first circuit member 34. The contact member 28 and the housing 24 can also be sufficiently compliant to provide stress relief.

The contact members 28 are preferably constructed of copper or similar metallic materials such as phosphor bronze or beryllium-copper. The contact members are preferably plated with a corrosion resistant metallic material such as nickel, gold, silver, palladium, or multiple layers thereof. In some embodiments the contact members are encapsulated except the interface portions. The encapsulating material is typically silicone based with a Shore A durometer of about 20 to about 40. Examples of suitable encapsulating materials include Sylgard® available from Dow Coming Silicone of Midland, Mich. and Master Sil 713 available from Master Bond Silicone of Hackensack, N.J.

Figure 5:
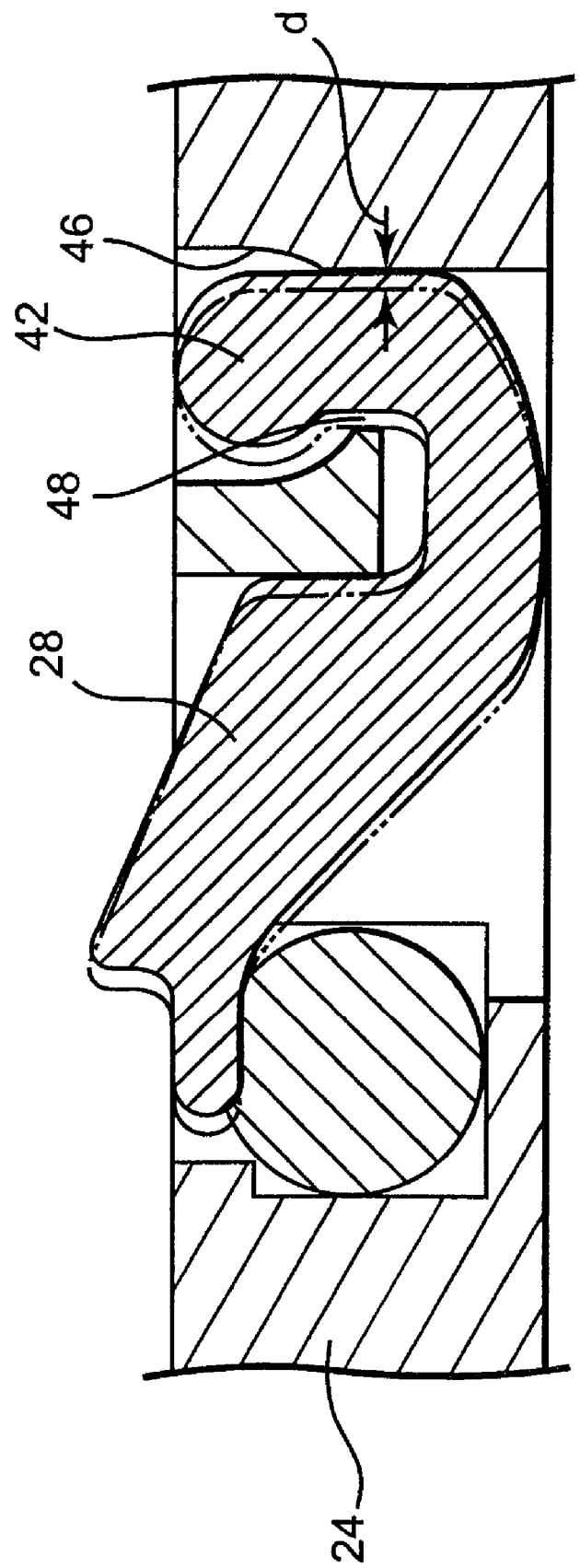
FIG. 5 is a schematic side sectional view of the lateral movement within the housing of the contact member of FIG. 2.

FIG. 5 illustrates lateral movement or shifting of the contact member 28 within the housing 24. The amount of shift, d, is preferably smaller than the difference between the width of the interlocking feature 42 and that of the opening 48 so that the contact member 28 does not fall out of the interlocking feature 46.

Figure 6:
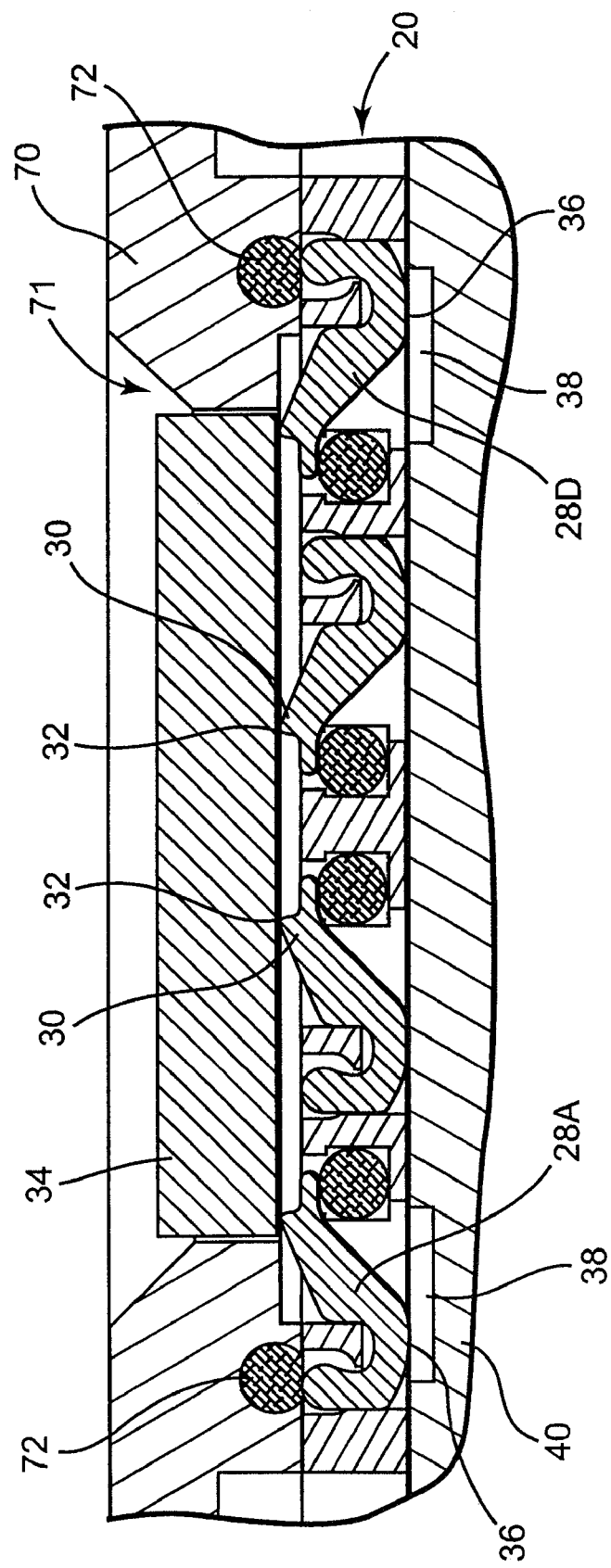
FIG. 6 is a schematic side sectional view of the electrical interconnect assembly of FIG. 1 electrically coupled to a pair of circuit members.

FIG. 6 illustrates the present interconnect assembly 20 in operation. The interconnect assembly 20 is preferably compressed between the first and second circuit members 34, 40. Optional alignment member 70 forms a device site 71 that aligns the terminals 32 on the first circuit device 34 with the first interface portions 30 of the contact members 28 (see FIG. 2). The alignment member 70 can optionally include secondary elastomeric members 72 that provide an additional biasing force on contact members 28A and 28D. The interconnect assembly 20 of FIG. 6 can optionally be designed to receive multiple circuit members 34, such as the replaceable chip modules disclosed in U.S. Pat. Nos. 5,913,687; 6,178,629; and 6,247,938, all of which are incorporated by reference.

In the illustrated embodiment, the first circuit member 34 is an LGA device and the second circuit member 40 is a PCB. The housing 24 is optionally secured to the PCB 40, with the second interface portions 36 of each contact member 28 positioned over a conductive pad 38 on the PCB 40. As the LGA device 34 is pressed against the contact system 22, the first interface portions 30 are pressed down against the primary elastomers 64. The arcuate second interface portions 36 the contact members 24 roll and slide somewhat over the respective conductive pads 38 on the PCB 40 and are biased against the conductive pads 38, ensuring reliable electrical contact. The interlocking features 42 tend to move upwards, but are restrained by a downward force from either housing 24 cover or a secondary elastomer 72.

Figure 7:
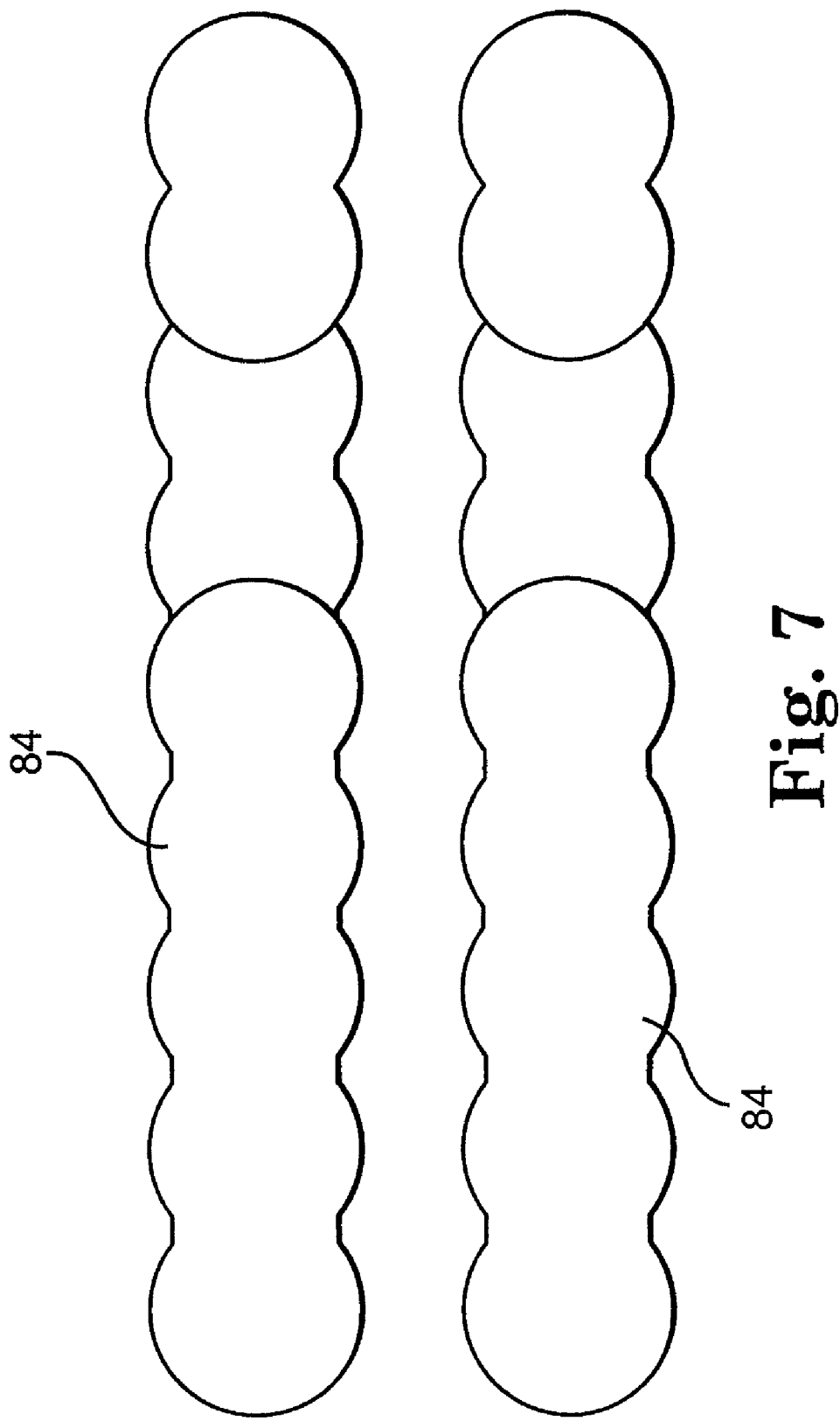
FIG. 7 is a schematic top view of a portion of a housing of a contact system showing the drilling patterns in accordance with the present invention.
Figure 8:
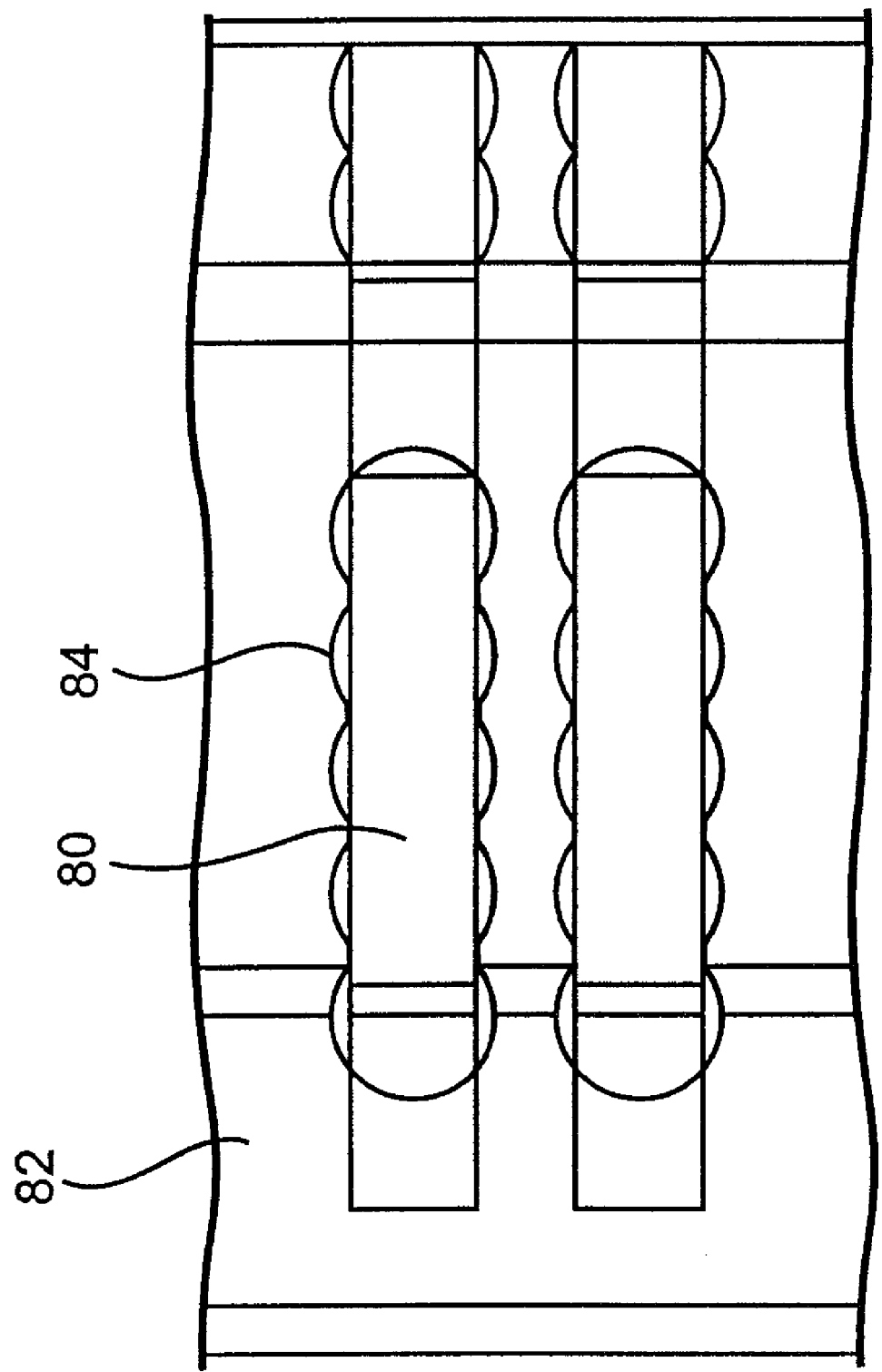
FIG. 8 is schematic top view of a portion of an alternate housing of the contact system showing a drilling pattern and elongated contact members in accordance with the present invention.

In the embodiment of FIGS. 7 and 8, the contact members 80 are elongated in shape and the housing 82 includes elongated cavities 84 that accommodate the respective contact members 80 and prevent them from sideward rotation or shift. The elongated cavities or slots 84 can be made by a variety of methods, including mechanical or laser drilling, etching, molding, and the like.

Figures 9, 10:
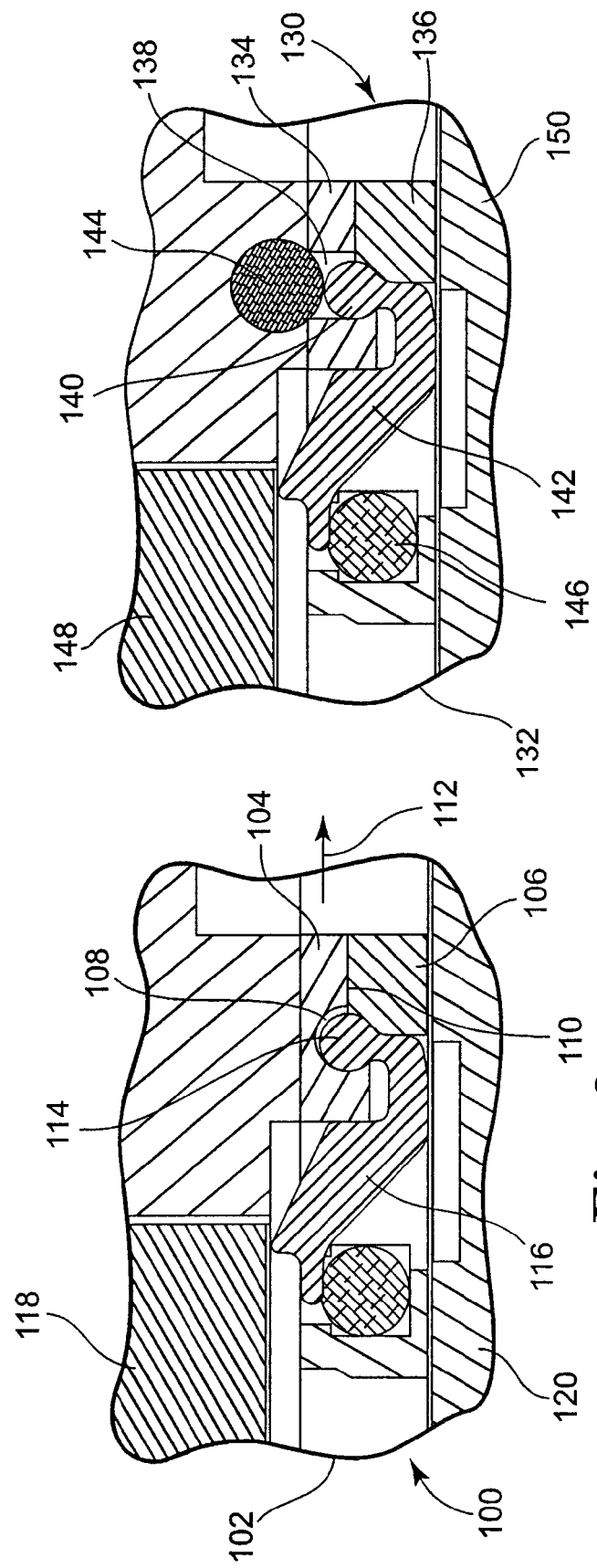
FIG. 9 is a schematic side view of an interconnect assembly with an interlocking portion formed from two discrete housing portions in accordance with the present invention.
FIG. 10 is a schematic side view of an alternate interconnect assembly with an interlocking portion formed from two discrete housing portions in accordance with the present invention.

FIG. 9 illustrates an interconnect assembly 100 with a two-part housing 102 in accordance with the present invention. The housing 102 includes a top portion 104 and a bottom portion 106. The interlocking portion 108 preferably extends across the interface 110 between the top and bottom portions 104, 106. By translating the upper portion 104 in the direction 112 relative to the bottom portion 106, the interlocking portion 108 traps the interlocking feature 114 on the contact member 116. The interlocking feature 114 is preferably retains the contact member 116 in the housing 102, but does not limit or restrict movement of the contact member 116 through the range of motion necessary to couple with the first and second circuit members 118, 120. Elastomeric member 122 biases the contact member 116 against the circuit members 118, 120.

FIG. 10 illustrates an alternate interconnect assembly 130 with a two-part housing 132 in accordance with the present invention. The top portion 134 and the bottom portion 136 form an interlocking portion 138 that traps the interlocking feature 140 on the connector member 142. A secondary elastomeric member 144 is optionally located adjacent to the interlocking portion 138. The elastomeric members 144, 146 bias the contact member 142 against the circuit members 148, 150.

Figure 11:
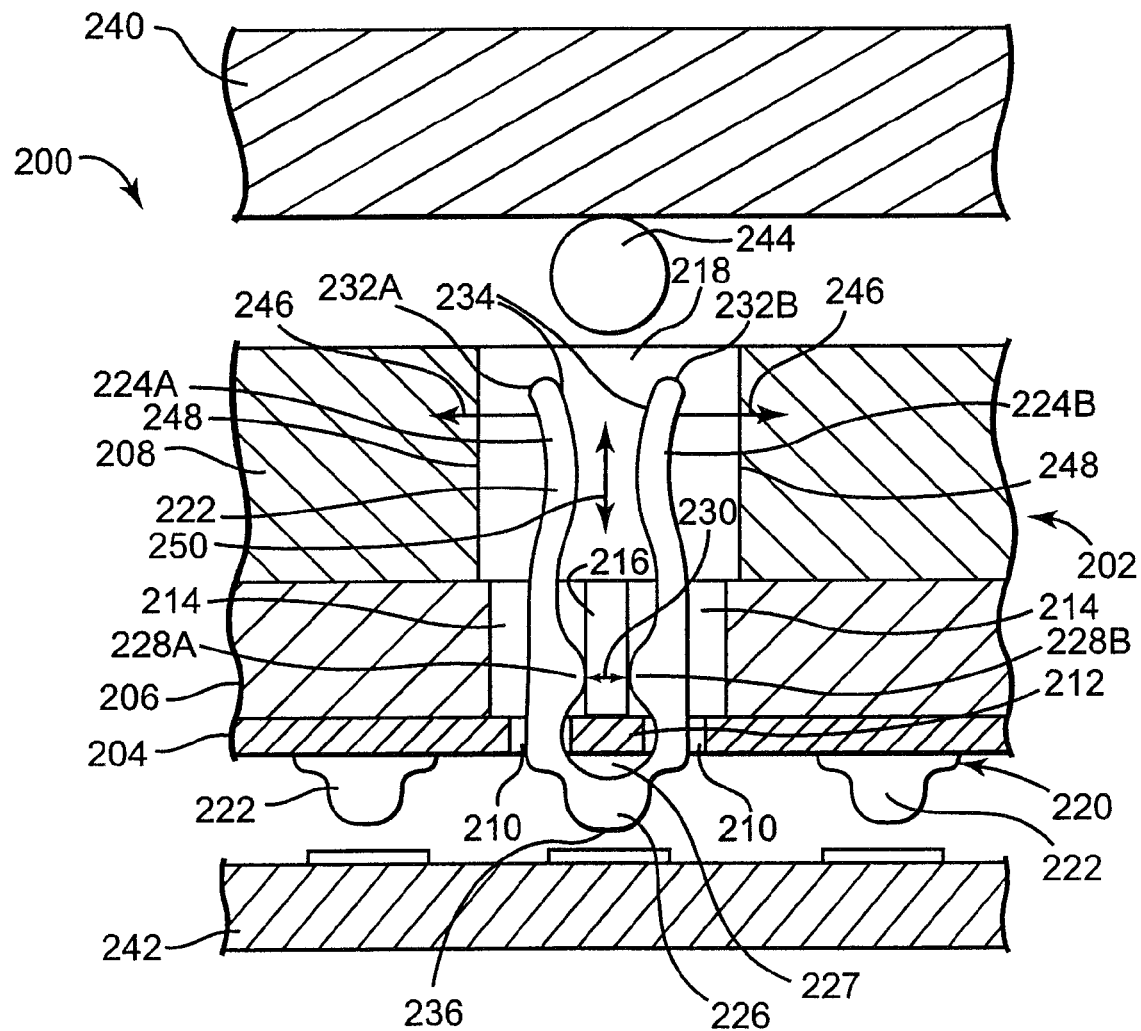
FIG. 11 is a side sectional view of an alternate interconnect assembly with a two beam contact member in accordance with the present invention.

FIG. 11 is a side sectional view of an alternate interconnect assembly 200 in accordance with the present invention. In the embodiment of FIG. 11, housing 202 includes a contact coupling layer 204, an alignment layer 206, and a stabilizing layer 208. In one embodiment, the layers 204, 206, 208 are laminated using a variety of techniques, such as thermal or ultrasonic bonding, adhesives, and the like. The contact coupling layer 204 includes a pair of through openings 210, separated by a center member 212. The contact alignment layer 206 also includes a pair of through openings 214 generally aligned with the through openings 210. The through openings 214 are separated by center member 216. The stabilizing layer 208 in the embodiment of FIG. 11 includes a single through opening 218 generally aligned with the through openings 214.

The contact system 220 of the present invention includes a plurality of contact members 222 coupled with the housing 202 in a snap fit relationship. In the embodiment of FIG. 11, contact member 222 has a generally U-shaped configuration with a pair of beams 224A, 224B (referred to collectively as "224") joined at a center portion 226. The beams 224 include a pair of opposing protrusions 228A, 228B (referred to collectively as "228"), located near the center portion 226 that form an enlarged opening 227. Gap 230 between the protrusions 228 is smaller than the enlarged opening 227, but preferably smaller than the width of center member 212.

To assemble the present interconnect assembly 200, distal ends 232A, 232B (referred to collectively as "232") of the beams 224 are inserted through the through openings 210. When the protrusions 228A, 228B meet the center member 212, the contact member 222 and/or the center member 212 deform substantially elastically to create a snap fit coupling. Once assembled the protrusions 228 retain the contact member 222 to the center member 212. The protrusions 228 are preferably positioned against or adjacent to the center member 216 on the contact alignment layer 206, thereby minimizing rotation of the contact member 222 relative to the housing 202. The center member 216 also maintains a gap between the first interface portions 234. In one embodiment, a sealing material is deposited in the openings 210 between the contact members 216 and the contact coupling layer 204 to prevent debris or solder from migrating into the housing 202.

The sizes and shape of the enlarged opening 227 and the center member 212 can be adjusted so as to permit the contact member 222 some movement relative to the housing 202. Movement of the contact member 222 along longitudinal axis 250 and rotation generally around the center member 212 are of particular interest in obtaining consistent and reliable electrical coupling with the circuit members 240, 242.

The contact member 222 includes first interface portions 234 near the distal ends 232 and second interface portion 236 near the center portion 226. The first and second interface portions 234, 236 can be electrically coupled to first and second circuit members 240, 242 using solder, a compressive force, or a combination thereof. The configuration of the first interface portions 234 of the contact member 222 are particularly well suited for engaged with solder balls 244 on the first circuit member 240. The contact member 222 can be configured to electrically couple with a wide variety of circuit members 240, including for example a flexible circuit, a ribbon connector, a cable, a printed circuit board, a ball grid array (BGA), a land grid array (LGA), a plastic leaded chip carrier (PLCC), a pin grid array (PGA), a small outline integrated circuit (SOIC), a dual in-line package (DIP), a quad flat package (QFP), a leadless chip carrier (LCC), a chip scale package (CSP), or packaged or unpackaged integrated circuits.

As the first circuit member 240 is brought into compressive relationship with the housing 202, distal ends 232 of the contact member 222 are displaced in a direction 246 towards side walls 248 of the stabilizing layer 208. The sidewalls 248 limit the displacement of the distal ends 232.

Figure 12:
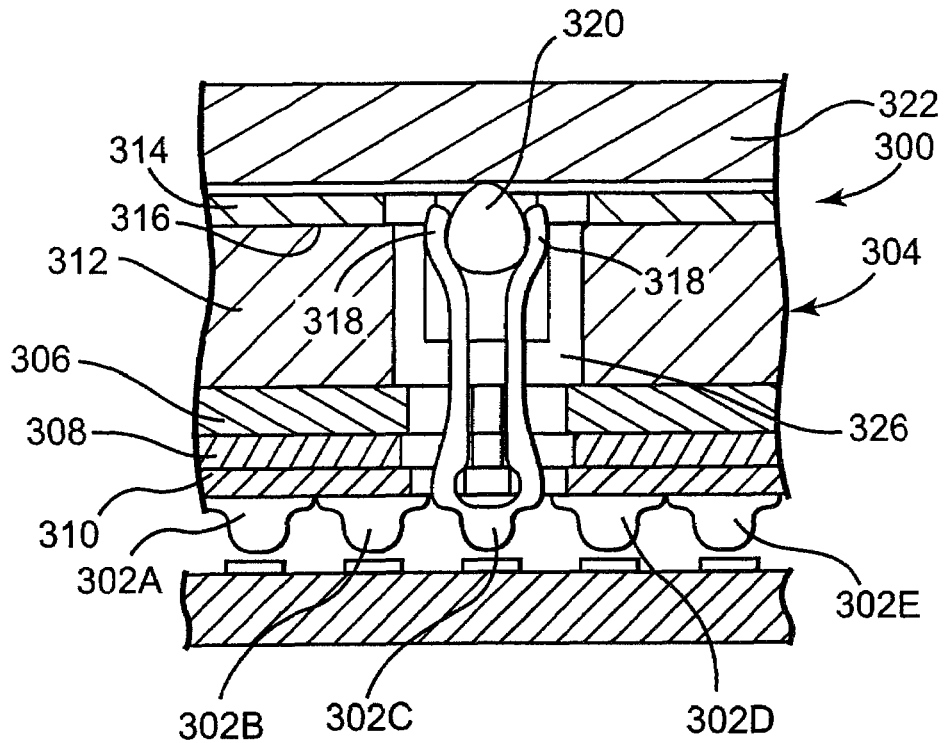
FIG. 12 is a side sectional view of another alternate interconnect assembly with a two beam contact member in accordance with the present invention.

FIG. 12 is a side sectional view of an alternate interconnect assembly 300 in accordance with the present invention. A plurality of contact members 302A, 302B, 302C, 302D, 302E (referred to collectively as "302") are positioned in through openings 326 in the housing 304, generally as discussed in connection with FIG. 11. In the embodiment of FIG. 12, circuit layer 306 and optional stiffening layer 308 are positioned between the contact coupling layer 310 and the contact alignment layer 312. The circuit layer 306 can be a power plane, a ground plane, or any other circuit structure. In the illustrated embodiment, the through openings 326 are non-moldable and are typically created by forming the housing 304 from multiple laminated layers.

The contact members 302 are coupled to the contact coupling layer 310 as discussed in connection with FIG. 11. The first interface portions 318 of the contact members 302 are preferably configured to form a snap-fit engagement with solder ball 320 on the first circuit member 322. In some embodiments, the snap fit relationship between the solder ball 320 and the first interface portions 318 may be sufficient to retain the first circuit member 322 to the interconnect assembly 300.

Figure 13:
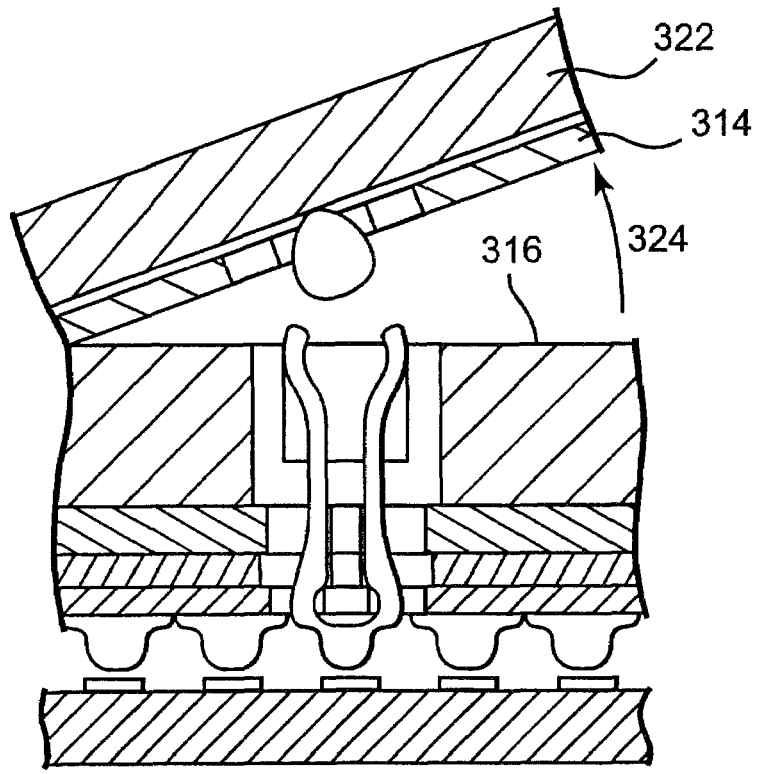
FIG. 13 is a side sectional view illustrating removal of a circuit member from the interconnect assembly of FIG. 12.

The embodiment of FIG. 12 includes an extraction layer 314 attached to top surface 316 of the contact alignment layer 312. The extraction layer 314 is preferably releasably attached to the surface 316, such as by a low-tack pressure sensitive adhesive. In the preferred embodiment, the extraction layer 314 is constructed from a flexible sheet material that can be peeled off of the top surface 316 of the contact alignment layer 312. As illustrated in FIG. 13, as the extraction layer 314 is peeled in the direction 324, the first circuit member 322 is safely disengaged from the first interface portions 318 of the contact members 302.

Figure 14:
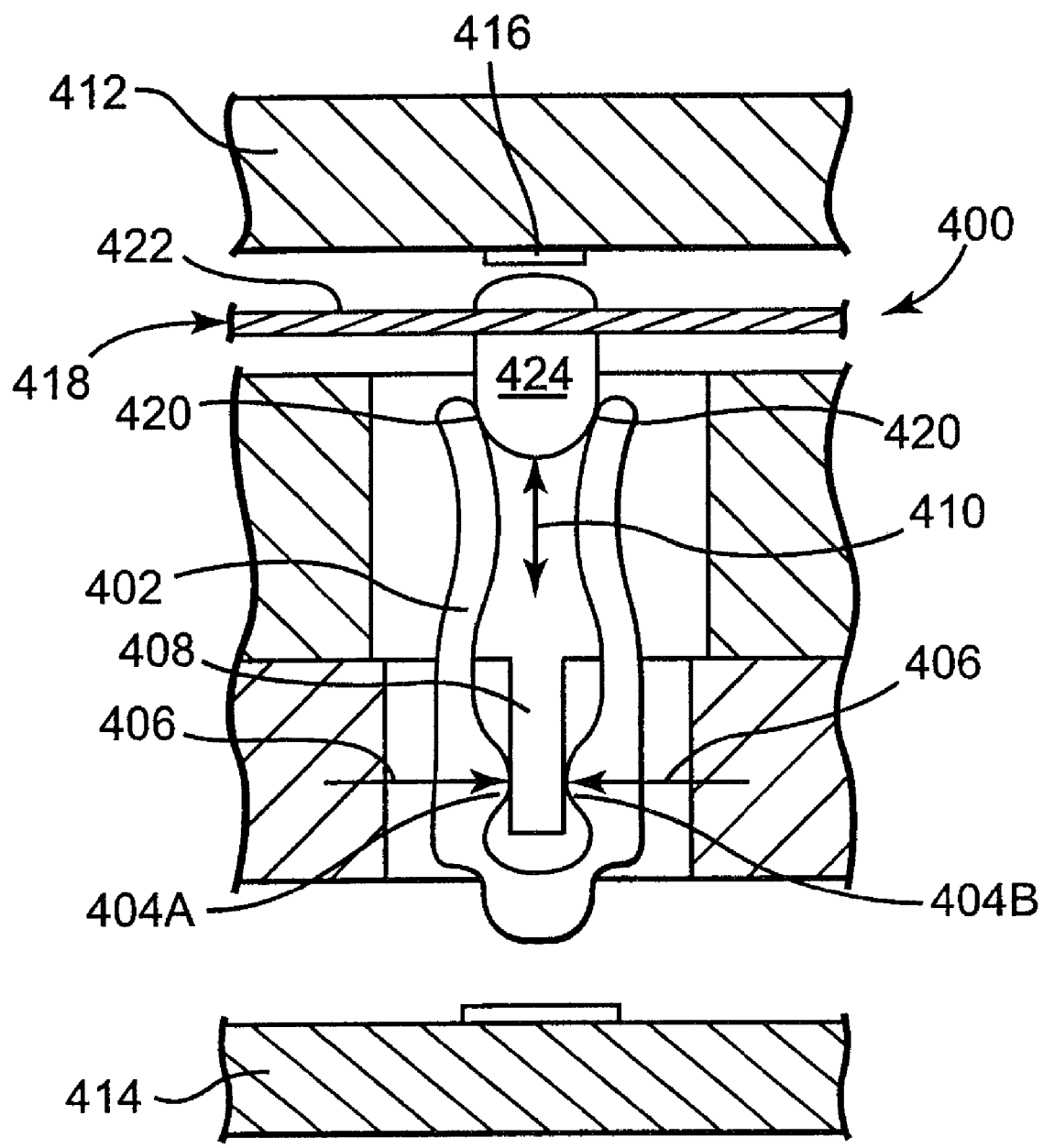
FIG. 14 is a side sectional view of an alternate interconnect assembly that permits extensive axial displacement of a contact member in accordance with the present invention.

FIG. 14 illustrates an alternate interconnect assembly 400 in accordance with the present invention. Contact members 402 are configured generally as illustrated in FIG. 11. The opposing protrusions 404A, 404B apply a compressive force 406 on the center member 408. In the embodiment illustrated FIG. 14, however, the center member 408 does not constraint movement of the contract member 402 along axis 410. Rather, the contact member 402 can slide along the axis 410 in order to achieve the optimum position for coupling the first circuit member 412 to the second circuit member 414.

In the illustrated embodiment, the first circuit member 412 is an LGA device with a plurality of terminals 416. Intermediate contacts set 418 provides an interface between the terminal 416 and the first interface portions 420 of the contact member 402. The intermediate contact set 418 includes a carrier 422 with a plurality of conductive members 424. In the illustrated embodiment, the lower portion of the conductive members 424 simulate a BGA device adapted to couple with the first interface portions 420. The upper portion of the conductive member 424 is adapted to couple with the contact pad 416 on the first circuit member 412. The carrier 422 can be flexible or rigid. In the preferred embodiment, the carrier 422 is a flexible circuit member with circuit traces that carry power, signals, and/or provides a ground plane for the first and second circuit members 412, 414.

Figure 15:
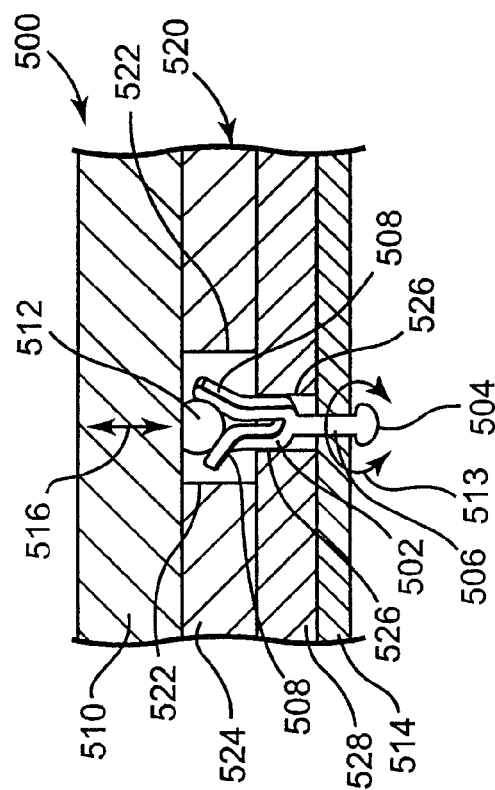
FIG. 15 is a side sectional view of an alternate interconnect assembly in accordance with the present invention.

FIG. 15 is a cross sectional view of an alternate interconnect assembly 500 in accordance with the present invention. Contact member 502 includes an enlarged second interface portion 504, with a narrow engagement region 506 located between the second interface portion 504 and the beams 508. In the illustrated embodiment, the first circuit member 510 is a BGA device with a solder ball 512 compressive coupled with the beams 508.

The length of the engagement region 506 relative to the thickness of the contact coupling layer 514 permits the contact member 502 to float within the housing 520 along the axis 516. Sidewalls 522 of the stabilizing layer 524 and the sidewalls 526 of the contact alignment layer 528 limit lateral displacement of the beams 508.

Figure 16A:
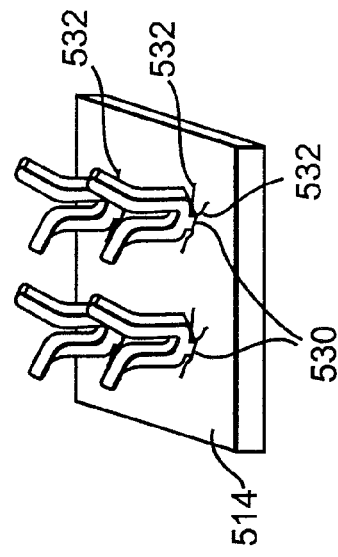
FIGS. 16A-16C illustrate one method of constructing the interconnect assembly of FIG. 15.
Figure 16C:
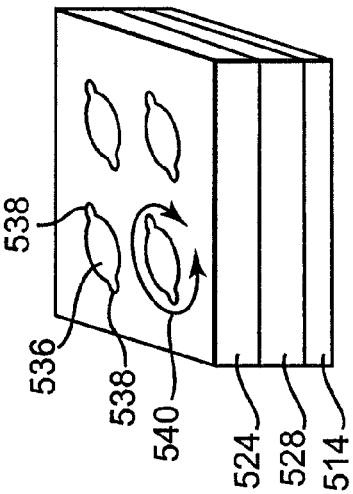
Figure 16B:
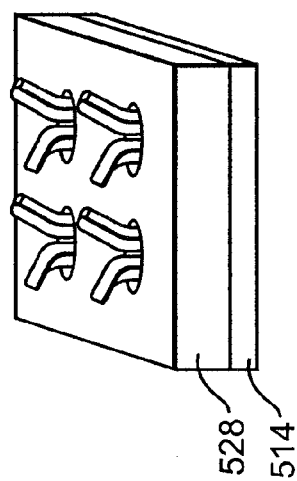

FIGS. 16A through 16C illustrate one method for constructing the connection 500 of FIG. 15. As illustrated in FIG. 16A, the contact coupling layer 514 includes a series of through openings 530 surrounded by a plurality of adjacent slits 532. The second interface portions 504 of the contact members 502 are inserted into the through openings 530. The contact coupling layer 514 deforms elastically, due in part to the slits 532, to permit the second interface portion 504 to pass through the through opening 530. The elastic deformation of the contact coupling layer 514 creates a snap-fit relationship with the contact members 502. Depending upon the configuration of the slits 532, the contact member 502 may have some rotational freedom 513 (see FIG. 15) around the engagement region 506. Consequently, the connector 500 can be designed with contact members 502 having one or two degrees of freedom.

FIG. 16B illustrates installation of a contact alignment layer 528. The contact alignment layer 528 is typically a separate and discreet structure that is bonded to the contact coupling layer 514.

FIG. 16C illustrates installation of the stabilizing layer 524. In the illustrated embodiment, the stabilizing layer 524 includes a plurality of through openings 536 adapted to receive the solder balls 512 on a BGA device 510. The through openings 536 can optionally include a pair of opposing recesses 538 into which the beams 508 of the contact member 502 can deflect. The recesses 538 also limits rotation of the contact member 502 in the direction 540 within the housing 520.

FIGS. 17A-17D illustrate various aspects of an alternate interconnect assembly 800 in accordance with the present invention. Contact members 804 are slidingly engaged with center members 812 on contact coupling layer 806. In one embodiment, the contact member 804 form a friction fit with the center member 812. In another embodiment, dielectric layers 816, 818 are positioned above and below the center member 812 to trap or retain the contact members 804 on the interconnect assembly 800. The contact members 804 are optionally crimped to the contact coupling layer 806. Alternatively, the contact members 804 are attached to the center member 812 using a variety of techniques, such as thermal or ultrasonic bonding, adhesives, mechanical attachment, and the like.

Upper and lower dielectric layers 816, 818 prevent shorting and rollover of the contact members 804 during compression. An additional circuitry plane 820 and dielectric covering layer 822 can optionally be added to the present interconnect assembly 800. In one embodiment, the contact coupling layer 806 includes a flexible circuit member. In the embodiment of FIGS. 17A-17D, the flexible circuit member is singulated prior to attachment to contact coupling layer 806.

Figure 17A:
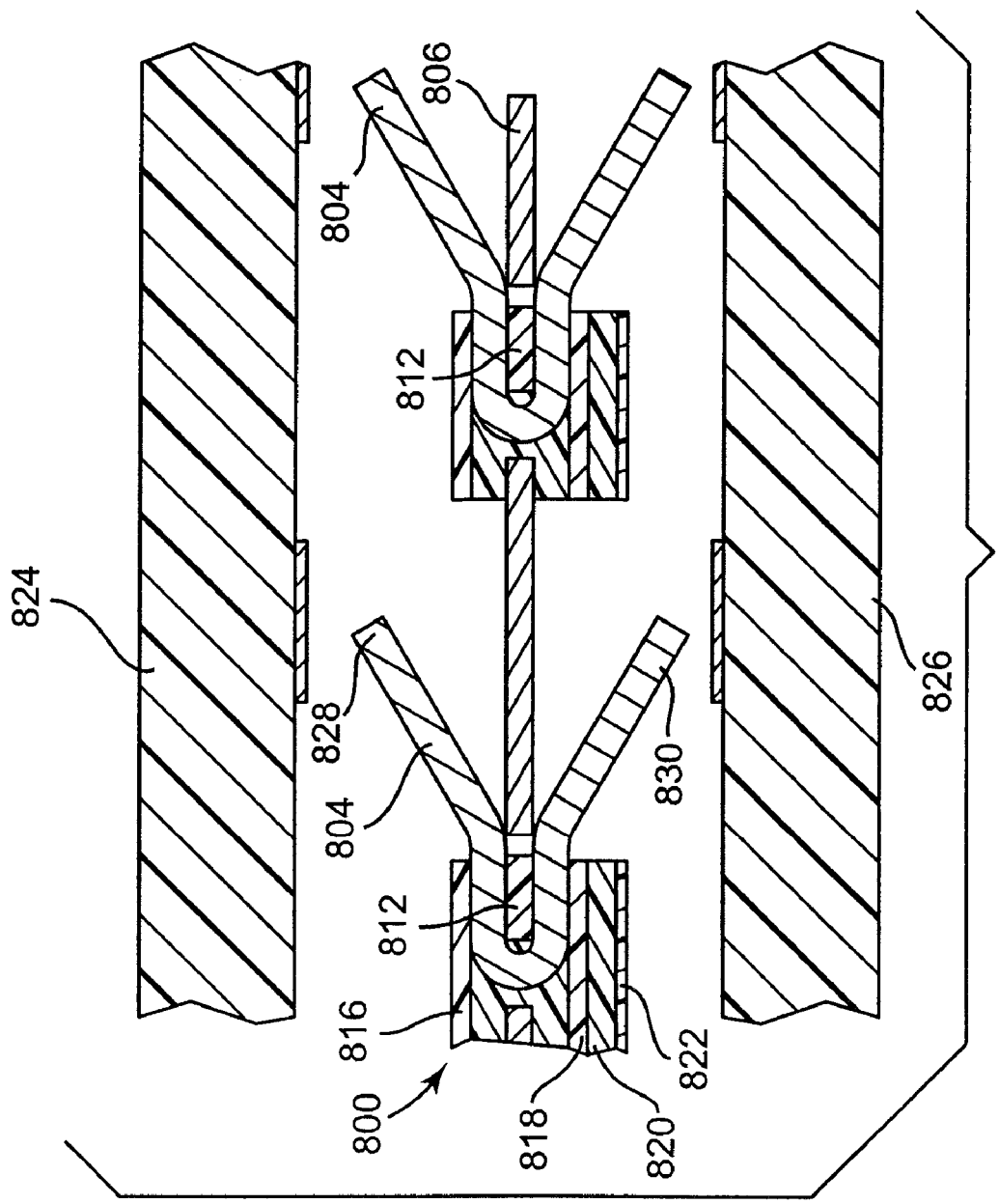
FIG. 17A illustrates an alternate interconnect assembly with an additional circuitry plane in accordance with the present invention.
Figure 17B:
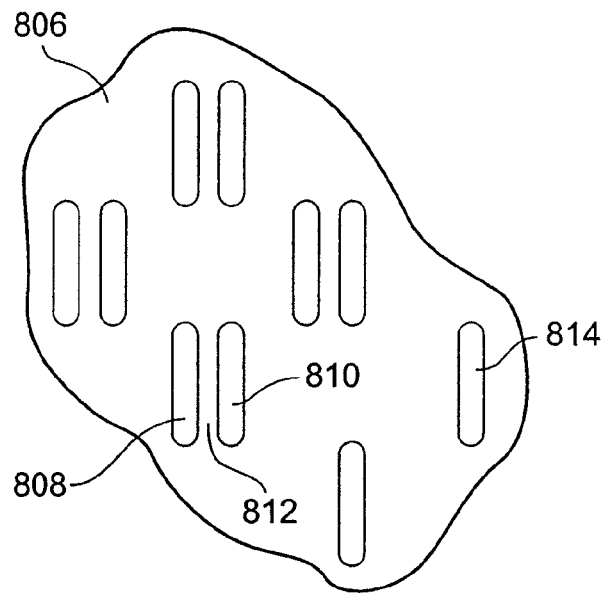
FIG. 17B illustrates the contact coupling layer of FIG. 17A.

As illustrated in FIG. 17B, the contact coupling layer 806 includes pairs of adjacent slots 808, 810. The center portion 812 of the contact coupling layer 806 between the slots 808, 810 acts as a torsion bar. Contact members 804 are inserted though the slots 808 and positioned on the center portion 812. Alternatively, the compliant members 804 can be coupled to the contact coupling layer 806 through single slot 814.

Figure 17C:
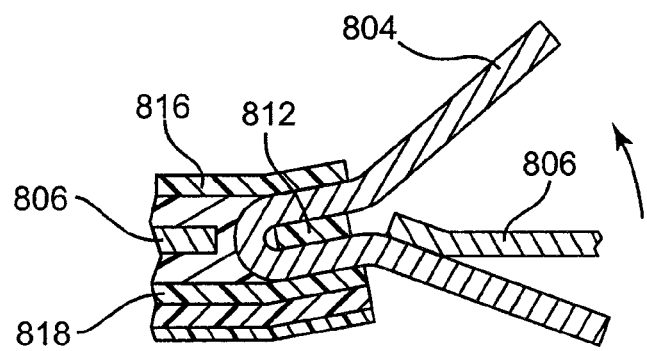
FIGS. 17C-17D illustrate operation of the interconnect assembly of FIG. 17A.
Figure 17D:
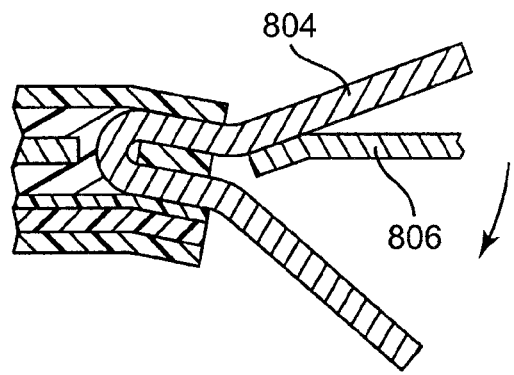

As best illustrated in FIGS. 17C and 17D, the center portion 812 twists and/or deforms to permit the contact members 804 to compensate for non-planarity in the first and second circuit members 824, 826 (see FIG. 17A). Distal ends 828, 830 of the contact members 804 also flex when compressed by the first and second circuit members 824, 826. The amount of displacement and the resistance to displacement can be adjusted by changing the size and shape of the center portion 812 on the carrier 806, the size and shape of the distal ends 828, 830 (see FIG. 17A) of the contact members 804, and/or by constructing the carrier 806 from a more rigid or less rigid material that resists displacement of the compliant members 804.

Figure 18:
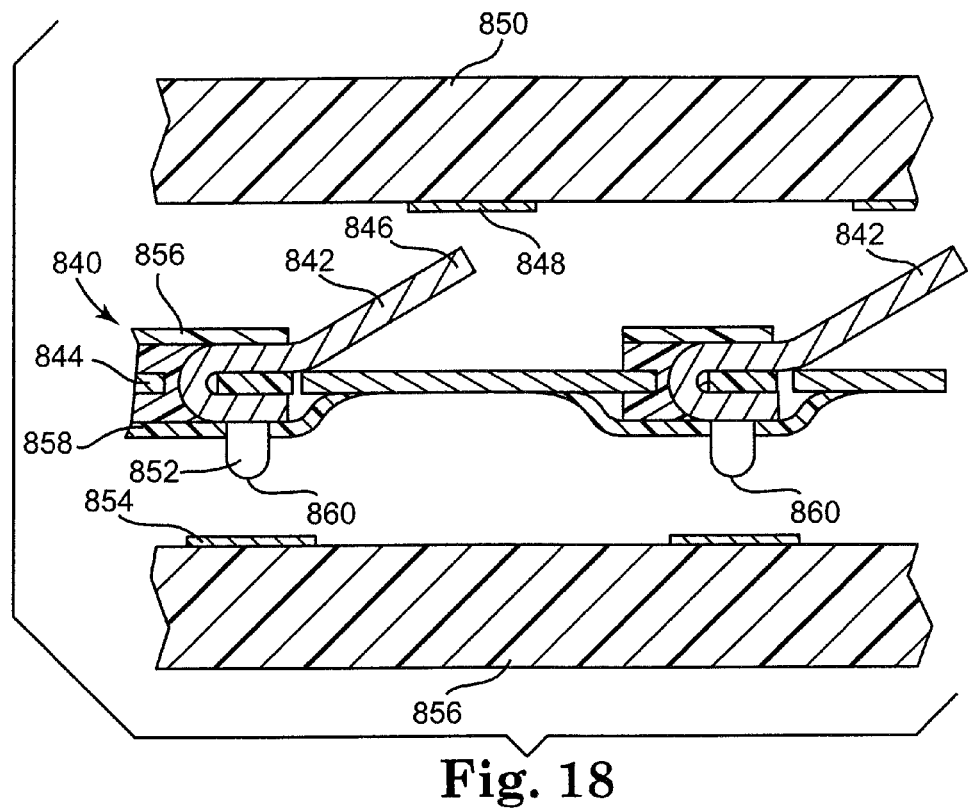
FIG. 18 illustrates an alternate interconnect assembly with a sealing layer in accordance with the present invention.

FIG. 18 illustrates an interconnect assembly 840 that is a variation of the interconnect assembly 800 of FIGS. 17A-17D. The interconnect assembly 840 includes a plurality of discrete contact members 842 coupled to the contact coupling layer 844 as discussed above. Distal end 846 is positioned to electrically couple with terminal 848 on first circuit member 850. Solder ball 852 replaces the distal end 830 in FIG. 17A. The solder ball 852 is positioned to electrically couple with terminal 854 on second circuit member 856.

In one embodiment, dielectric layer 856 and/or the dielectric layer 858 preferably form a seal between the contact members 842 and the contact coupling layers 844. The dielectric layers 856, 858 are optionally a sealing material that flows around the contact members 842 to seal any gaps. The sealing material is preferably a flowable polymeric material that cures to form a non-brittle seal. A solder mask material can optionally be used as the sealing material. In one embodiment, distal ends 860 and/or the 846 are planarized to remove any accumulated sealing material 856, 858. The sealing material prevents solder from wicking past the contact coupling layer 844. In one embodiment, the sealing material 856, 858 helps to retain the contact member 842 coupled to the contact coupling layer 844.

Figure 19:
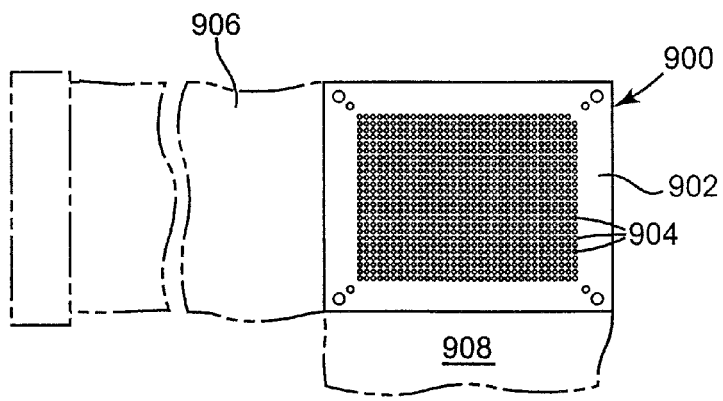
FIG. 19 is a top view of a interconnect assembly in accordance with the present invention.

FIG. 19 is a top view of an interconnect assembly 900 in accordance with the present invention. Any of the contact member configurations disclosed herein can be used with the interconnect assembly 900. Housing 902 includes an array of holes 904 through which distal ends of the contact members are coupled with circuit members. Additional circuit planes are preferably ported from the side of the interconnect assembly 900, preferably by flexible circuit members 906, 908.

Figure 20:
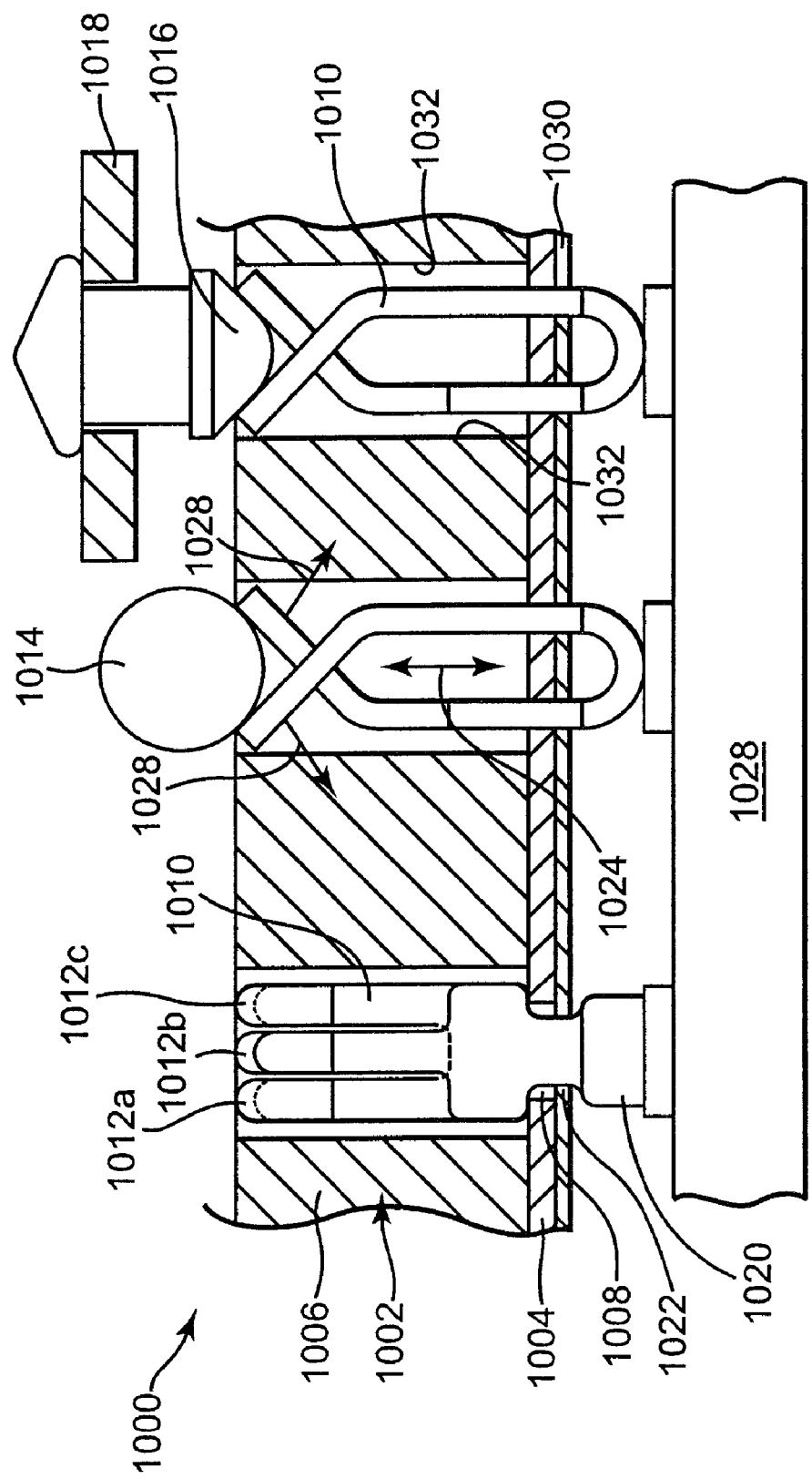
FIG. 20 is a side sectional view of an alternate interconnect assembly in accordance with the present invention.

FIG. 20 is a side sectional view of an alternate interconnect assembly 1000 in accordance with the present invention. Housing 1002 includes a contact coupling layer 1004 and a stabilizing layer 1006. The contact coupling layer 1004 includes through openings 1008 adapted to couple with contact members 1010.

Contact members 1010 include three beams 1012a, 1012b, 1012c (referred to collectively as "1012") adapted to electrically couple with solder ball 1014 (see e.g., FIG. 11), such as found on a BGA device, or conductive member 1016 on intermediate contact set 1018 (see e.g., FIG. 14). The left most contact member 1010 is oriented 90° relative to the contact members so as to better illustrate the configuration of the beams 1012.

The proximal ends 1020 of the contact members 1010 include a narrow region 1022 that forms a snap fit relationship with the openings 1008 in the contact coupling layer 1004. The contact member 1010 can move along axis 1024 in order to achieve the optimum position for coupling the solder ball 1014 or the intermediate contact set 1018 on the first circuit member (not shown) and the second circuit member 1028. The beams 1012 flex in the directions 1028, limited by sidewalls 1032, to form an optimum electrical interface with the solder ball 1014 or conductive member 1016.

A sealing layer 1030, such as a solder mask film, or flowable sealing material, is optionally applied to the exposed surface of the contact coupling layer 1004. The sealing layer 1030 preferably seals the opening 1008 around the contact members 1010.

Figure 21:
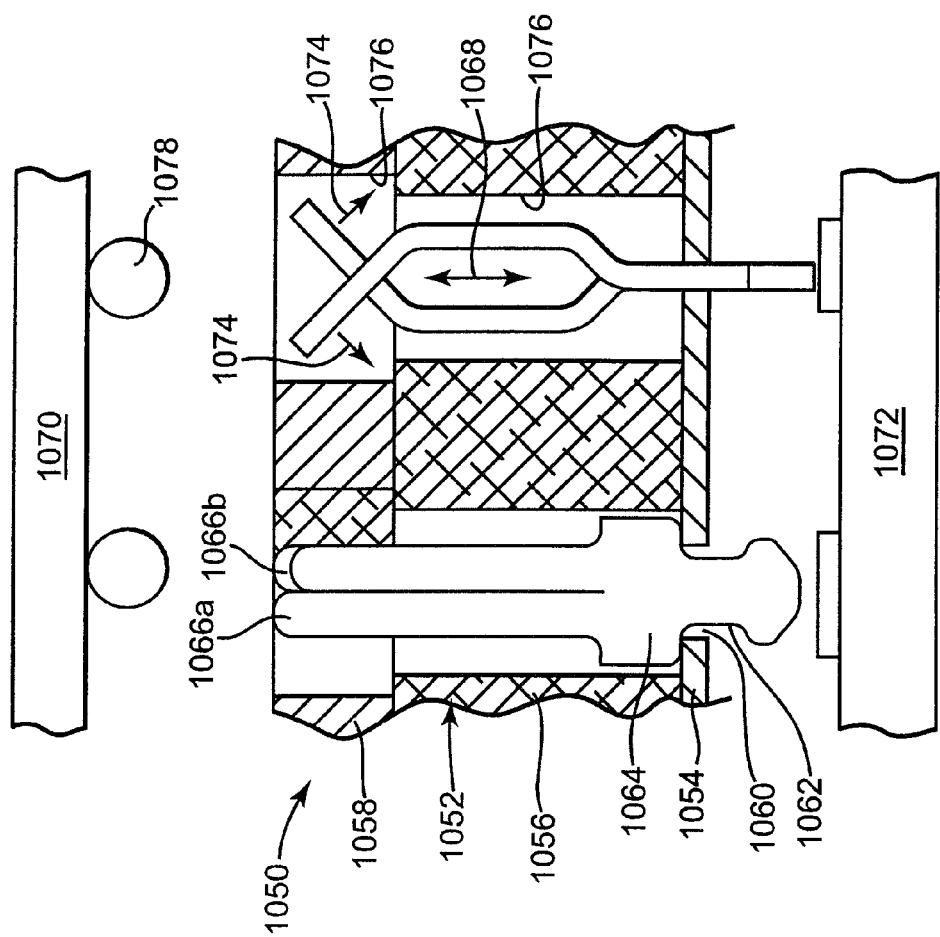
FIG. 21 is a side sectional view of an alternate interconnect assembly in accordance with the present invention.

FIG. 21 is a side sectional view of illustrates an alternate interconnect assembly 1050 in accordance with the present invention. Housing 1052 includes a contact coupling layer 1054, an alignment layer 1056, and a stabilizing layer 1058. The contact coupling layer 1054 includes through openings 1060 that form snap fit relationships with narrow regions 1062 on the contact members 1064.

Contact members 1064 include two beams 1066a, 1066b (referred to collectively as "1066") adapted to electrically couple with BGA device or conductive members on intermediate contact set (see e.g., FIG. 14). The left most contact member 1064 is oriented 90° relative to the other contact member so as to better illustrate the configuration of the beams 1066.

The contact member 1064 can move along axis 1068 in order to achieve the optimum positioning relative to the circuit members 1070, 1072. The beams 1066 flex in the directions 1074, limited by sidewalls 1076, to form an optimum electrical interface with solder balls 1078.

Figure 22:
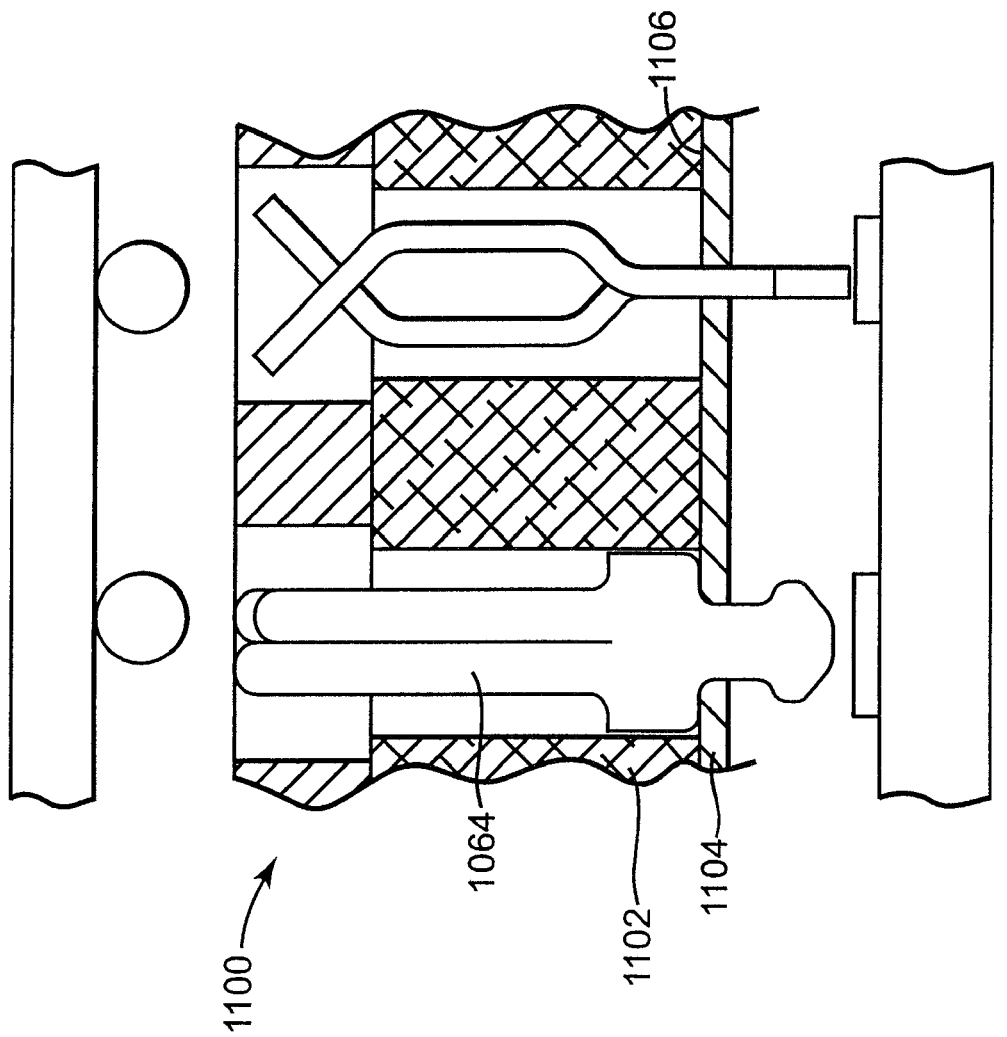
FIG. 22 is a side sectional view of an alternate interconnect assembly in accordance with the present invention.

FIG. 22 is a side sectional view of illustrates an alternate interconnect assembly 1100 substantially as shown in FIG. 21, except that the contact members 1064 are interlocked with the housing 1102. Sealing layer 1104 is optionally applied to the surface 1106 of the housing 1102. The sealing layer 1104 can assist in retaining the contact members 1064 in the housing 1102 and/or prevent solder from wicking along the contact members 1064. In one embodiment, the sealing layer 1104 is a solder mask film applied to the housing 1102 before the contact members 1064 are inserted.

Figure 23:
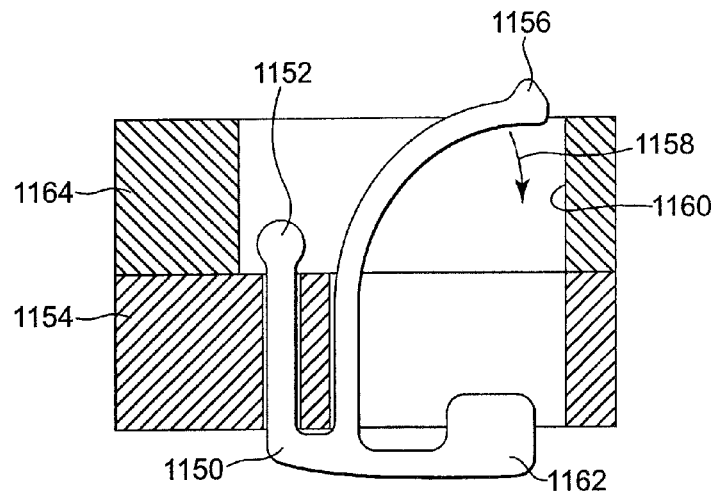
FIGS. 23-27 are side sectional views of alternate connector members in accordance with the present invention.

FIG. 23 illustrates an alternate connector member 1150 in accordance with the present invention. Snap-fit feature 1152 interlocks with housing 1154. Distal end 1156 flexes in direction 1158, limited by sidewall 1160 on spacer 1164. Alignment feature 1162 engages with the housing 1154 to keep the contact member 1150 oriented relative to the circuit members (not shown).

Figure 24:
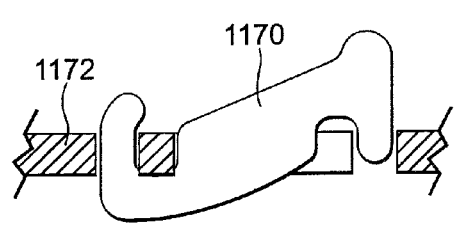
Figure 25:
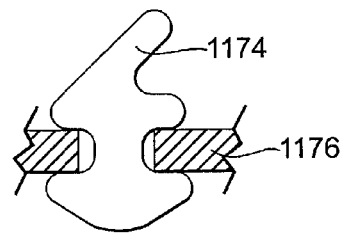
Figure 26:
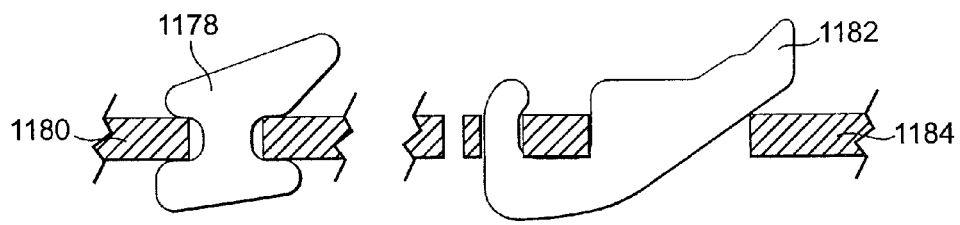
Figure 27:
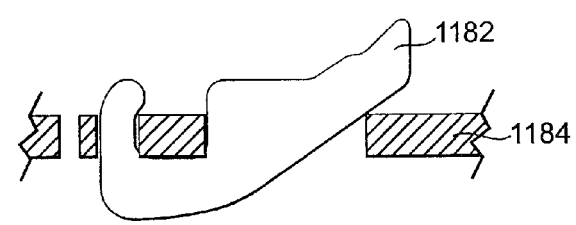

FIG. 24 illustrates alternate connector member 1170 interlocked with a contact coupling layer 1172. FIG. 25 illustrates connector member 1174 interlocked with contact coupling layer 1176. FIG. 26 illustrates connector member 1178 interlocked with contact coupling layer 1180. FIG. 27 illustrates connector member 1182 interlocked with contact coupling layer 1184. The connector members of FIGS. 23-27 can be used in a variety of the embodiments disclosed herein.

Figure 28:
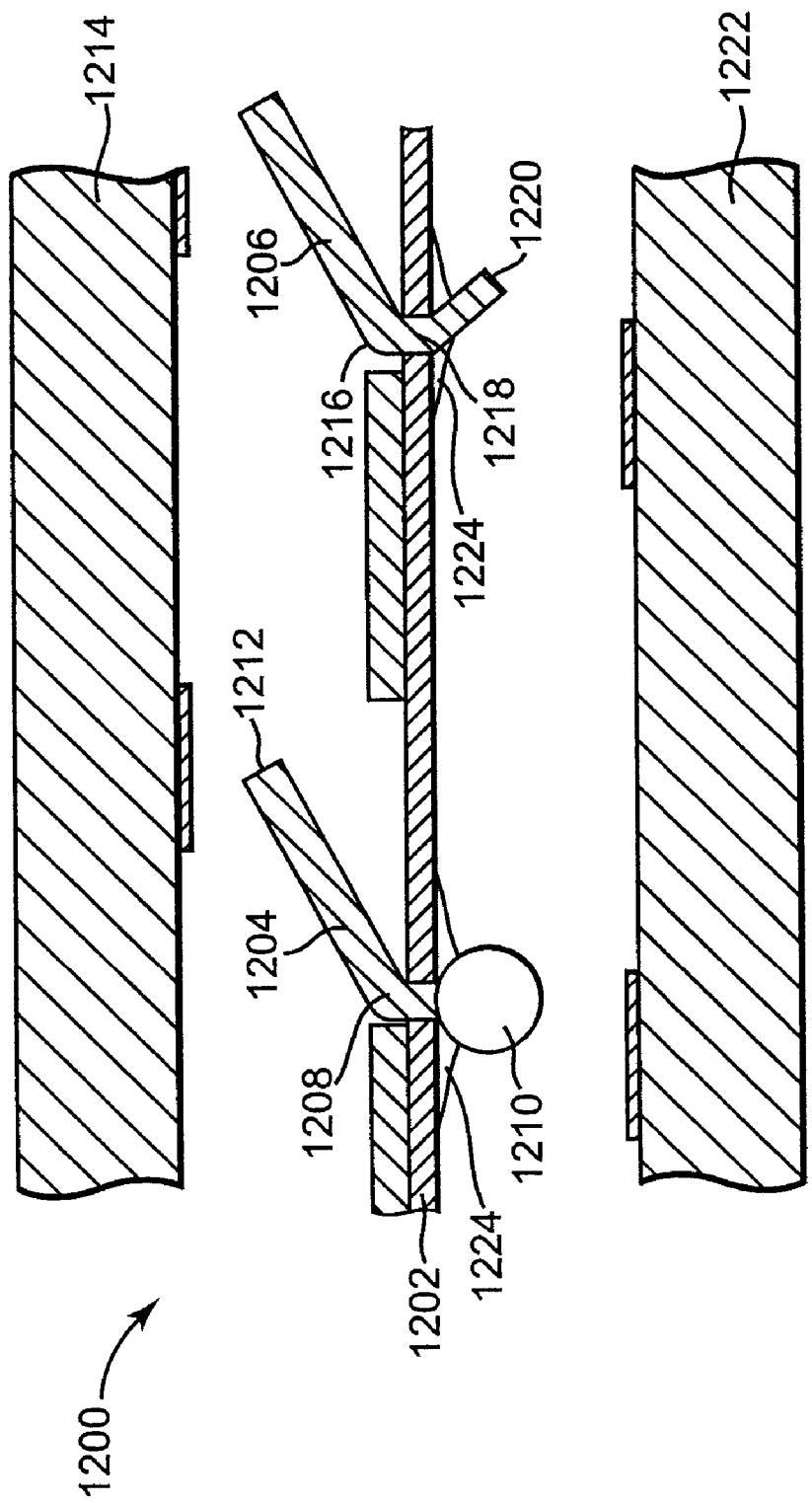
FIG. 28 is a side sectional view of an alternate interconnect assembly in accordance with the present invention.

FIG. 28 illustrates an alternate interconnect assembly 1200 that is a variation of the interconnect assemblies of FIGS. 17A and 18. The interconnect assembly 1200 includes a contact coupling layer 1202 with a plurality of discrete contact members 1204, 1206 coupled thereto. Bend 1208 and solder ball 1210 help retain the contact member 1204 to the contact coupling layer 1202. The bend 1208 permits distal end 1212 to flex when coupled with the first circuit member 1214.

Contact member 1204 includes first and second bends 1216, 1218. The bend 1218 can form an angle of 0° to about 90° to lock the contact member 1206 in place, to reduce the over height of the interconnect assembly 1200 and to increase the pull-out strength or solder joint reliability. By forming the bend 1218 at an angle less than 90°, the proximal end 1220 can flex when compressively coupled with the second circuit member 1222.

The bends 1208, 1216, 1218 can be used alone or in combination with a snap fit coupling with the contact coupling layer 1206. In one embodiment, sealing material 1224 is applied to one or both sides of the contact coupling layer 1202 to prevent solder, such as solder ball 1210, from wicking along the contact members 1204, 1206.

Figure 29:
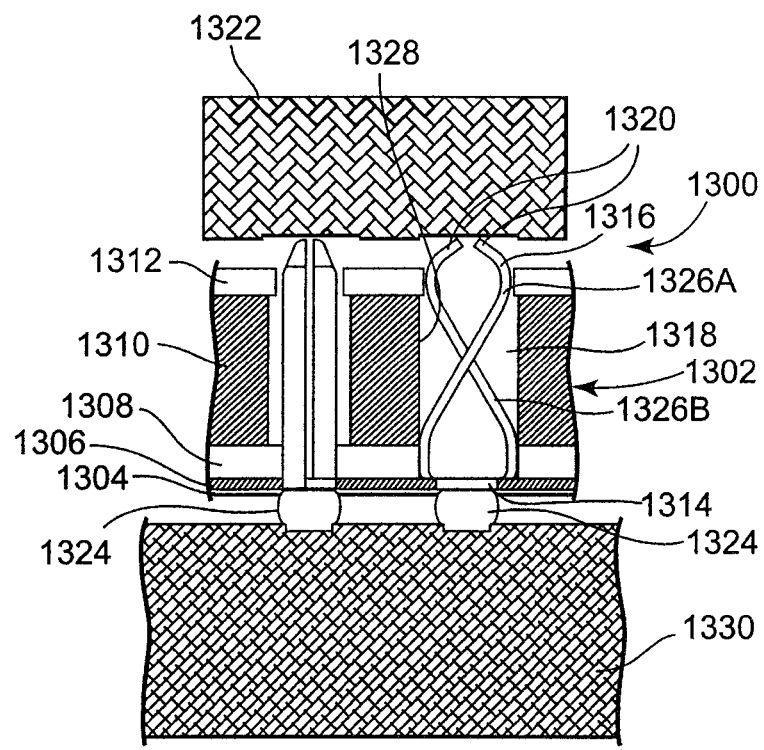
FIG. 29 is a side sectional view of an interconnect assembly in accordance with the present invention.

FIG. 29 illustrates an interconnect assembly 1300 in accordance with the present invention. In the embodiment of FIG. 29, housing 1302 includes a sealing layer 1304, an optional leveling layer 1306, contact coupling layer 1308, a spacer or stiffening layer 1310, and an alignment or protective layer 1312. In the illustrated embodiment, one or more of the layers 1302, 1304, 1306, 1308, 1310 and 1312 are laminated using a variety of techniques, such as thermal or ultrasonic bonding, adhesives, and the like.

The sealing layer 1304 is optionally a solder mask film or a solder mask liquid that is at least partially cured before insertion of contact members 1316. Alternatively, the sealing layer can be a flowable/curable polymeric material.

The contact coupling layer 1308 includes at least one openings 1314 adapted to receive the contact members 1316. The contact members 1316 typically form a press-fit, snap-fit or interengaged relationship with the contact coupling layer 1308. Alternatively, the contact members 1316 are coupled to the housing 1302 using one or more of a compressive force, solder, a wedge bond, a conductive adhesive, an ultrasonic or thermal bond, or a wire bond. The contact members 1316 preferably forms a sealing relationship with the sealing layer 1304 to prevent the solder 1324 from wicking along the contact members 1316 during bonding with the second circuit member 1330.

In the illustrated embodiment, the alignment layer 1312 and the sealing layer 1304 extend over the stiffening layer 1310 to form a non-moldable cavity 1318. The cavity 1318 provides a region for the contact member 1316 to expand without limiting flexure of beams 1326A, 1326B. The beams 1326A, 1326B of the contact members 1316 flex outward toward the surfaces 1328 during compression. The alignment layer 1312 positions distal ends 1320 of the contact member 1316 in the desired location to electrically couple with the first circuit member 1322.

To assemble the present interconnect assembly 1300, distal ends 1320 of the contact members 1316 are inserted through the openings 1314 until engagement with the contact coupling layer 1308 is achieved. The contact members 1316 are electrically coupled to first and second circuit members 1322, 1330 using solder, a compressive force, or a combination thereof. The configuration of the distal ends 1320 are particularly well suited for engagement with an LGA device, such as the first circuit member 1322. The contact member 1316 can be configured to electrically couple with a wide variety of circuit members 1322, 1330, including for example a flexible circuit, a ribbon connector, a cable, a printed circuit board, a ball grid array (BGA), a land grid array (LGA), a plastic leaded chip carrier (PLCC), a pin grid array (PGA), a small outline integrated circuit (SOIC), a dual in-line package (DIP), a quad flat package (QFP), a leadless chip carrier (LCC), a chip scale package (CSP), or packaged or unpackaged integrated circuits.

Figure 30:
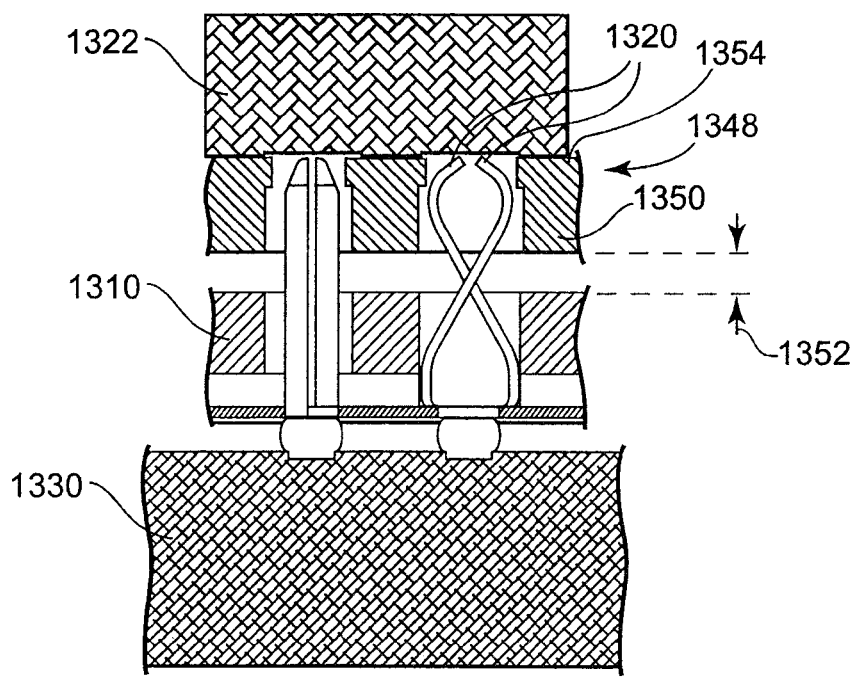
FIG. 30 is a side sectional view of an interconnect assembly with a two-part housing in accordance with the present invention.

FIG. 30 is an interconnect assembly 1348 that is a variation of FIG. 29. In the embodiment of FIG. 30, the alignment layer 1312 is replaced by a stripper plate 1350. The stripper plate 1350 is biased away from the stiffening layer 1310, such as by springs 1311, so that the distal ends 1320 of the contact members 1316 are generally protected prior to use. The distal ends 1320 are preferably flush with, or below, the surface 1354 of the stripper plate 1350. The size of gap 1352 depends on the size of the contact members 1316. When a compressive force is applied between the first and second circuit members 1322, 1330, the stripper plate 1350 is displaced toward the stiffening layer 1310 to expose the distal ends 1320 of the contact members 1316. Alternatively, the stripper plate 1350 is displaced toward the stiffening layer 1310 to expose the distal ends 1320. The stripper plate 1350 can be displaced prior to, during, or after the second circuit member 1330 is positioned for engagement with the contact members 1316.

Figure 31:
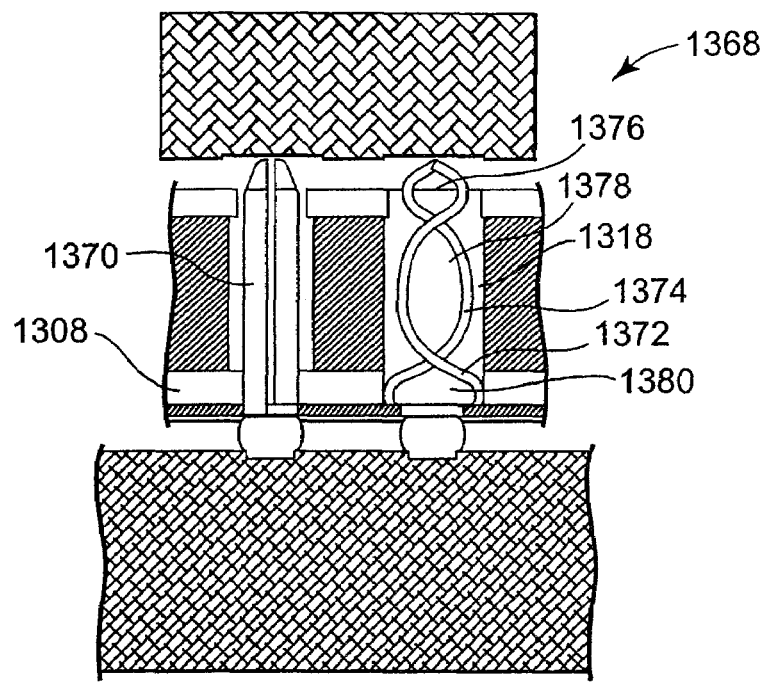
FIG. 31 is a side sectional view of an interconnect assembly in accordance with the present invention.

FIG. 31 illustrates an interconnect assembly 1368 that is a variation of FIG. 29. In the embodiment of FIG. 31, the contact members 1370 include a pair of beams 1372, 1374 forming loops 1376, 1378, 1380. The loop 1376 forms a press-fit relationship with the contact coupling layer 1308. The loops 1378 and 1380 expand within the cavity 1318, as discussed above. The beams 1372, 1374 may or may not contact each other where they overlap to form the loops 1376, 1378, 1380. Consequently, a contact member includes a loop if the conductive material forms a closed shape as viewed from at least one plane.

Figure 32:
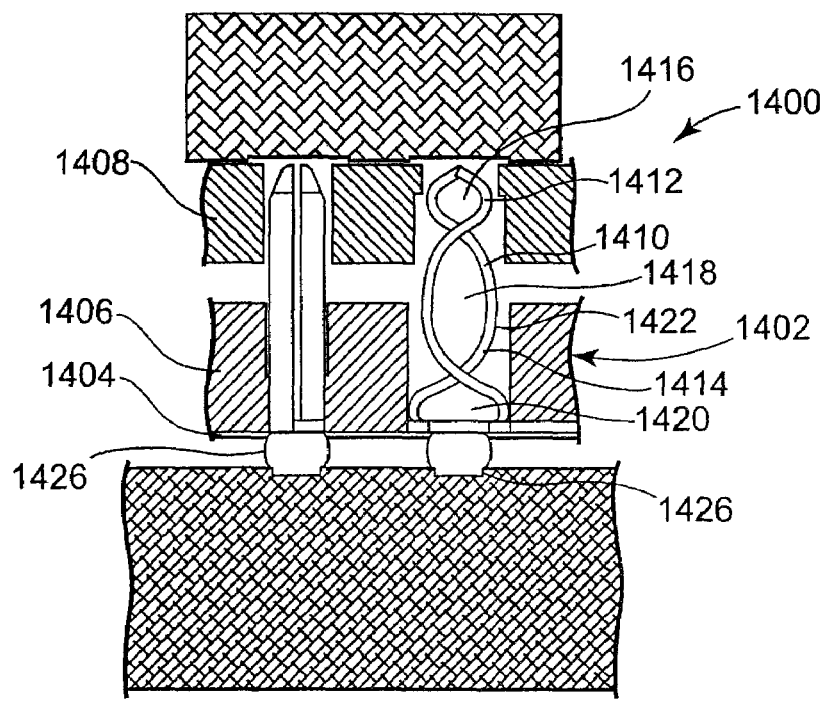
FIG. 32 is a side sectional view of an interconnect assembly with a two-part housing in accordance with the present invention.

FIG. 32 illustrates an interconnect assembly 1400 in accordance with the present invention. In the embodiment of FIG. 32, housing 1402 includes a sealing layer 1404, a contact coupling layer 1406, and a stripper plate 1408, such as discussed in connection with FIG. 30. The contact members 1410 include a pair of beams 1412, 1414 forming loops 1416, 1418, 1420. The loop 1420 forms a press-fit relationship with the contact coupling layer 1406. The sealing layer 1404 minimizes or eliminates the migration of solder 1426 into cavity 1422. The loops 1418 and 1420 expand within the cavity 1422 as the stripper plate 1408 is advanced toward the contact coupling layer 1406.

Figure 33:
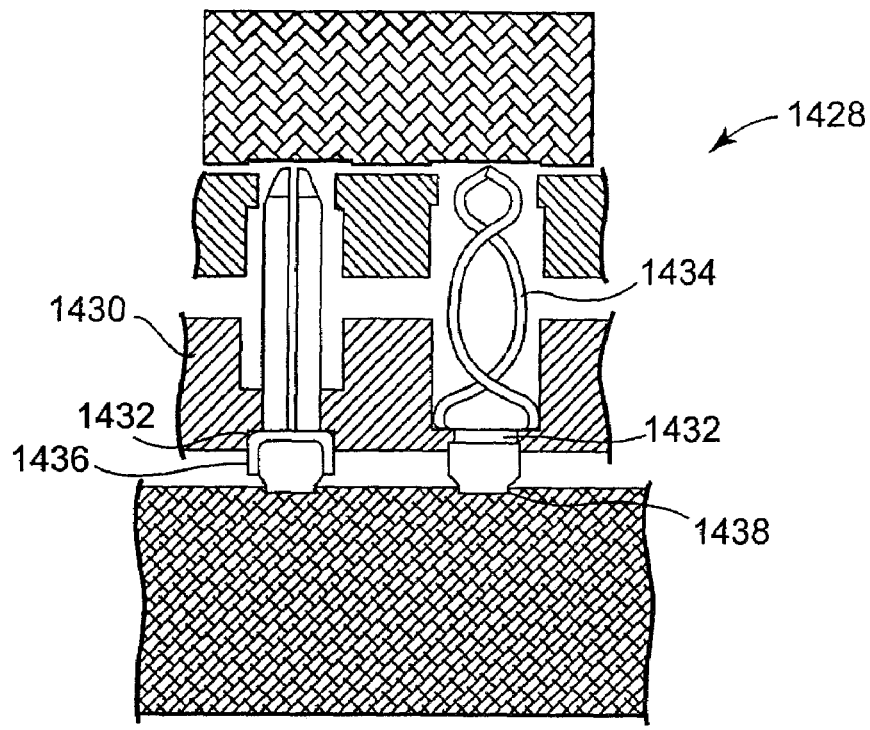
FIG. 33 is a side sectional view of an interconnect assembly with a two-part housing in accordance with the present invention.

FIG. 33 illustrates an interconnect assembly 1428 that is a variation of FIG. 32. Contact coupling layer 1430 includes recesses 1432 formed to receive contact members 1434. The contact members 1434 preferably include tabs 1436 formed to create a seal with the recesses 1432. A sealing layer can optionally be used to decrease the risk of solder 1438 wicking along the contact members 1434.

Figure 34:
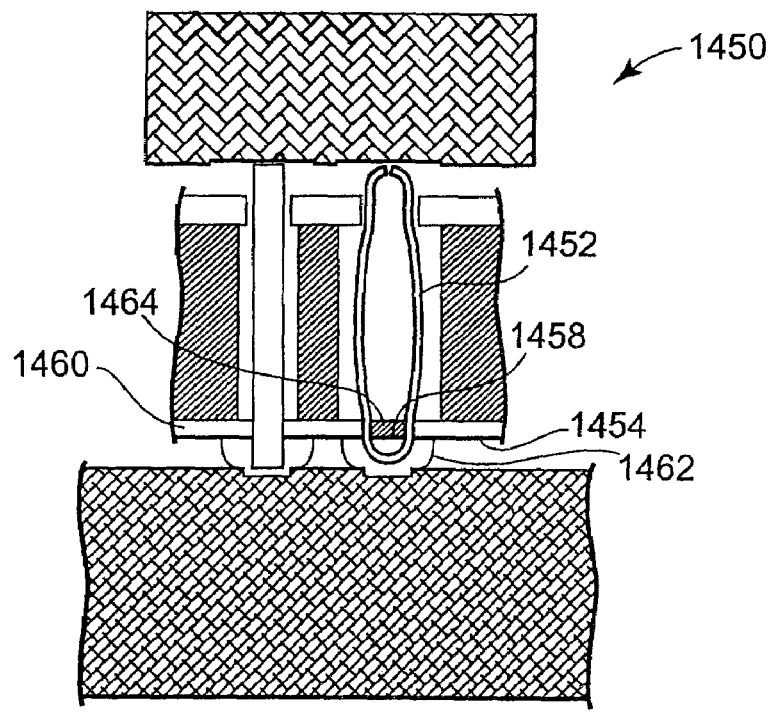
FIG. 34 is a side sectional view of an interconnect assembly in accordance with the present invention.

FIG. 34 illustrates an interconnect assembly 1450 in which a portion of contact members 1452 extend beyond surface 1454 of housing 1456. In the illustrated embodiment, the contact members 1452 form a loop 1458 that extends below the surface 1454 of the contact coupling layer 1460. Solder 1462 flows into the loop 1458 during reflow to form a stronger joint. Sealing material 1464 is optionally deposited at the interface between the contact members 1452 and the contact coupling layer 1460 to prevent solder wicking. The embodiment of FIG. 34 can optionally be a split constructed, such as illustrated in FIGS. 30, 32 and 33.

Figure 35:
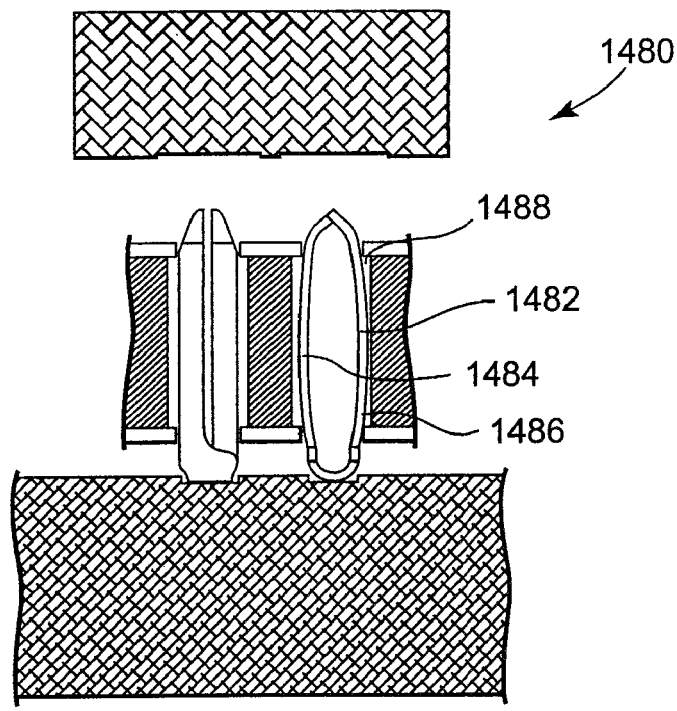
FIG. 35 is a side sectional view of an interconnect assembly in accordance with the present invention.

FIG. 35 illustrates an interconnect assembly 1480 in which beams 1482, 1484 of contact members 1486 bow outward. The resiliency of the beams 1482, 1484 retains the contact members 1486 in non-moldable cavities 1488. In one embodiment, the contact members 1486 form a snap-fit relationship with the cavities 1488.

Figure 36:
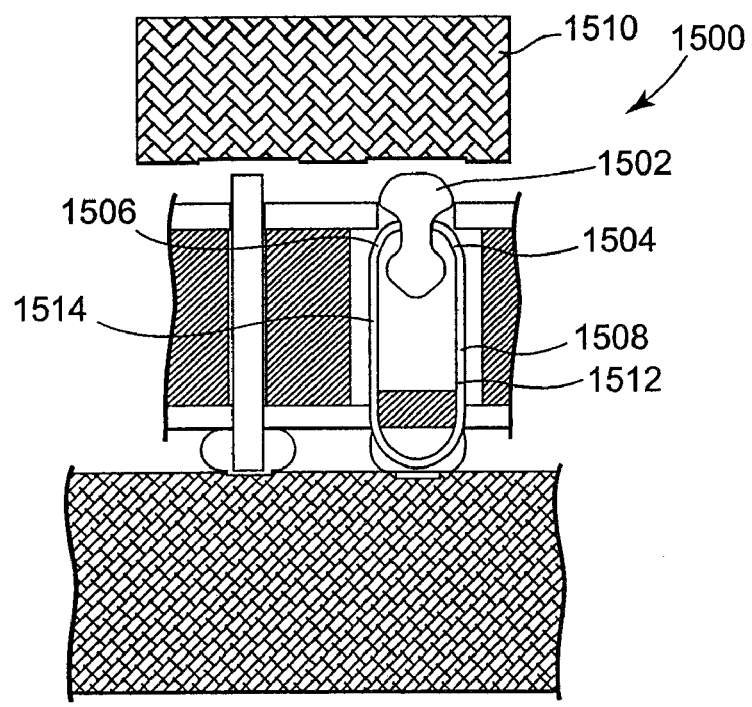
FIG. 36 is a side sectional view of an interconnect assembly with a two-part contact member in accordance with the present invention.

FIG. 36 illustrates an interconnect assembly 1500 with a secondary contact members 1502 that form a snap-fit interface with distal ends 1504, 1506 of contact members 1508. The secondary contact member 1502 and the contact member 1508 work together during actuation. When the first circuit member 1510 is pressed against the interconnect assembly 1500, the secondary contact member 1502 induces a bow in the beams 1512, 1514 of the contact member 1508.

FIG. 37A-37C illustrate a dual loop contact member 1600 with reversed, overlapping tips 1602, 1604. The overlapping tips 1602, 1604 are more resistant to damage from handling than single tip configurations. The tips 1602, 1604 overlap so that upon compression, beams 1606, 1608 bow outward in the direction 1610, but the tips 1602, 1604 remain in close proximity. In the preferred embodiment, the tips 1602, 1604 remain engaged during compression. In an alternate embodiment, the loop is completed by a circuit member electrically coupled to the tips, such as illustrated in FIG. 29.

In the illustrated embodiment, the beams 1606, 1608 are integrally formed with base portion 1612 from a continuous sheet material. The beams 1606, 1608 are bent relative to the base portion 1612 generally in direction 1614. Solder ball 1616 is preferably attached to the opposite side of the base portion 1612 from the beams 1606, 1608. The solder ball 1616 can be attached to the base portion 1612 using a variety of techniques, such as reflow of the solder ball 1616, conductive adhesives, compression bonding, mechanical interconnection, etc. The contact member 1600 can be constructed from a variety of conductive material, such as for example 0.002 inch thick, BeCu A390 sheeting.

The beams 1606, 1608 are preferably bent to create two or more loops 1607, 1609. The beams 1606, 1608 overlap at location 1611 to form the loop 1609. The beams 1606, 1608 may or may not contact each other at the location 1611. The contact member 1600 includes loops 1607, 1609 since the conductive material forms two closed shapes as viewed from the plane in FIG. 37A. The loops 1607, 1609 can be seen in FIG. 37A, but not 37B.

The tips 1602, 1604 optionally overlap as well. In one embodiment, the tips 1602, 1604 do not contact each other until engaged with another circuit member. In yet another embodiment, the additional circuit member completes the loop 1609 by electrically coupling the tips 1602, 1604. FIG. 29 illustrates contact members 1316 that can illustrate both of these embodiments, depending upon the degree of compression applied by the circuit members 1322, 1330.

FIG. 38A-38C illustrate an alternate dual loop contact member 1620 with modified overlapping tips 1622, 1624. FIGS. 39A-39C illustrate another dual loop contact member 1630 with reversed overlapping tips 1632, 1634. The contact members 1600, 1620, 1630 are particularly well suited for use with an LGA device and can be used in a variety of the interconnect assemblies disclosed herein.

FIG. 40A-40C illustrate a dual loop contact member 1650 with reversed, overlapping tips 1652, 1654 particularly well suited for use with BGA devices. Again, upon compression, beams 1656, 1658 bow outward in the direction 1660, but the tips 1652, 1654 remain in close proximity. FIGS. 41A-41C illustrate an alternate dual loop contact member 1670 with modified overlapping tips 1672, 1674.

FIG. 42 illustrates an alternate dual loop contact member 1700 with an alternate solder member attachment mechanism 1702 in accordance with the present invention. In the illustrated embodiment, the dual loop contact member 1700 is constructed so that beams 1704, 1706 and the base portion 1708 comprise different portions of a continuous sheet material formed as illustrated. A blank having the required shape is cut from the sheet material and the beams 1704, 1706 are bent to extend generally in direction 1710. Tabs 1716, 1718 are also preferably integrally formed with the base portion 1708 and are bent to extend generally in direction 1720. The tabs, 1716, 1718, the beams 1704, 1706 and the base portion 1708 preferably comprise different portions of a continuous sheet material bent as illustrated.

Tips 1712, 1714 are optionally overlapping. In the illustrated embodiment, the tabs 1716, 1718 are arranged in an opposing configuration to trap or compressively engage a solder member 1726 (see FIGS. 43A-43C).

In the illustrated embodiment, the directions 1710 and 1720 are generally opposite, although for some embodiments directions 1710, 1720 may form an acute angle. The tabs 1716, 1718 include one or more engagement features 1722, 1724 adapted to mechanically engage a solder member 1726. In the illustrated embodiment, the tabs 1716, 1718 engage the solder member 1726 on two sides.

In the illustrated embodiment, the solder member 1726 is a solder ball as that term is used and understood in the electronics art. The solder ball is generally spherical, but not precisely so and does not comport with the mathematical definition of a sphere.

As discussed herein, the engagement features of the present invention permit a solder member to be mechanically attached to a contact without reflowing the solder material. The mechanical engagement is preferably the only mechanism by which the solder member is attached to the contact. Alternatively, the engagement feature can facilitate bonding of melded solder to the tabs.

As best illustrated in FIGS. 43A-43C, the engagement features 1722, 1724 comprises cutouts 1723 with slots 1725, 1727 on the distal ends of the tabs 1716, 1718, respectively. The slots 1725, 1727 facilitate insertion of the solder member 1726 in the direction 1729 (see FIG. 43B).

The cutouts 1723 can be replaced with cutout of a variety of shaped, such as for example, oval, triangular, rectangular, hexagonal, and the like. By changing the size and the shape of the cutout 1723 and/or the size and the shape of the solder member 1726, the solder member 1726 can be permitted to move relative to the contact member 1700, while still being retained in the tabs 1716, 1718. A free-floating solder member 1726 increase the ability of the contact member 1700 to adapt to non-planarity of the circuit member 1772 (see FIG. 44).

The solder member 1726 has a generally spherical shape with a diameter 1728 that is slightly greater than spacing 1730 between the tabs 1716, 1718. In one embodiment, the tabs 1716, 1718 elastically deform to receive the solder member 1726. In the illustrated embodiment, a portion of the solder member 1726 is seated in the opposing engagement features 1722, 1724 in a snap-fit relationship. In an alternate embodiment, the solder member 1726 and/or the tabs 1716, 1718 are plastically deformed during or after mechanical engagement, such as for example by crimping the tabs 1716, 1718 to more securely fasting the solder member 1726 to the contact member 1700.

Figure 49:
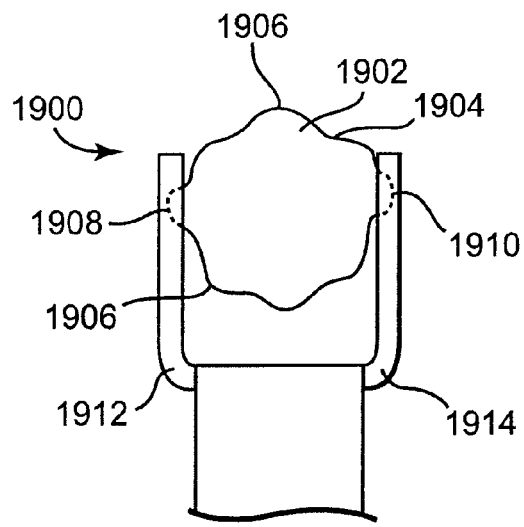
FIG. 49 is a side view of an alternate solder member attachment mechanism with a non-spherical solder member in accordance with the present invention.
Figure 50:
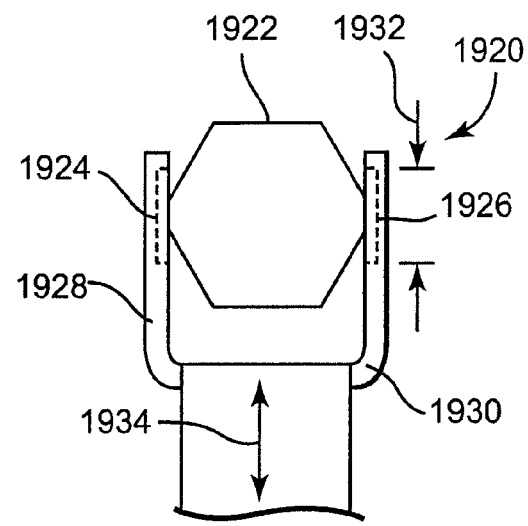
FIG. 50 is a side view of an alternate solder member attachment mechanism with a non-spherical solder member in accordance with the present invention.

In another embodiment, the solder member 1726 is plastically deformed, such as for example by coining, before engagement with the tabs 1716, 1718 (see e.g., FIGS. 49 and 50). The solder member 1726 may include one or more complementary features that mechanically engage with the solder member attachment mechanism 1702. For example, a series of protrusion can be formed in the surface of the solder member 1726. By arranging the number, size and spacing of the protrusions, it is possible to increase the likelihood that a protrusion will engage with an engagement feature on the tabs.

Solder mask 1732 is optionally located on one or both sides of the base portion 1708. The solder mask 1732 can optionally be applied before or after the solder member 1726 is mechanically engaged with the tabs 1716, 1718.

Figure 44A:
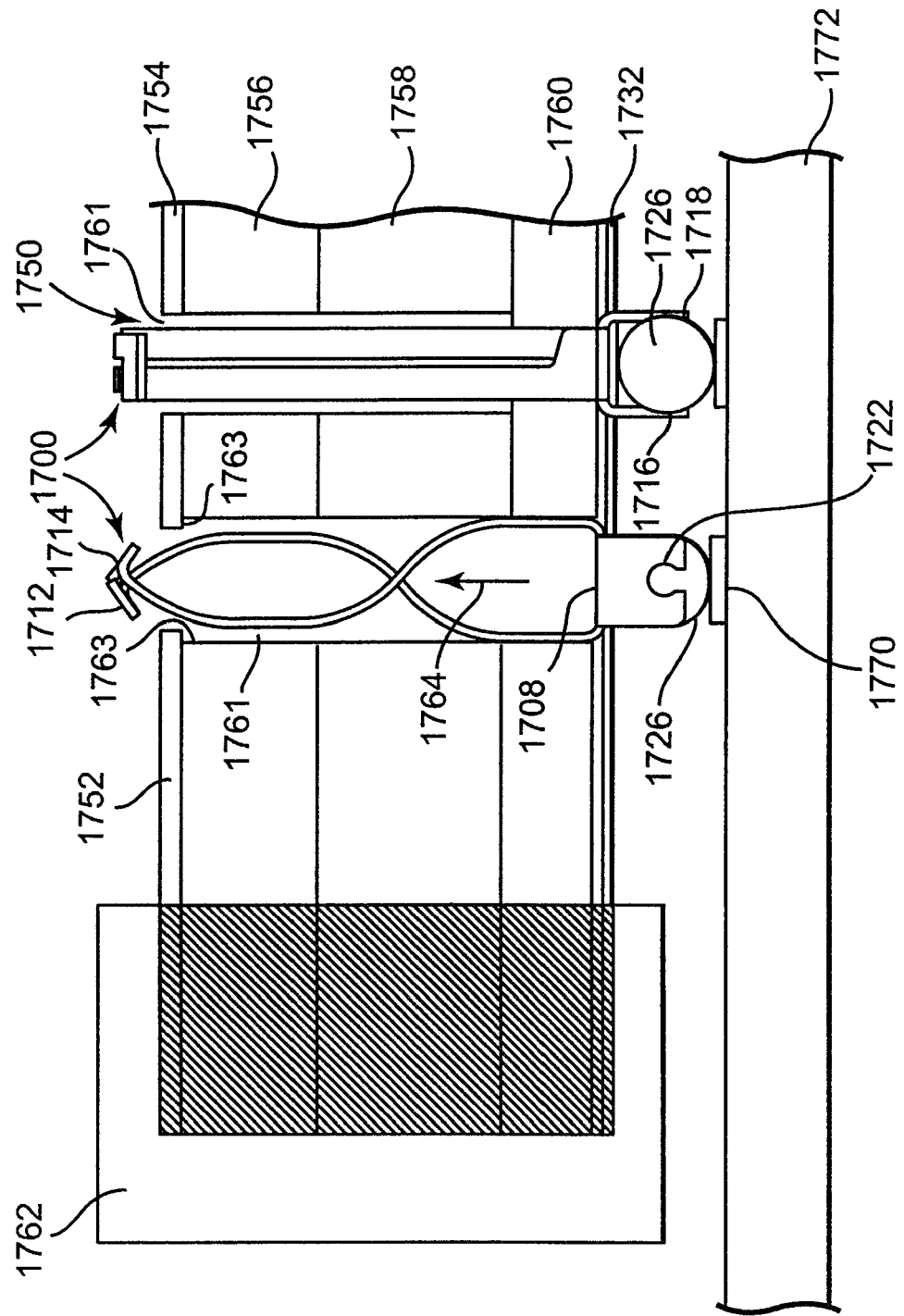
FIG. 44A is a side sectional view of an interconnect assembly using the dual loop connector member of FIG. 42 in accordance with the present invention.

FIG. 44A illustrates an interconnect assembly 1750 incorporating the dual loop contact members 1700 of FIGS. 42-43. Housing 1752 preferably includes multiple layers 1754, 1756, 1758, 1760 (insulators and/or conductors), which are over-molded to hold the layers together. One or more of the layers 1754, 1756, 1758, 1760 can be circuit members. Each layer 1754, 1756, 1758, 1760 is placed in the proper stack in the form of a sheet (individual or multiple connector patterns per sheet) or in a reel to reel or roll fed process.

The layers 1754, 1756, 1758, 1760 are aligned with respect to each other, and fed into a molding operation which preferably molds a frame or retainer ring 1762 onto the housing 1752. The retainer ring 1762 is a frame that extends along the perimeter of two or more sides, and preferably all four sides of the interconnect assembly 1750. Each layer 1754, 1756, 1758, 1760 of the housing has holes 1761 and other features that when the molding material flows around or through, create an integrated housing 1752 with non-moldable or over-mold features, such as for example features 1763.

The tips 1712, 1714 of the dual loop contact members 1700 are preferably inserted into the housing 1752 in direction 1764. The base portions 1708 of the dual loop contact members 1700 are preferably press-fit into the housing 1702 and sealed to the housing with a solder mask 1732 (liquid or film) to minimize solder wicking during solder reflow (see FIG. 43B). The solder member 1726 is then preferably pressed into engagement features 1722, 1724 with the tabs 1716, 1718. In the illustrated embodiment, the engagement features 1722, 1724 preferably mechanically retain the solder member 1726 without the need for melting the solder member 1726 onto the contact member 1700.

In one embodiment, the mechanical engagement of the solder member 1726 to the engagement features 1722, 1724 is optionally free floating to provide some planarity relief, provided the solder member 1726 does not fall out. The engagement of the solder member 1726 to the dual loop contact member 1700 may optionally include post insertion processing, such as coining to alter the shape of the solder member 1726 and improve engagement. For example, the tabs 1716, 1718 can be crimped to increase the reliability of retention.

Upon solder reflow, the solder member 1726 will melt and flow around the tabs 1716, 1718 and weld to pads 1770 on printed circuit board 1772, creating the electrical and mechanical connection between the interconnect assembly 1750 and the printed circuit board 1772.

The resulting joint is much stronger than a typical BGA solder joint, which are susceptible to shear loads. The tabs 1716, 1718 also provide a built in standoff to prevent the solder member 1726 from collapsing during reflow due to the weight of the interconnect assembly 1750, as well as provide a entrance and escape route for cleaning solutions should they be used to flush under the interconnect assembly 1750 and the printed circuit board 1772.

Figure 44B:
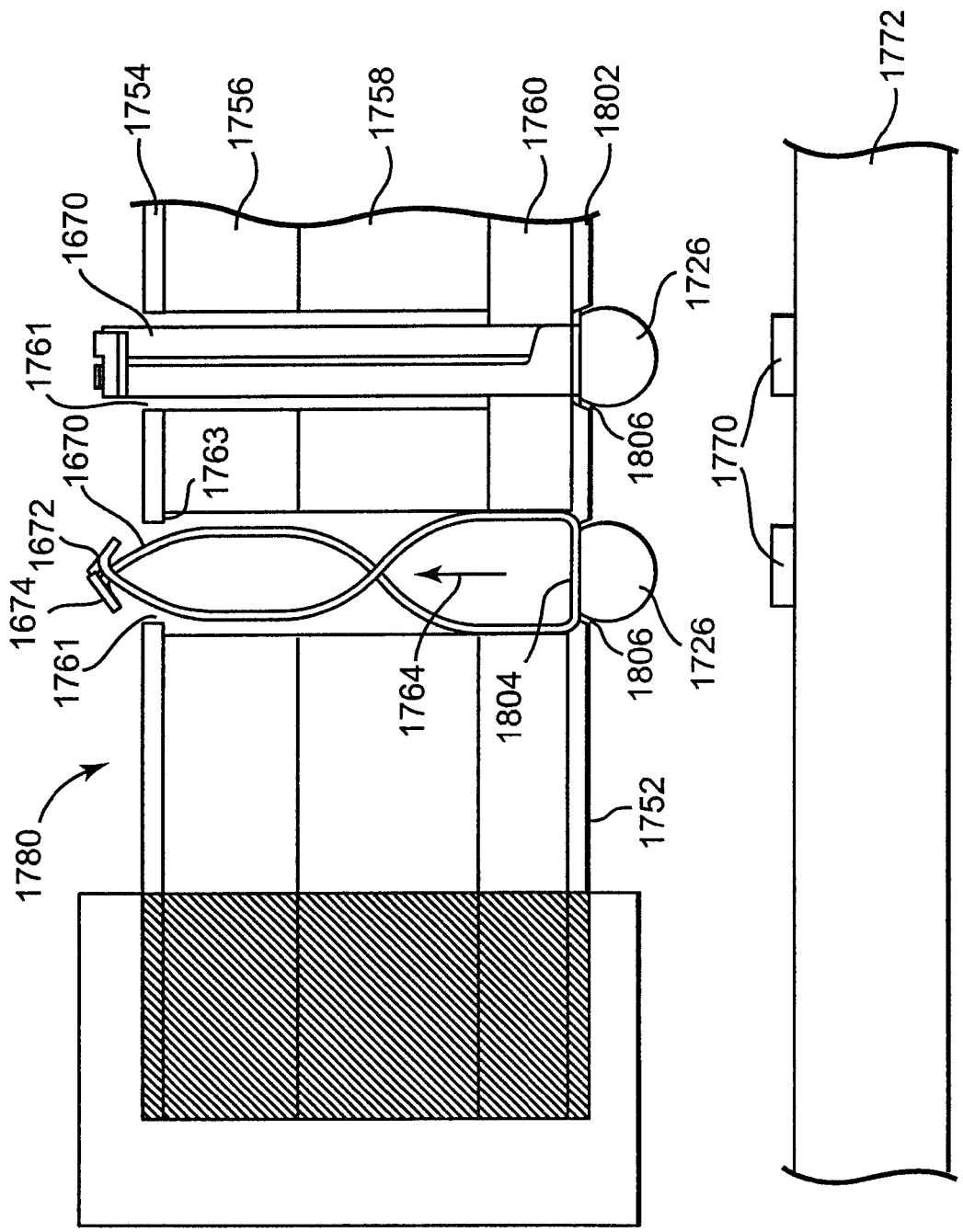
FIG. 44B is a side sectional view of an interconnect assembly using the dual loop connector member of FIG. 41 in accordance with the present invention.

FIG. 44B illustrates an alternate interconnect assembly 1780 incorporating the dual loop contact members 1670 of FIGS. 41A-41C. The housing 1752 includes the layers 1754, 1756, 1758, 1760 (insulators and/or conductors), one or more of which can be circuit members. Each layer 1754, 1756, 1758, 1760 of the housing has holes 1761 and other features that when the molding material flows around or through, create an integrated housing 1752 with non-moldable or over-molded features, such as for example features 1763.

The tips 1672, 1674 of the dual loop contact members 1670 are preferably inserted into the housing 1752 in direction 1764. The base portions 1804 of the contact members 1670 are masked during the overmolding of the layer 1802 so that the base portions 1804 are exposed. The overmolded plastic layer 1802 secures the contact members 1670 to the housing 1752 and optionally forms a recess 1806 in which the solder material 1726 can be located. Any of the contact members disclosed herein can be used with the method and apparatus of FIG. 44B. Upon solder reflow, the solder member 1726 will weld to pads 1770 on printed circuit board 1772, creating the electrical and mechanical connection between the interconnect assembly 1780 and the printed circuit board 1772.

Figure 44C:
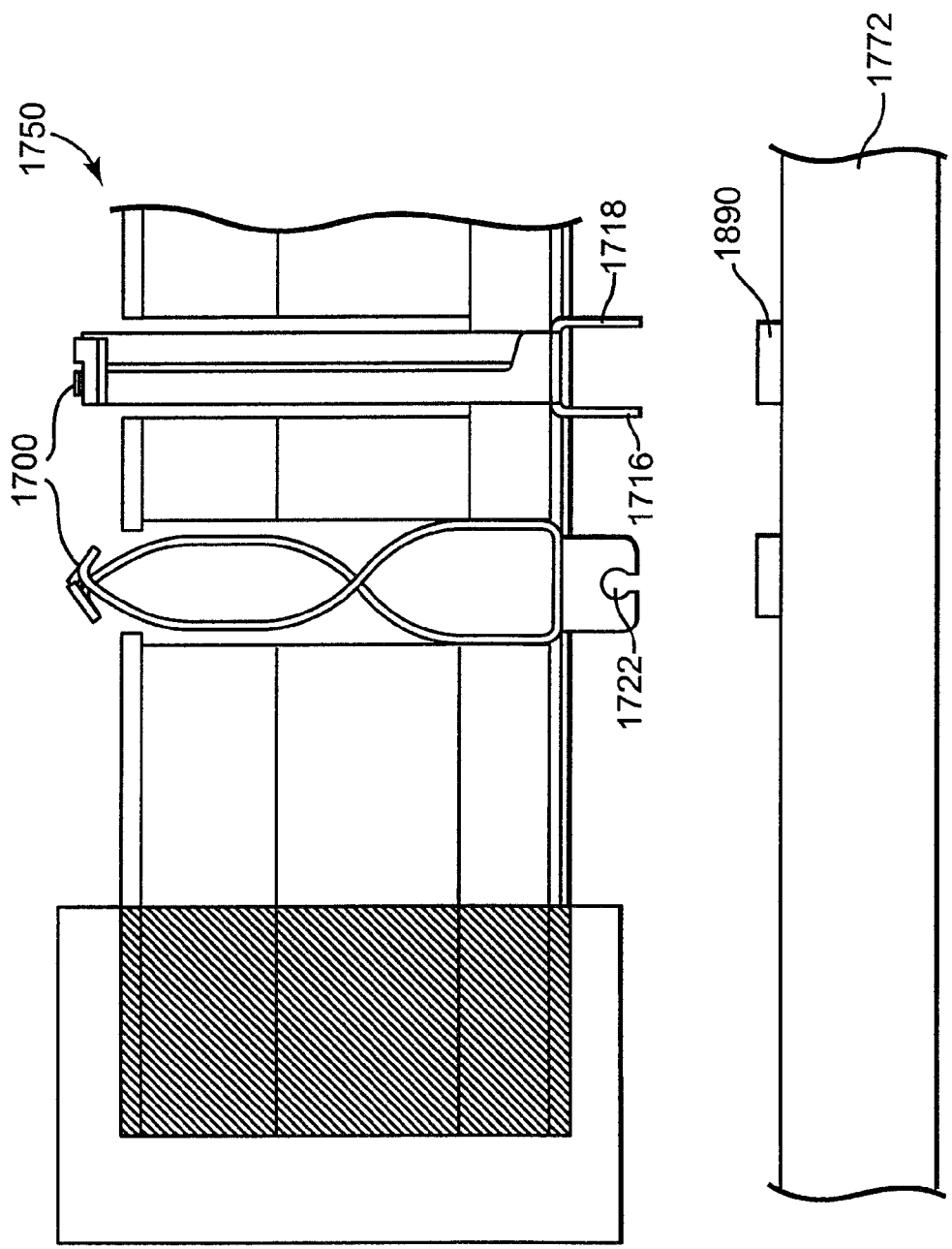
FIG. 44C is a side sectional view of an alternate interconnect assembly using the dual loop connector member of FIG. 42 in accordance with the present invention.
Figure 53A:
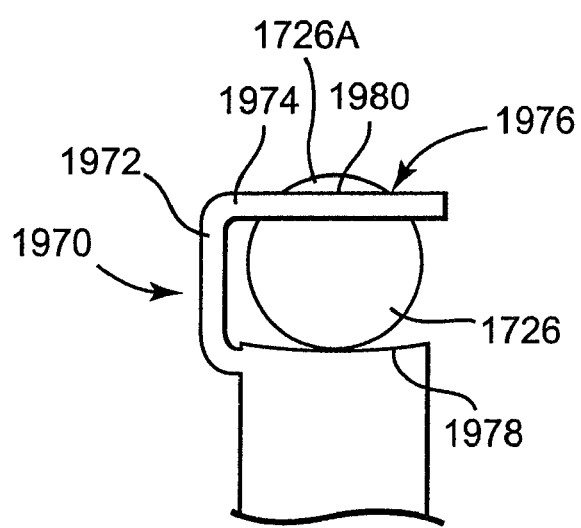
FIG. 53A is a side view of an alternate solder member attachment mechanism with a single tab in accordance with the present invention.
Figure 53B:
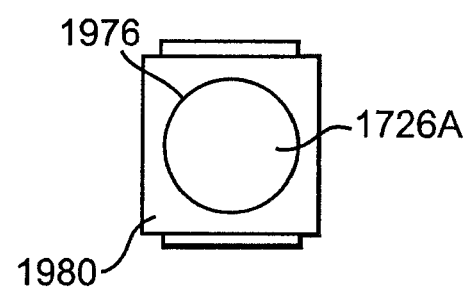
FIG. 53B is an end view of the solder member attachment mechanism of FIG. 53A.

FIG. 44C illustrates an interconnect assembly 1750 of FIG. 44A, without the solder member 1726. Rather, solder paste 1890 is deposited or printed onto the printed circuit board 1772. The tabs 1716, 1718 and/or engagement features 1722 on the contact members 1700 are placed into intimate contact with the solder paste 1890. When the solder paste 1890 melts it collects on the tabs 1716, 1718 and/or engagement features 1722. The tabs 1716, 1718 also define the minimum gap between the interconnect assembly 1750 and the printed circuit board 1772. When the solder paste 1890 solidified it creates the joint between the contact members 1700 and the circuit board 1772. Any of the contact members disclosed herein can be used with the embodiment of FIG. 44C. In particular, the horizontal engagement feature 1974 on the attachment member 1970 of FIGS. 53A and 53B are particularly well suited for use in the embodiment of FIG. 44C.

Figure 45A:
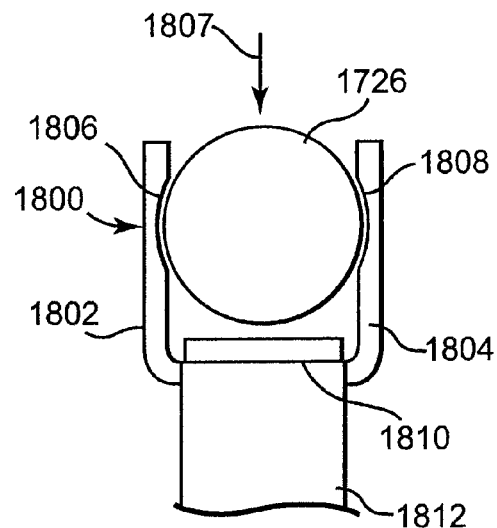
FIG. 45A is a side view of a solder member attachment mechanism in accordance with the present invention.

FIG. 45A illustrates an alternate solder member attachment mechanism 1800 in accordance with the present invention. Tabs 1802, 1804 are each provided with engagement features 1806, 1808 adapted to engage with solder member 1726. In the illustrated embodiment, the tabs 1802, 1804 are oriented on one side of the base portion 1810, while the beams 1812, 1814 (see FIGS. 45B and 45C) are oriented on the opposite side of the base portion 1810.

Figure 45B:
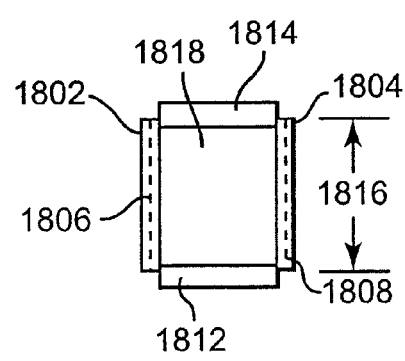
FIG. 45B is an end view of the solder member attachment mechanism of FIG. 45A engaged with a cylindrical solder member.
Figure 45C:
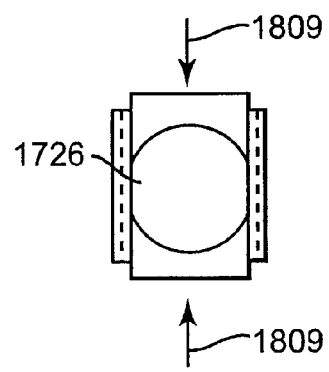
FIG. 45C is an end view of the solder member attachment mechanism of FIG. 45A engaged with a spherical solder member.

In the embodiment of FIG. 45B, the engagement features 1806, 1808 are a longitudinal channel that extend the width 1816 of the tabs 1802, 1804. Solder member 1818 is optionally cylindrically shaped. In the embodiment of FIG. 45C, the solder member 1726 is spherical. Alternatively, the engagement features 1806, 1808 can be hemispherical recesses.

The embodiments of FIGS. 45B and 45C permit the solder members 1726, 1818 to be inserted generally perpendicular to the base portion 1810 along axis 1807 (see FIG. 45A), or generally parallel to the base portion 1810 along axis 1809 (see FIG. 45C).

Figure 46:
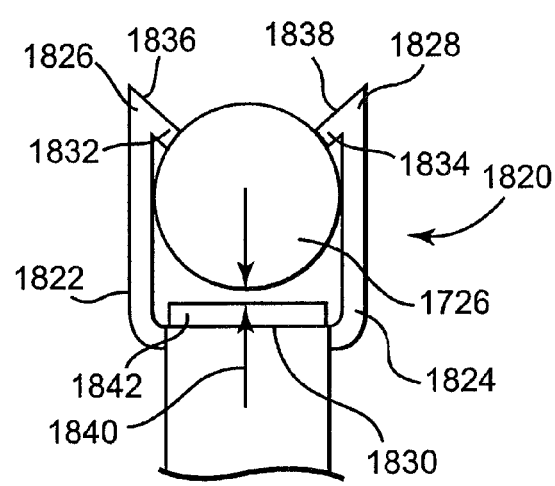
FIG. 46 is a side view of a barbed solder member attachment mechanism in accordance with the present invention.

FIG. 46 illustrates an alternate solder member attachment mechanism 1820 in accordance with the present invention. Tabs 1822, 1824 are each provided with engagement features 1826, 1828 adapted to engage with solder member 1726. In the illustrated embodiment, distal ends 1832, 1834 of the tabs 1822, 1824 are bent towards base portion 1830, forming a barbed structure. Sloping surfaces 1836, 1838 facilitate insertion of the solder member 1726, while the distal ends 1832, 1834 retain the solder member 1726 in the solder member attachment mechanism 1820. Optional gap 1840 between the optional solder mask 1842 and the solder member 1726 permits the solder member 1726 to move within the attachment mechanism 1820, while still being retained therein.

Figure 47A:
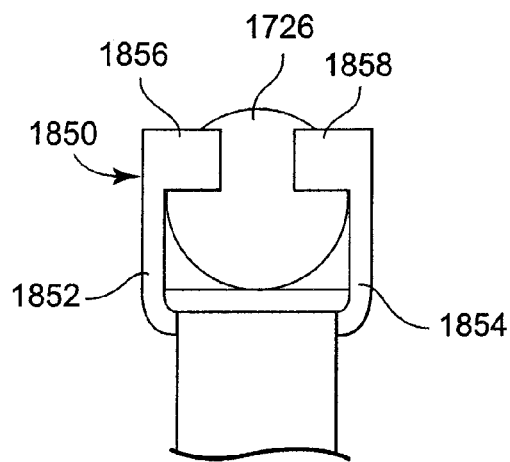
FIG. 47A is a side view of an alternate solder member attachment mechanism in accordance with the present invention.
Figure 47B:
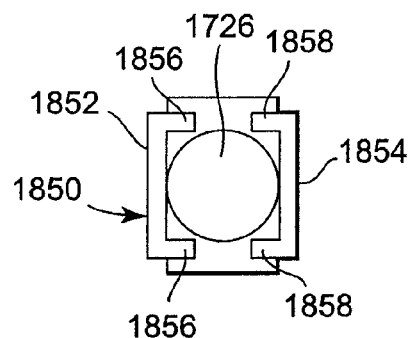
FIG. 47B is an end view of the solder member attachment mechanism of FIG. 47A.

FIGS. 47A and 47B illustrate an alternate solder member attachment mechanism 1850 in accordance with the present invention. Tabs 1852, 1854 are each provided with engagement features 1856, 1858 adapted to engage with solder member 1726.

Figure 47C:
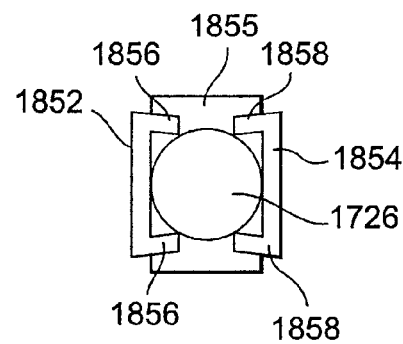
FIG. 47C is end views of the solder member attachment mechanism of FIG. 47A crimped in accordance with the present invention.

As best illustrated in FIG. 47B, engagement features 1856 of tab 1852 are bent toward tab 1854. Engagement feature 1858 of tabs 1854 are bent toward tab 1852. The tabs 1852, 1854 and the engagement features 1856, 1858 extend along a portion of four sides of the solder member 1726. A gap 1855 is preferably maintained between the engagement features 1856, 1858. As best illustrated in FIG. 47C, the engagement features 1856, 1858 and/or the tabs 1852, 1854 are optionally crimped to mechanical engage with the solder member 1726. The gap 1855 facilitates crimping of the tabs 1852, 1854.

Figure 47D:
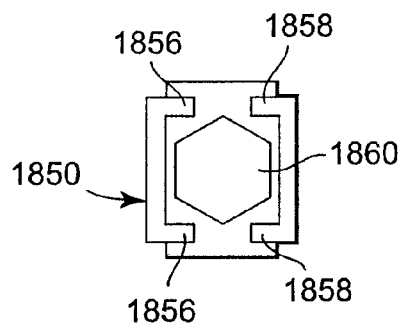
FIG. 47D is an end view of the solder member attachment mechanism of FIG. 47A with a hexagonal solder member.

FIG. 47D illustrates the use of a hexagonal solder member 1860 with the solder member attachment mechanism 1850 of FIG. 47A in accordance with the present invention. A variety of non-spherical shapes can be used for any of the solder members disclosed herein, such as for example pyramidal, toroidal, cubic, etc. The engagement features 1856, 1858 and/or the tabs 1852, 1854 are also optionally crimped as illustrated in FIG. 47C.

Figure 47E:
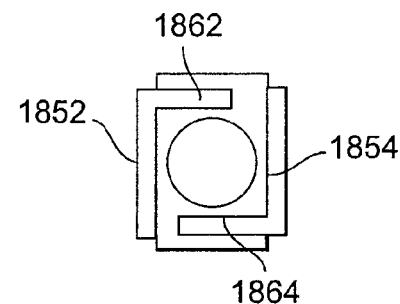
FIG. 47E is an end view of the solder member attachment mechanism of FIG. 47A with alternate engagement features in accordance with the present invention.

FIG. 47E illustrates alternate engagement features 1862, 1864 for the solder member attachment mechanism 1850 of FIG. 47A in accordance with the present invention. Tab 1852 includes a single engagement feature 1862 and tab 1854 includes a single engagement feature 1864.

Figure 48:
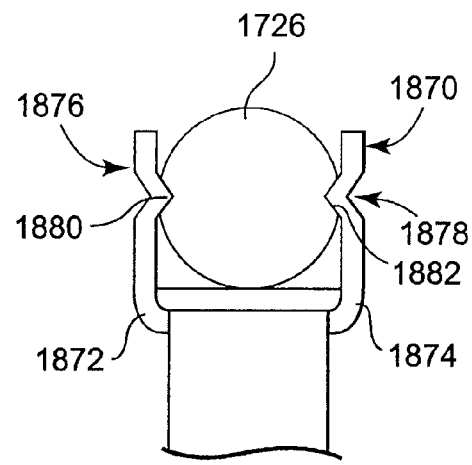
FIG. 48 is a side view of an alternate solder member attachment mechanism in accordance with the present invention.

FIG. 48 illustrates an alternate solder member attachment mechanism 1870 in accordance with the present invention. Tabs 1872, 1874 include one or more engagement features 1876, 1878 in the form of protrusions 1880, 1882 that mechanically engage with solder member 1726. In one embodiment, the protrusions 1880, 1882 plastically deform and penetrate into the mass of the solder member 1726. The tabs 1872, 1874 are optionally crimped to drive the protrusions 1880, 1882 into the mass of the solder member 1726. In another embodiment, friction between the protrusions 1880, 1882 retains the solder member 1726 in place.

FIG. 49 illustrates an alternate solder member attachment mechanism 1900 in accordance with the present invention. The solder member 1902 includes a series of depressions 1904 and protrusions 1906. In the illustrated embodiment, one or more of the protrusions engages with one or more engagement features 1908, 1910 on the tabs 1912, 1914. Any of the engagement features disclosed herein are suitable for use with the solder member 1902.

The depressions 1904 and protrusions 1906 on the solder member 1902 can be regular or irregular, symmetrical or asymmetrical, the same size and shape or different sizes and shapes. In one embodiment, the solder member 1902 is randomly shaped. The solder member 1902 can be formed by coining, molding, or a variety of shaping processes.

FIG. 50 illustrates an alternate solder member attachment mechanism 1920 in accordance with the present invention. Hexagonal solder member 1922 engaged with rectangular shaped engagement features 1924, 1926 on the tabs 1928, 1930. The engagement features 1924, 1926 have a height 1932 greater than required so as to permit the solder member 1922 to be free floating along axis 1934.

Figure 51:
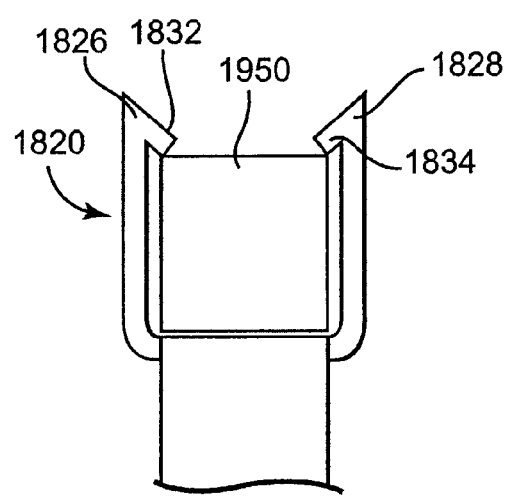
FIG. 51 is a side view of an alternate solder member attachment mechanism of FIG. 46 with a cubic solder member in accordance with the present invention.

FIG. 51 illustrates a solder member attachment mechanism 1820 as illustrated in FIG. 46. Cubic shaped solder member 1950 is retained by distal ends 1832, 1834 of the engagement features 1826, 1828.

Figure 52:
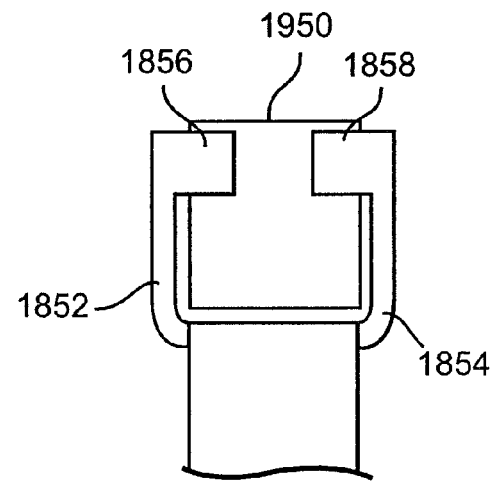
FIG. 52 is a side view of an alternate solder member attachment mechanism of FIG. 47A with a cubic solder member in accordance with the present invention.

FIG. 52 illustrates a solder member attachment mechanism 1850 as illustrated in FIG. 47A. Cubic shaped solder member 1950 is retained by the engagement features 1856, 1858. The tabs 1852, 1854 and/or engagement features 1856, 1858 can optionally be crimped as discussed above.

FIGS. 53A and 53B illustrate an alternate solder member attachment member 1970 comprising a single tab 1972. The tab 1972 includes an engagement feature 1974 with an opening 1976 generally parallel to the base portion 1978. In the illustrated embodiment, the base portion 1978 includes a slight curvature to help center the solder member 1726 in the opening 1976. The solder member 1726 is mechanically retained between the engagement feature 1974 and the base portion 1978.

Portion 1726A of the solder member 1726 protrudes above surface 1980 on the engagement feature 1974. In one embodiment, solder member 1726 is positioned in recess 1982 on base portion 1978. The tab 1972 is then crimped to retain the solder member 1726. In another embodiment, the solder member 1726 is inserted between the engagement feature 1974 and the base portion 1978.

Figures 54A, 54B:
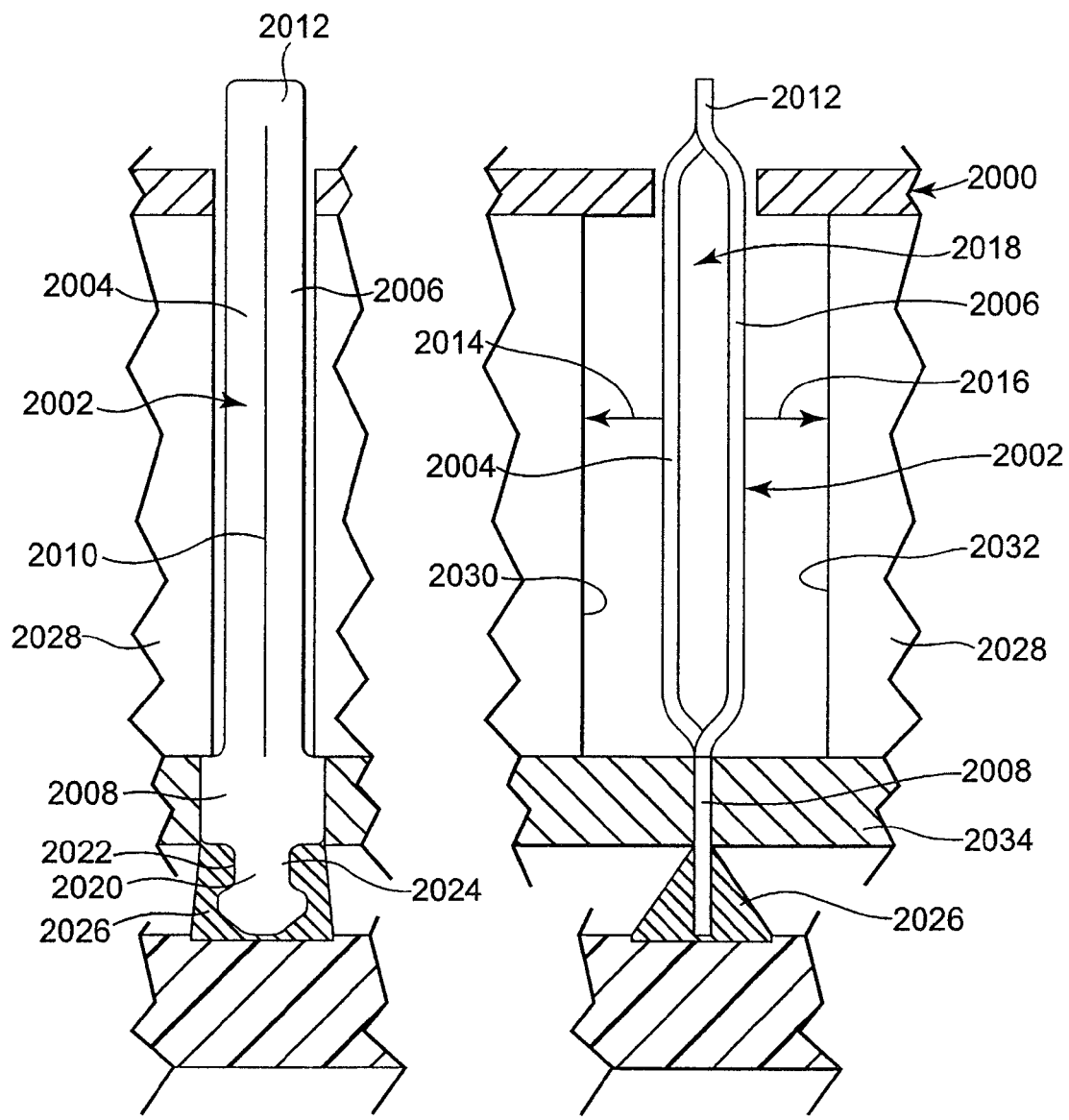
FIGS. 54A and 54B illustrate a connector member with a pair of beams formed from a continuous piece of material in accordance with the present invention.

FIGS. 54A and 54B illustrate an interconnect assembly 2000 incorporating contact members 2002. The contact members 2002 are formed from a continuous piece of material in accordance with the present invention. In the illustrated embodiment, the contact member 2002 is constructed so that beams 2004, 2006 and the base portion 2008 comprise different portions of a continuous sheet material formed. A blank having the required shape is cut from the sheet material and slit 2010 is formed between the beams 2004, 2006. The slit 2010 does not extend through tip 2012 so that the tip 2012 and the beams 2004, 2006 are part of the same continuous sheet material. The beams 2004, 2006 are bent in opposite directions 2014, 2016, forming center opening or loop 2018. In the illustrated embodiment, the directions 2014, 2016 are generally opposite, although for some embodiments directions 2014, 2016 may be formed at an acute angle.

Tab 2020 is optionally mechanically coupled with solder mask 2034. In the illustrated embodiment, tab 2020 includes one or more engagement features 2022, 2024 adapted to mechanically engage a solder member 2026. Alternatively, a solder member attachment mechanism such as illustrated in FIGS. 42-53 may be substituted for the tab 2020.

In one embodiment, housing 2028 of the interconnect assembly 2000 includes a pair of walls 2030, 2032 optionally positioned to limit deflection of the beams 2004, 2006 in the directions 2014, 2016, respectively. The housing 2028 may include any of the additional layers discussed herein.

FIGS. 55A and 55B illustrate an interconnect assembly 2050 incorporating contact members 2052. The contact members 2052 are formed from a continuous piece of material in accordance with the present invention. In the illustrated embodiment, the contact member 2052 is constructed so that beams 2054, 2056 and the base portion 2058 comprise different portions of a continuous sheet material formed. Slit 2060 does not extend through tip 2062. The beams 2054, 2056 are bent to form loops 2064, 2066, 2068. FIG. 55C illustrates the contact member 2052 in a substantially uncompressed state.

Figures 56A, 56B:
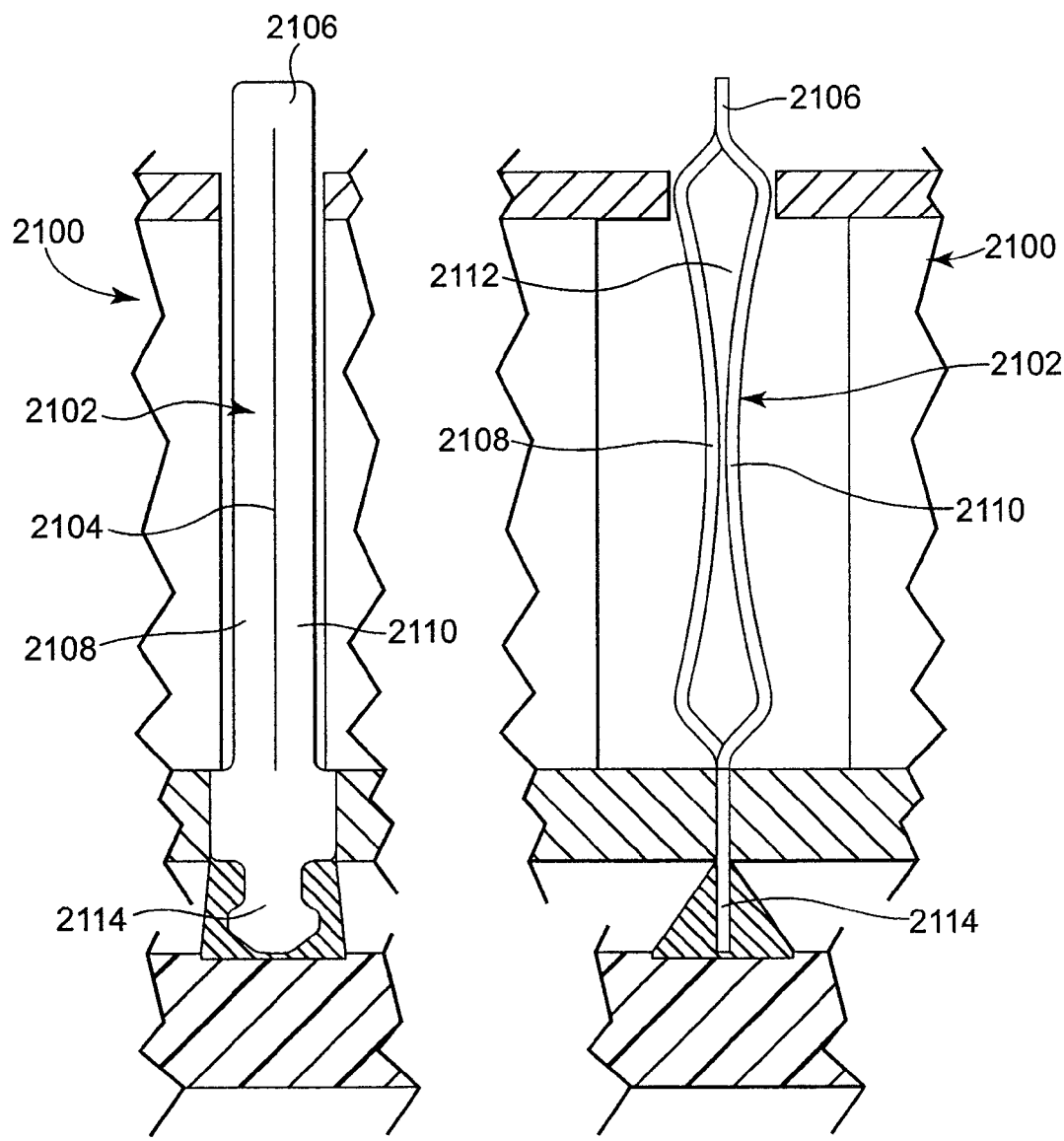
FIGS. 56A and 56B illustrate an alternate connector member with a pair of beams formed from a continuous piece of material in accordance with the present invention.

FIGS. 56A and 56B also illustrate an interconnect assembly 2100 incorporating contact members 2102. The contact members 2102 are formed from a continuous piece of material, as discussed above. The slit 2104 does not extend through tip 2106. The beams 2108, 2110 are bent inward toward loop 2112. A solder member attachment mechanism such as illustrated in FIGS. 42-53 may be substituted for the tab 2114.

Figures 57A, 57B, 57C:
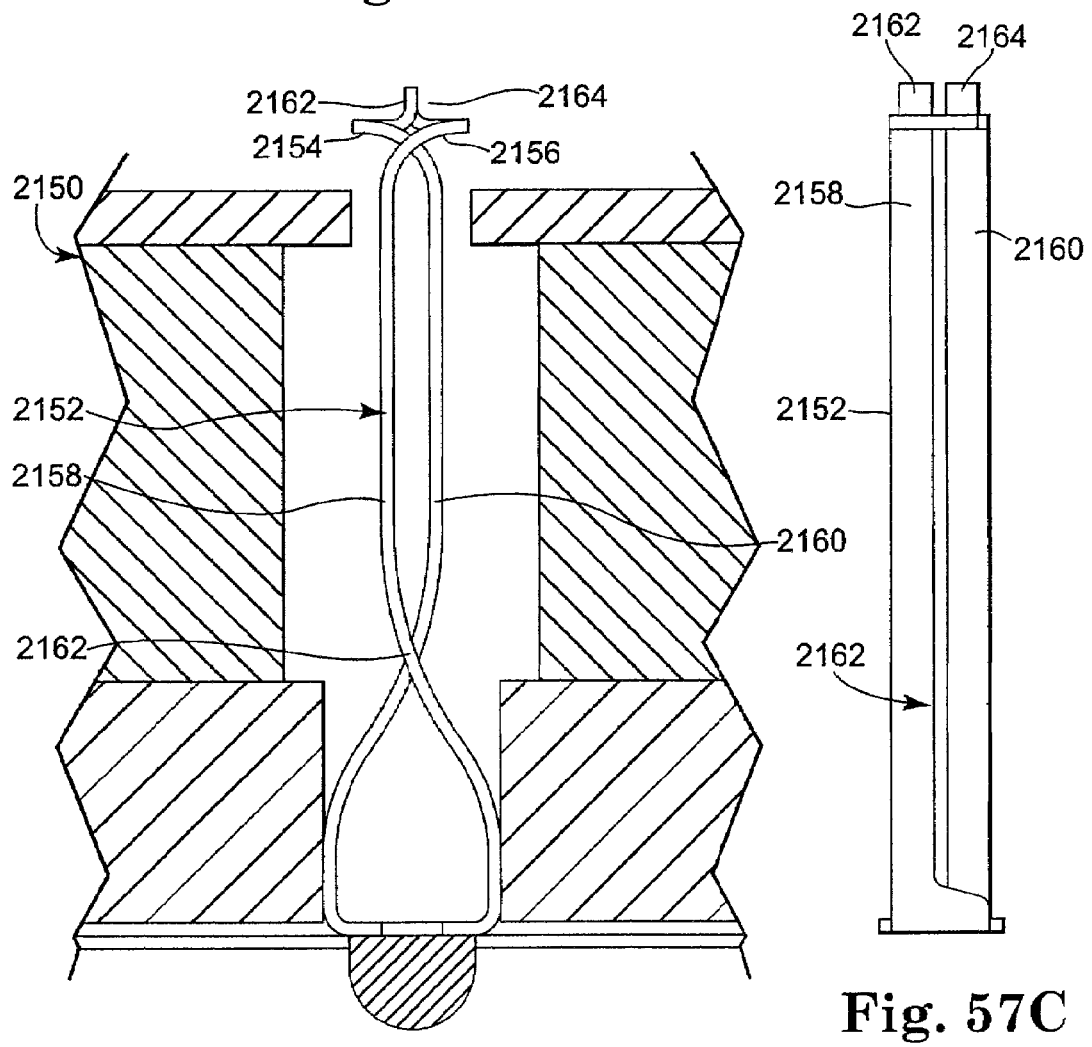
FIG. 57A illustrates an alternate interconnect assembly in accordance with the present invention.
FIGS. 57B and 57C illustrate end and side views of the contact member of FIG. 57A.

FIGS. 57A-57C illustrate an alternate contact member interconnect assembly 2150 incorporating a dual loop contact members 2152 in accordance with the present invention. The beams 2158, 2160 also overlap at the location 2162. In the illustrated embodiment, the beams 2158, 2160 do not contact each other at the location 2162 (See FIG. 57C). Tips 2154, 2156 of the beams 2158, 2160 overlap and mechanically couple to limit separation in directions 2168, 2170. Distal ends 2162, 2164 of the tips 2154, 2156, respectively, extend upward away from the housing 2166. The distal ends 2162, 2164 are particularly well suited for coupling with an LGA device.

The particular embodiments disclosed above are illustrative only, as the invention may be modified and practiced in different but equivalent manners apparent to those skilled in the art having the benefit of the teachings herein. For example, the contact members and housings disclosed herein can be combined in a variety of ways. Also, any of the solder member attachment mechanism disclosed herein can be combined with any of the connector member beam configurations. Furthermore, no limitations are intended to the details of construction or design herein shown, other than as described in the claims below. It is therefore evident that the particular embodiments disclosed above may be altered or modified and all such variations are considered within the scope and spirit of the invention.

What is claimed is:

1. An electrical interconnect assembly for electrically interconnecting terminals on a first circuit member with terminals on a second circuit member, the electrical interconnect assembly comprising:
    a housing comprising a plurality of through openings that extend between a first surface and a second surface of the housing;
    a plurality of contact members positioned in a plurality of the through openings, the contact members comprising;
        a base portion comprising at least one engagement feature adapted to retain a solder member;
        at least first and second beams with proximal ends attached to the base portion and distal ends extending away from the base portion generally in a first direction;
    a layer molded to the housing and the contact members that retain the contact members in the openings; and
    a solder member coupled with the engagement feature.

2. The electrical interconnect assembly of claim 1 wherein the first and second beams overlap at a location between the respective proximal ends and distal ends to form a first loop, the distal ends of the first and second beams comprising a second loop.

3. The electrical interconnect assembly of claim 1 wherein the distal ends of the first and second beams form a loop when engaged with one of the first or second circuit members.

4. The electrical interconnect assembly of claim 1 wherein the first and second beams comprise a generally serpentine shape.

5. The electrical interconnect assembly of claim 1 wherein the distal ends of the first and second beams comprise overlapping tips.

6. The electrical interconnect assembly of claim 5 wherein the pair of overlapping tips prevent the distal ends from separating.

7. The electrical interconnect assembly of claim 5 wherein the pair of overlapping tips permit the beams to be displaced under compression while the distal ends are prevented from separating.

8. The electrical interconnect assembly of claim 1 wherein the layer comprises a sealing layer that substantially prevents solder from wicking between the contact members and the housing, and from the first surface and the second surface.

9. The electrical interconnect assembly of claim 1 wherein the layer is mechanically coupled with the base portions of the contact members.

10. The electrical interconnect assembly of claim 1 wherein the housing comprises side walls that limit deflection of the first and second beams.

11. The electrical interconnect assembly of claim 1 wherein the beams comprise a symmetrical configuration.

12. The electrical interconnect assembly of claim 1 wherein the beams comprise at least one symmetrical loop.

13. The electrical interconnect assembly of claim 1 wherein the engagement feature comprises at least one undercut on the base portion.

14. The electrical interconnect assembly of claim 1 wherein the housing comprises a plurality of layers forming a plurality of substantially non-moldable through openings that extend between a first surface and a second surface.

15. The electrical interconnect assembly of claim 1 wherein at least one contact member comprises an interlocking relationship with a substantially non-moldable through opening on the housing.

16. The electrical interconnect assembly of claim 1 wherein the contact members are coupled to the housing using one or more of a compressive force, solder, a wedge bond, a conductive adhesive, an ultrasonic bond, a wire bond, a mechanical coupling between the contact members and the first circuit member, and an overmolded layer coupling the contact members to the housing.

17. The electrical interconnect assembly of claim 1 wherein the plurality of through openings are arranged in a two-dimensional array.

18. The electrical interconnect assembly of claim 1 wherein the housing comprises a plurality of layers and at least one layer in the housing comprises a circuit layer.

19. The electrical interconnect assembly of claim 1 wherein the layer comprises a curable polymeric material.

20. The electrical interconnect assembly of claim 1 wherein the solder member comprises a snap-fit relationship with the engagement features.

21. The electrical interconnect assembly of claim 1 wherein the solder member is free floating while being mechanically coupled with the base portion.

22. The electrical interconnect assembly of claim 1 wherein the solder member is retained between a tab and the base portion.

23. The electrical interconnection assembly of claim 1 wherein the engagement features comprise one of a hole, a recess, a protrusion, or a barb mechanically coupled to the solder member.

24. The electrical interconnection assembly of claim 1 wherein the solder member comprises a non-spherical structure.

25. The electrical interconnection assembly of claim 1 wherein the engagement features are elastically or plastically deformed into engagement with the solder member.

26. An electrical interconnect assembly for electrically interconnecting terminals on a first circuit member with terminals on a second circuit member, the electrical interconnect assembly comprising:
   a housing comprising a plurality of through openings that extend between a first surface and a second surface of the housing;
   a plurality of contact members positioned in a plurality of the through openings, the contact members comprising;
      a base portion comprising at least one engagement feature adapted to retain a solder member;
      one or more beams having a proximal end attached to the base portion and a distal end extending away from the base portion generally in a first direction;
   a solder member mechanically coupled with the engagement feature, wherein the solder member comprises a snap-fit relationship with the engagement features; and
   a layer molded to the housing and the contact members that retain the contact members in the openings.

27. An electrical interconnect assembly for electrically interconnecting terminals on a first circuit member with terminals on a second circuit member, the electrical interconnect assembly comprising:
   a housing comprising a plurality of through openings that extend between a first surface and a second surface of the housing;
   a plurality of contact members positioned in a plurality of the through openings, the contact members comprising;
      a base portion comprising at least one engagement feature adapted to retain a solder member;
      one or more beams having a proximal end attached to the base portion and a distal end extending away from the base portion generally in a first direction;
   a solder member mechanically coupled with the engagement feature, wherein the solder member is free-floating relative to the contact member; and
   a layer molded to the housing and the contact members that retain the contact members in the openings.

* * * * *